US009025782B2

(12) United States Patent
Visser et al.

(10) Patent No.: US 9,025,782 B2
(45) Date of Patent: May 5, 2015

(54) SYSTEMS, METHODS, APPARATUS, AND COMPUTER-READABLE MEDIA FOR MULTI-MICROPHONE LOCATION-SELECTIVE PROCESSING

(75) Inventors: Erik Visser, San Diego, CA (US); Ian Ernan Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 753 days.

(21) Appl. No.: 13/190,162

(22) Filed: Jul. 25, 2011

(65) Prior Publication Data

US 2012/0020485 A1 Jan. 26, 2012

Related U.S. Application Data

(60) Provisional application No. 61/367,730, filed on Jul. 26, 2010.

(51) Int. Cl.

*H03G 3/20* (2006.01)
*H04R 5/033* (2006.01)
*H04R 3/00* (2006.01)
*G10L 21/0216* (2013.01)
*H04R 25/00* (2006.01)

(52) U.S. Cl.

CPC ...... *H04R 5/033* (2013.01); *G10L 2021/02166* (2013.01); *H04R 3/005* (2013.01); *H04R 25/407* (2013.01); *H04R 2201/107* (2013.01); *H04R 2410/05* (2013.01); *H04R 2430/20* (2013.01); *H04R 2430/21* (2013.01)

(58) Field of Classification Search

USPC ........................................................ 381/23.1
See application file for complete search history.

(56) References Cited

U.S. PATENT DOCUMENTS

| | | | |
|---|---|---|---|
| 5,764,778 | A | 6/1998 | Zurek |
| 7,039,198 | B2 | 5/2006 | Birchfield et al. |
| 2004/0175008 | A1 | 9/2004 | Roeck et al. |
| 2006/0204019 | A1 | 9/2006 | Suzuki et al. |
| 2009/0268931 | A1 | 10/2009 | Andrea et al. |
| 2009/0310444 | A1 | 12/2009 | Hiroe |
| 2010/0008515 | A1 | 1/2010 | Fulton et al. |

FOREIGN PATENT DOCUMENTS

| | | | |
|---|---|---|---|
| EP | 0671721 | A2 | 9/1995 |
| JP | H0823383 | A | 1/1996 |
| JP | H0851686 | A | 2/1996 |
| JP | 2001204092 | A | 7/2001 |
| JP | 2005049876 | A | 2/2005 |
| JP | 2008507926 | A | 3/2008 |
| JP | 2009135594 | A | 6/2009 |
| WO | WO-2006028587 | A2 | 3/2006 |
| WO | WO2007082579 | A2 | 7/2007 |
| WO | WO2007137364 | A1 | 12/2007 |
| WO | WO2010048620 | A1 | 4/2010 |

OTHER PUBLICATIONS

Togami, M. et al., “Stepwise phase difference restoration method for sound source localization using multiple microphone pairs”, Proc. ICASSP 2007, IEEE, Apr. 15-20, 2007, pp. I-117 to I-120.

(Continued)

*Primary Examiner* — Joseph Saunders, Jr.
(74) *Attorney, Agent, or Firm* — Austin Rapp & Hardman

(57) ABSTRACT

A multi-microphone system performs location-selective processing of an acoustic signal, wherein source location is indicated by directions of arrival relative to microphone pairs at opposite sides of a midsagittal plane of a user’s head.

46 Claims, 39 Drawing Sheets

(56) References Cited

OTHER PUBLICATIONS

Goetze et al., "Direction of arrival estimation based on the dual delay line approach for binaural hearing aid microphone arrays", International Symposium on Intelligent Signal Processing and Communication Systems (ISPACS), Nov. 1, 2007, pp. 84-87, IEEE, XP031211473, ISBN: 978-1-4244-1446-8.

International Search Report and Written Opinion—PCT/US2011/045411—ISA/EPO—Mar. 6, 2012.

Merks et al., "Design of a broadside array for a binaural hearing aid", IEEE ASSP Workshop on Applications of Signal Processing to Audio and Acoustics, Oct. 19, 1997, p. 4PP, IEEE, XP010248190, ISBN: 978-0-7803-3908-8.

1500 Hz
Dotted line: three-microphone
Solid line: four-microphone

2300 Hz
Dotted line: three-microphone
Solid line: four-microphone

SYSTEMS, METHODS, APPARATUS, AND COMPUTER-READABLE MEDIA FOR MULTI-MICROPHONE LOCATION-SELECTIVE PROCESSING

CLAIM OF PRIORITY UNDER 35 U.S.C. §119

The present application for patent claims priority to Provisional Application No. 61/367,730, entitled "SYSTEMS, METHODS, APPARATUS, AND COMPUTER-READABLE MEDIA FOR MULTI-MICROPHONE RANGE-SELECTIVE PROCESSING," filed Jul. 26, 2010.

BACKGROUND

1. Field

This disclosure relates to signal processing.

2. Background

Many activities that were previously performed in quiet office or home environments are being performed today in acoustically variable situations like a car, a street, or a café. For example, a person may desire to communicate with another person using a voice communication channel. The channel may be provided, for example, by a mobile wireless handset or headset, a walkie-talkie, a two-way radio, a car-kit, or another communications device. Consequently, a substantial amount of voice communication is taking place using portable audio sensing devices (e.g., smartphones, handsets, and/or headsets) in environments where users are surrounded by other people, with the kind of noise content that is typically encountered where people tend to gather. Such noise tends to distract or annoy a user at the far end of a telephone conversation. Moreover, many standard automated business transactions (e.g., account balance or stock quote checks) employ voice recognition based data inquiry, and the accuracy of these systems may be significantly impeded by interfering noise.

For applications in which communication occurs in noisy environments, it may be desirable to separate a desired speech signal from background noise. Noise may be defined as the combination of all signals interfering with or otherwise degrading the desired signal. Background noise may include numerous noise signals generated within the acoustic environment, such as background conversations of other people, as well as reflections and reverberation generated from the desired signal and/or any of the other signals. Unless the desired speech signal is separated from the background noise, it may be difficult to make reliable and efficient use of it. In one particular example, a speech signal is generated in a noisy environment, and speech processing methods are used to separate the speech signal from the environmental noise.

Noise encountered in a mobile environment may include a variety of different components, such as competing talkers, music, babble, street noise, and/or airport noise. As the signature of such noise is typically nonstationary and close to the user's own frequency signature, the noise may be hard to model using traditional single microphone or fixed beamforming type methods. Single-microphone noise reduction techniques typically require significant parameter tuning to achieve optimal performance. For example, a suitable noise reference may not be directly available in such cases, and it may be necessary to derive a noise reference indirectly. Therefore multiple-microphone based advanced signal processing may be desirable to support the use of mobile devices for voice communications in noisy environments.

SUMMARY

A method of audio signal processing according to a general configuration includes calculating a first indication of a direction of arrival, relative to a first pair of microphones, of a first sound component received by the first pair of microphones and calculating a second indication of a direction of arrival, relative to a second pair of microphones that is separate from the first pair, of a second sound component received by the second pair of microphones. This method also includes controlling a gain of an audio signal to produce an output signal, based on the first and second direction indications. In this method, the microphones of the first pair are located at a first side of a midsagittal plane of a head of a user, and the microphones of the second pair are located at a second side of the midsagittal plane that is opposite to the first side. This method may be implemented such that the first pair is separated from the second pair by at least ten centimeters. Computer-readable storage media (e.g., non-transitory media) having tangible features that cause a machine reading the features to perform such a method are also disclosed.

An apparatus for audio signal processing according to a general configuration includes means for calculating a first indication of a direction of arrival, relative to a second pair of microphones that is separate from the first pair, of a first sound component received by the first pair of microphones and means for calculating a second indication of a direction of arrival, relative to a second pair of microphones, of a second sound component received by the second pair of microphones. This apparatus also includes means for controlling a gain of an audio signal, based on the first and second direction indications. In this apparatus, the microphones of the first pair are located at a first side of a midsagittal plane of a head of a user, and the microphones of the second pair are located at a second side of the midsagittal plane that is opposite to the first side. This apparatus may be implemented such that the first pair is separated from the second pair by at least ten centimeters.

An apparatus for audio signal processing according to a general configuration includes a first pair of microphones configured to be located during a use of the apparatus at a first side of a midsagittal plane of a head of a user, and a second pair of microphones that is separate from the first pair and configured to be located during the use of the apparatus at a second side of the midsagittal plane that is opposite to the first side. This apparatus also includes a first direction indication calculator configured to calculate a first indication of a direction of arrival, relative to the first pair of microphones, of a first sound component received by the first pair of microphones and a second direction indication calculator configured to calculate a second indication of a direction of arrival, relative to the second pair of microphones, of a second sound component received by the second pair of microphones. This apparatus also includes a gain control module configured to control a gain of an audio signal, based on the first and second direction indications. This apparatus may be implemented such that the first pair is configured to be separated from the second pair during the use of the apparatus by at least ten centimeters.

BRIEF DESCRIPTION OF THE DRAWINGS

FIGS. 20A-21C show top views that illustrate principles of operation of the system in a noise reduction mode.

FIGS. 21A-21C show top views that illustrate principles of operation of the system in a noise reduction mode.

DETAILED DESCRIPTION

An acoustic signal sensed by a portable sensing device may contain components that are received from different sources (e.g., a desired sound source, such as a user's mouth, and one or more interfering sources). It may be desirable to separate these components in the received signal in time and/or in frequency. For example, it may be desirable to distinguish the user's voice from diffuse background noise and from other directional sounds.

Figure 1:
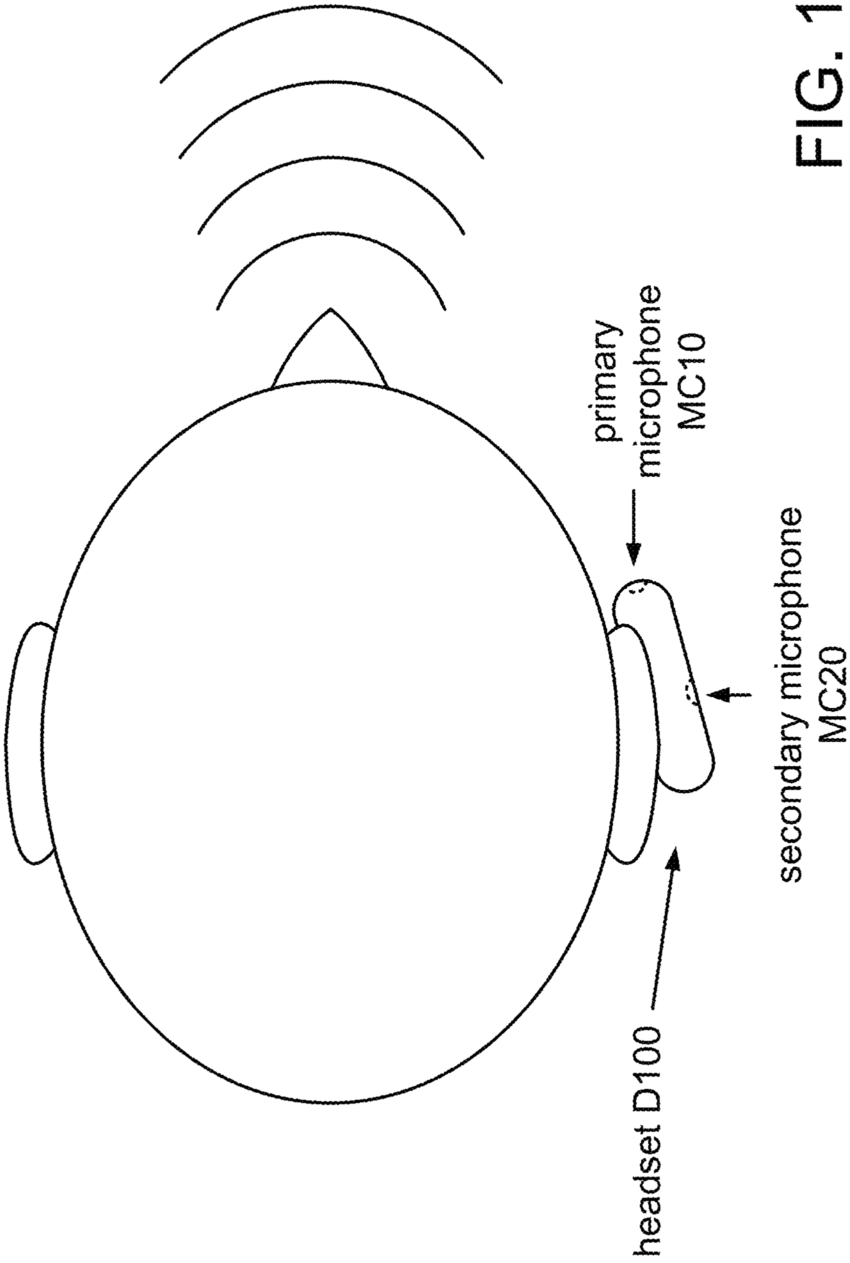
FIGS. 1 and 2 show top views of a typical use case of a headset D100 for voice communications.
Figure 2:
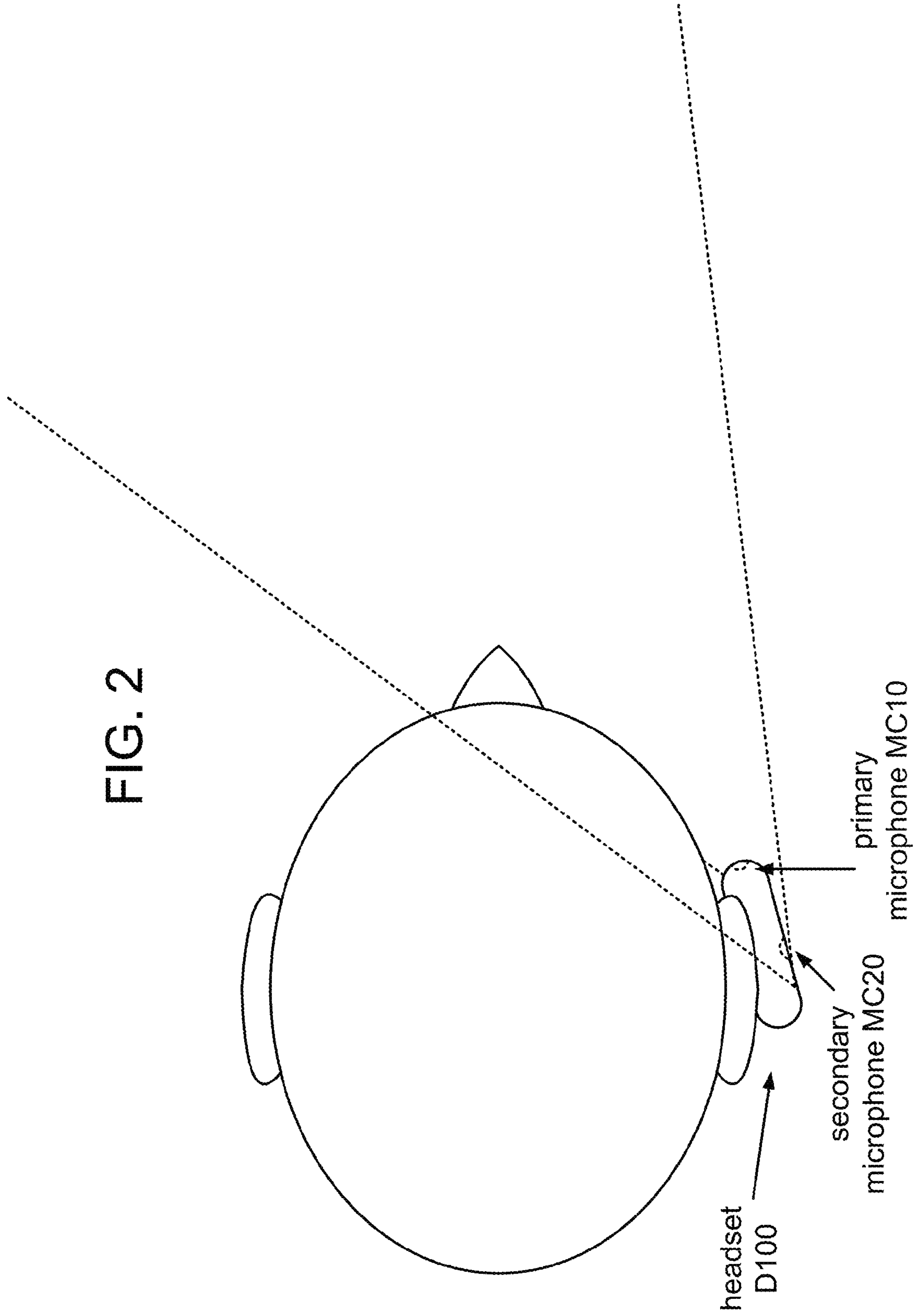

FIGS. 1 and 2 show top views of a typical use case of a headset D100 for voice communications (e.g., a Bluetooth™ headset) that includes a two-microphone array MC10 and MC20 and is worn at the user's ear. In general, such an array may be used to support differentiation between signal components that have different directions of arrival. An indication of direction of arrival may not be enough, however, to distinguish interfering sounds that are received from a source that is far away but in the same direction. Alternatively or additionally, it may be desirable to differentiate signal components according to the distance between the device and the source (e.g., a desired source, such as the user's mouth, or an interfering source, such as another speaker).

Unfortunately, the dimensions of a portable audio sensing device are typically too small to allow microphone spacings that are large enough to support effective acoustic ranging. Moreover, methods of obtaining range information from a microphone array typically depend on measuring gain differences between the microphones, and acquiring reliable gain difference measurements typically requires performing and maintaining calibration of the gain responses of the microphones relative to one another.

A four-microphone headset-based range-selective acoustic imaging system is described. The proposed system includes two broadside-mounted microphone arrays (e.g., pairs) and uses directional information from each array to define a region around the user's mouth that is limited by direction of arrival (DOA) and by range. When phase differences are used to indicate direction of arrival, such a system may be configured to separate signal components according to range without requiring calibration of the microphone gains relative to one another. Examples of applications for such a system include extracting the user's voice from the background noise and/or imaging different spatial regions in front of, behind, and/or to either side of the user.

Unless expressly limited by its context, the term "signal" is used herein to indicate any of its ordinary meanings, including a state of a memory location (or set of memory locations) as expressed on a wire, bus, or other transmission medium. Unless expressly limited by its context, the term "generating" is used herein to indicate any of its ordinary meanings, such as computing or otherwise producing. Unless expressly limited by its context, the term "calculating" is used herein to indicate any of its ordinary meanings, such as computing, evaluating, smoothing, and/or selecting from a plurality of values. Unless expressly limited by its context, the term "obtaining" is used to indicate any of its ordinary meanings, such as calculating, deriving, receiving (e.g., from an external device), and/or retrieving (e.g., from an array of storage elements). Unless expressly limited by its context, the term "selecting" is used to indicate any of its ordinary meanings, such as identifying, indicating, applying, and/or using at least one, and fewer than all, of a set of two or more. Where the term "comprising" is used in the present description and claims, it does not exclude other elements or operations. The term "based on" (as in "A is based on B") is used to indicate any of its ordinary meanings, including the cases (i) "derived from" (e.g., "B is a precursor of A"), (ii) "based on at least" (e.g., "A is based on at least B") and, if appropriate in the particular context, (iii) "equal to" (e.g., "A is equal to B"). Similarly, the term "in response to" is used to indicate any of its ordinary meanings, including "in response to at least."

References to a "location" of a microphone of a multi-microphone audio sensing device indicate the location of the center of an acoustically sensitive face of the microphone, unless otherwise indicated by the context. The term "channel" is used at times to indicate a signal path and at other times to indicate a signal carried by such a path, according to the particular context. Unless otherwise indicated, the term "series" is used to indicate a sequence of two or more items. The term "logarithm" is used to indicate the base-ten logarithm, although extensions of such an operation to other bases are within the scope of this disclosure. The term "frequency component" is used to indicate one among a set of frequencies or frequency bands of a signal, such as a sample of a frequency domain representation of the signal (e.g., as produced by a fast Fourier transform) or a subband of the signal (e.g., a Bark scale or mel scale subband).

Unless indicated otherwise, any disclosure of an operation of an apparatus having a particular feature is also expressly intended to disclose a method having an analogous feature (and vice versa), and any disclosure of an operation of an apparatus according to a particular configuration is also expressly intended to disclose a method according to an analogous configuration (and vice versa). The term "configuration" may be used in reference to a method, apparatus, and/or system as indicated by its particular context. The terms "method," "process," "procedure," and "technique" are used generically and interchangeably unless otherwise indicated by the particular context. The terms "apparatus" and "device" are also used generically and interchangeably unless otherwise indicated by the particular context. The terms "element" and "module" are typically used to indicate a portion of a greater configuration. Unless expressly limited by its context, the term "system" is used herein to indicate any of its ordinary meanings, including "a group of elements that interact to serve a common purpose." Any incorporation by reference of a portion of a document shall also be understood to incorporate definitions of terms or variables that are referenced within the portion, where such definitions appear elsewhere in the document, as well as any figures referenced in the incorporated portion.

The terms "coder," "codec," and "coding system" are used interchangeably to denote a system that includes at least one encoder configured to receive and encode frames of an audio signal (possibly after one or more pre-processing operations, such as a perceptual weighting and/or other filtering operation) and a corresponding decoder configured to produce decoded representations of the frames. Such an encoder and decoder are typically deployed at opposite terminals of a communications link. In order to support a full-duplex communication, instances of both of the encoder and the decoder are typically deployed at each end of such a link.

In this description, the term "sensed audio signal" denotes a signal that is received via one or more microphones, and the term "reproduced audio signal" denotes a signal that is reproduced from information that is retrieved from storage and/or received via a wired or wireless connection to another device. An audio reproduction device, such as a communications or playback device, may be configured to output the reproduced audio signal to one or more loudspeakers of the device. Alternatively, such a device may be configured to output the reproduced audio signal to an earpiece, other headset, or external loudspeaker that is coupled to the device via a wire or wirelessly. With reference to transceiver applications for voice communications, such as telephony, the sensed audio signal is the near-end signal to be transmitted by the transceiver, and the reproduced audio signal is the far-end signal received by the transceiver (e.g., via a wireless communications link). With reference to mobile audio reproduction applications, such as playback of recorded music, video, or speech (e.g., MP3-encoded music files, movies, video clips, audiobooks, podcasts) or streaming of such content, the reproduced audio signal is the audio signal being played back or streamed.

Figure 3A:
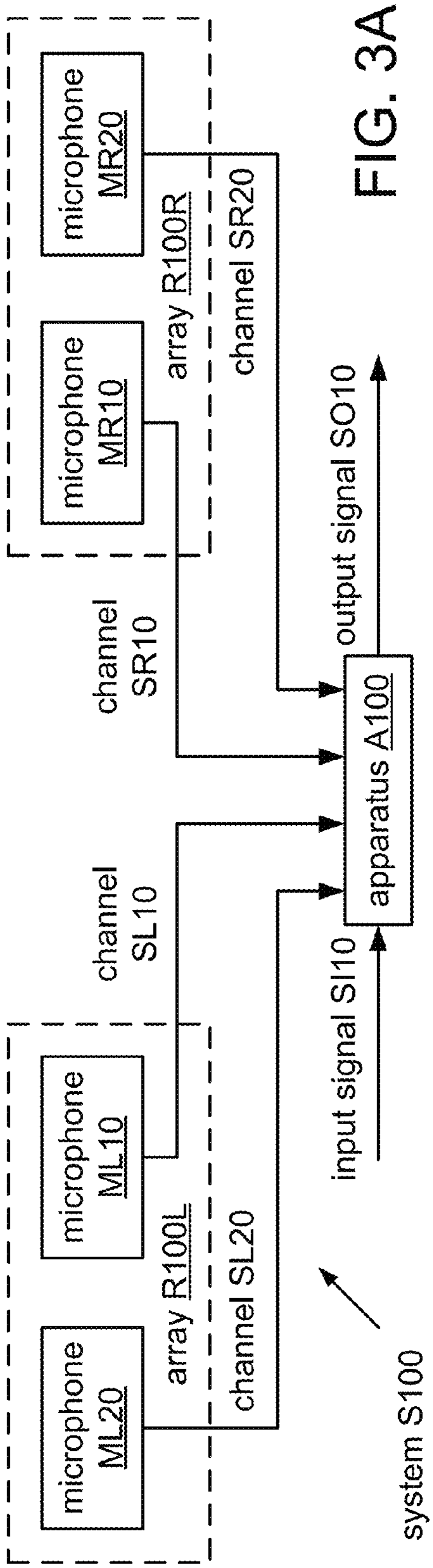
FIG. 3A shows a block diagram of a system S100 according to a general configuration.

FIG. 3A shows a block diagram of a system S100 according to a general configuration that includes a left instance R100L and a right instance R100R of a microphone array. System S100 also includes an apparatus A100 that is configured to process an input audio signal SI10, based on information from a multichannel signal SL10, SL20 produced by left microphone array R100L and information from a multichannel signal SR10, SR20 produced by right microphone array R100R, to produce an output audio signal SO10.

System S100 may be implemented such that apparatus A100 is coupled to each of microphones ML10, ML20, MR10, and MR20 via wires or other conductive paths. Alternatively, system S100 may be implemented such that apparatus A100 is coupled conductively to one of the microphone pairs (e.g., located within the same earcup as this microphone pair) and wirelessly to the other microphone pair. Alternatively, system S100 may be implemented such that apparatus A100 is wirelessly coupled to microphones ML10, ML20, MR10, and MR20 (e.g., such that apparatus A100 is implemented within a portable audio sensing device, such as a handset, smartphone, or laptop or tablet computer).

Each of the microphones ML10, ML20, MR10, and MR20 may have a response that is omnidirectional, bidirectional, or unidirectional (e.g., cardioid). The various types of microphones that may be used for each of the microphones ML10, ML20, MR10, and MR20 include (without limitation) piezoelectric microphones, dynamic microphones, and electret microphones.

Figure 3B:
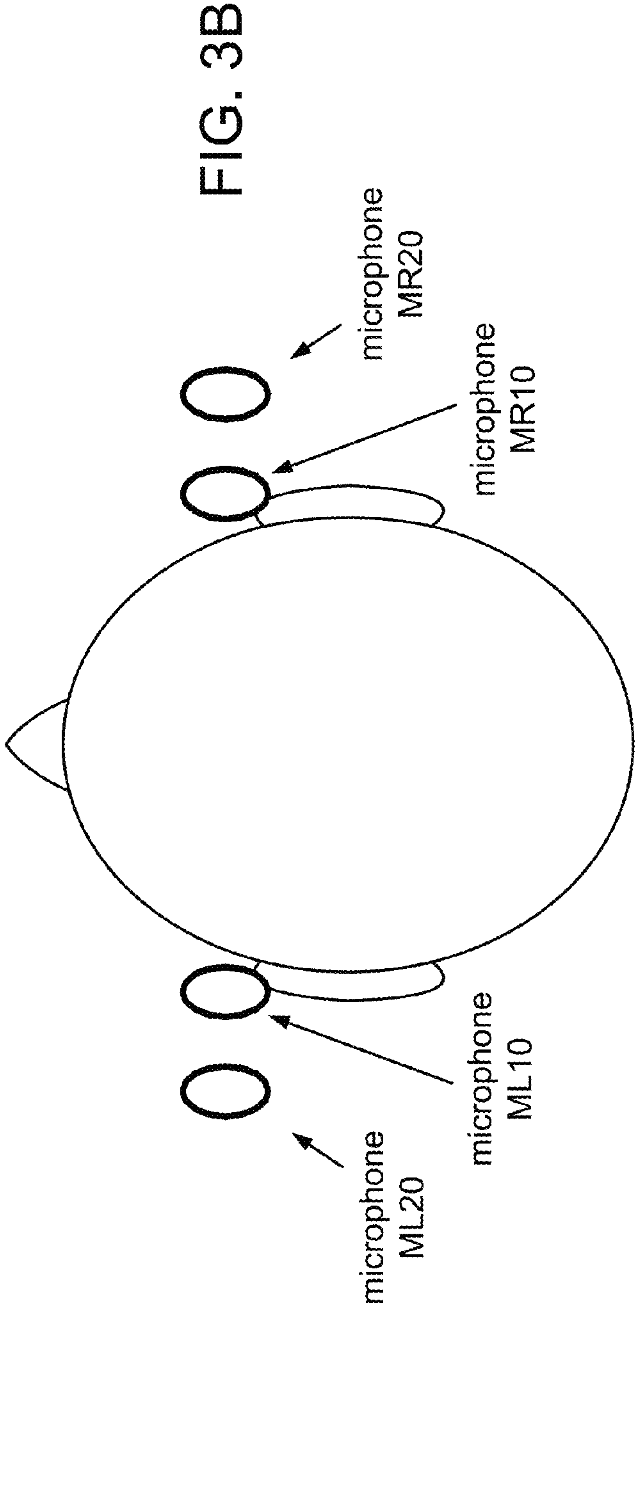
FIG. 3B shows an example of relative placements of microphones ML10, ML20, MR10, and MR20 during use of system S100.

FIG. 3B shows an example of the relative placements of the microphones during a use of system S100. In this example, microphones ML10 and ML20 of the left microphone array are located on the left side of the user's head, and microphones MR10 and MR20 of the right microphone array are located on the right side of the user's head. It may be desirable to orient the microphone arrays such that their axes are broadside to a frontal direction of the user, as shown in FIG. 3B. Although each microphone array is typically worn at a respective ear of the user, it is also possible for one or more microphones of each array to be worn in a different location, such as at a shoulder of the user. For example, each microphone array may be configured to be worn on a respective shoulder of the user.

It may be desirable for the spacing between the microphones of each microphone array (e.g., between ML10 and ML20, and between MR10 and MR20) to be in the range of from about two to about four centimeters (or even up to five or six centimeters). It may be desirable for the separation between the left and right microphone arrays during a use of the device to be greater than or equal to eight, nine, ten, eleven, 12, 13, 14, 15, 16, 17, 18, 19, 20, 21, or 22 centimeters. For example, it may be desirable for the distance between the inner microphones of each array (i.e., between microphones ML10 and MR10) during a use of the device to be at least equal to the interaural distance (i.e., the distance along a straight line in space between the openings of the user's ear canals). Such microphone placements may provide a satisfactory level of noise reduction performance across a desired range of directions of arrival.

Figure 4A:
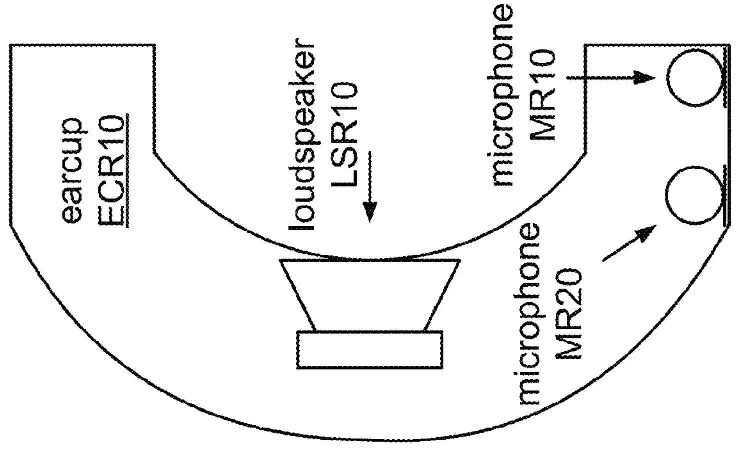
FIG. 4A shows a horizontal cross-section of an earcup ECR10.

System S100 may be implemented to include a pair of headphones, such as a pair of earcups that are joined by a band to be worn over the user's head. FIG. 4A shows a horizontal cross-section of a right-side instance ECR10 of an earcup that includes microphones MR10 and MR20 and a loudspeaker LSR10 that is arranged to produce an acoustic signal to the user's ear (e.g., from a signal received wirelessly or via a cord to a media playback or streaming device). It may be desirable to insulate the microphones from receiving mechanical vibrations from the loudspeaker through the structure of the earcup. Earcup ECR10 may be configured to be supra-aural (i.e., to rest over the user's ear during use without enclosing it) or circumaural (i.e., to enclose the user's ear during use). In other implementations of earcup ECR10, outer microphone MR20 may be mounted on a boom or other protrusion that extends from the earcup away from the user's head.

Figure 4B:
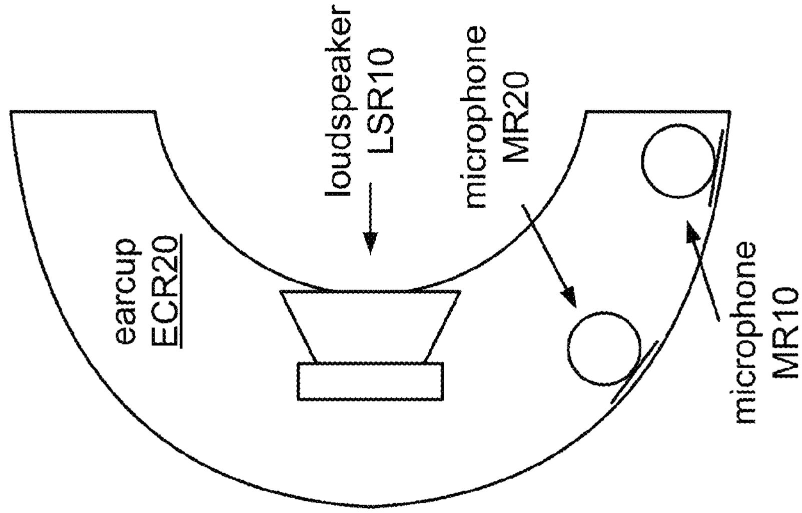
FIG. 4B shows a horizontal cross-section of an earcup ECR20.
Figure 5B:
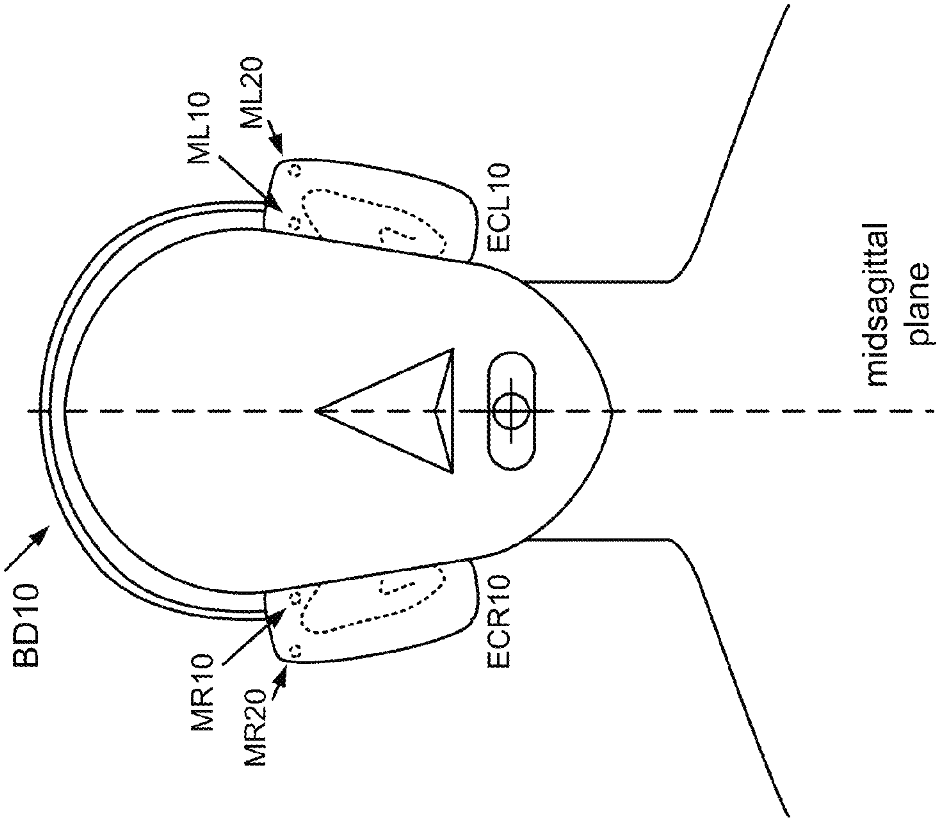
FIGS. 5A and 5B show top and front views, respectively, of a typical use case of an implementation of system S100 as a pair of headphones.
Figure 5A:
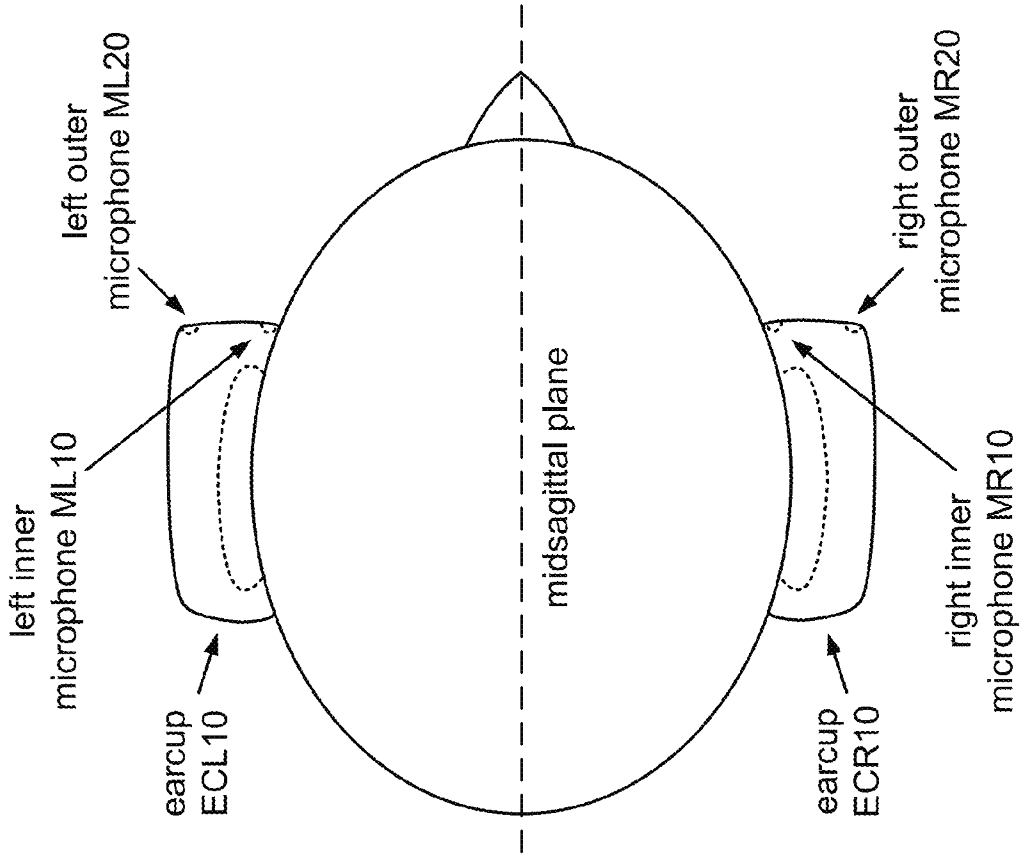

System S100 may be implemented to include an instance of such an earcup for each of the user's ears. For example, FIGS. 5A and 5B show top and front views, respectively, of a typical use case of an implementation of system S100 as a pair of headphones that also includes a left instance ECL10 of earcup ECR10 and a band BD10. FIG. 4B shows a horizontal cross-section of an earcup ECR20 in which microphones MR10 and MR20 are disposed along a curved portion of the earcup housing. In this particular example, the microphones are oriented in slightly different directions away from the midsagittal plane of the user's head (as shown in FIGS. 5A and 5B). Earcup ECR20 may also be implemented such that one (e.g., MR10) or both microphones are oriented during use in a direction parallel to the midsagittal plane of the user's head (e.g., as in FIG. 4A), or such that both microphones are oriented during use at the same slight angle (e.g., not greater than forty-five degrees) toward or away from this plane. (It will be understood that left-side instances of the various right-side earcups described herein are configured analogously.)

Figure 4C:
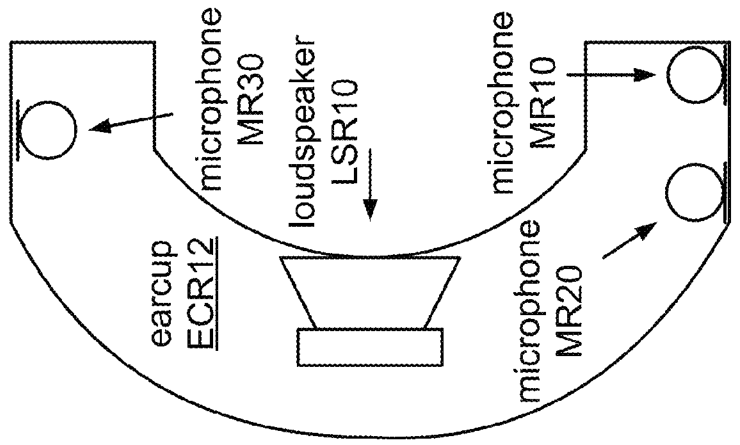
FIG. 4C shows a horizontal cross-section of an implementation ECR12 of earcup ECR10.

FIG. 4C shows a horizontal cross-section of an implementation ECR12 of earcup ECR10 that includes a third microphone MR30 directed to receive environmental sound. It is also possible for one or both of arrays R100L and R100R to include more than two microphones.

Figure 6B:
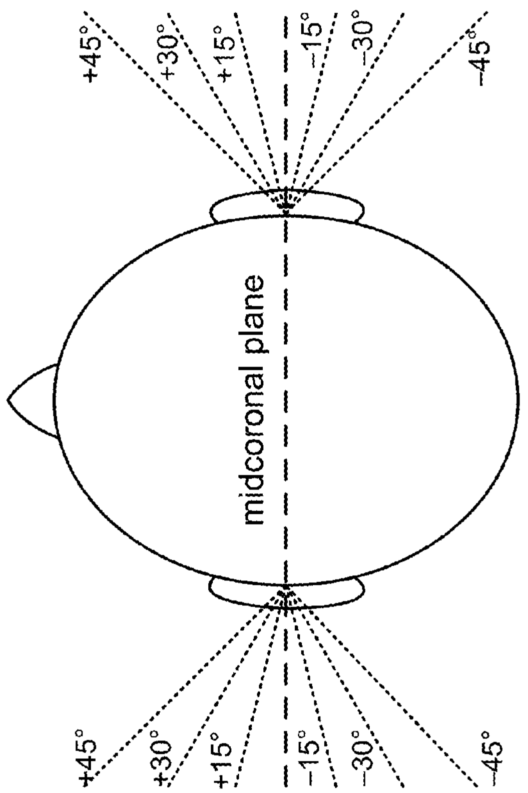
FIG. 6B shows examples of various angular ranges, relative to a line that is orthogonal to the midsagittal plane of a user's head, in a transverse plane that is orthogonal to the midsagittal and coronal planes.
Figure 6A:
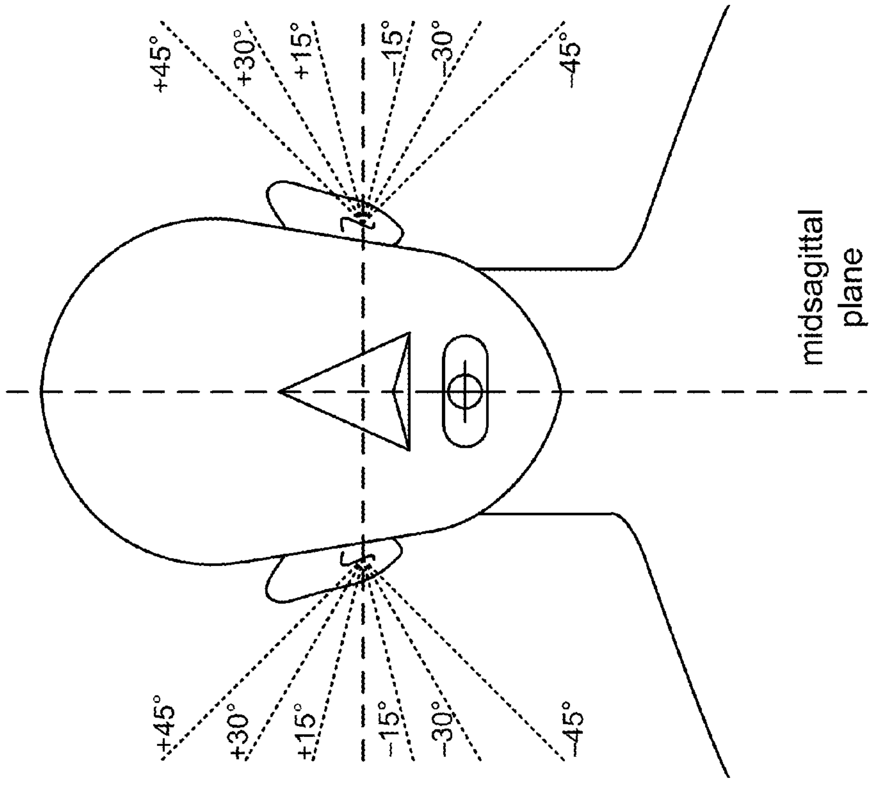
FIG. 6A shows examples of various angular ranges, relative to a line that is orthogonal to the midsagittal plane of a user's head, in a coronal plane of the user's head.

It may be desirable for the axis of the microphone pair ML10, ML20 (i.e., the line that passes through the centers of the sensitive surfaces of each microphone of the pair) to be generally orthogonal to the midsagittal plane of the user's head during use of the system. Similarly, it may be desirable for the axis of the microphone pair MR10, MR20 to be generally orthogonal to the midsagittal plane of the user's head during use of the system. It may be desirable to configure system S100, for example, such that each of the axis of microphone pair ML10, ML20 and the axis of microphone pair MR10, MR20 is not more than fifteen, twenty, twenty-five, thirty, or forty-five degrees from orthogonal to the midsagittal plane of the user's head during use of the system. FIG. 6A shows examples of various such ranges in a coronal plane of the user's head, and FIG. 6B shows examples of the same ranges in a transverse plane that is orthogonal to the midsagittal and coronal planes.

It is noted that the plus and minus bounds of such a range of allowable angles need not be the same. For example, system S100 may be implemented such that each of the axis of microphone pair ML10, ML20 and the axis of microphone pair MR10, MR20 is not more than plus fifteen degrees and not more than minus thirty degrees, in a coronal plane of the user's head, from orthogonal to the midsagittal plane of the user's head during use of the system. Alternatively or additionally, system S100 may be implemented such that each of the axis of microphone pair ML10, ML20 and the axis of microphone pair MR10, MR20 is not more than plus thirty degrees and not more than minus fifteen degrees, in a transverse plane of the user's head, from orthogonal to the midsagittal plane of the user's head during use of the system.

Figure 7A:
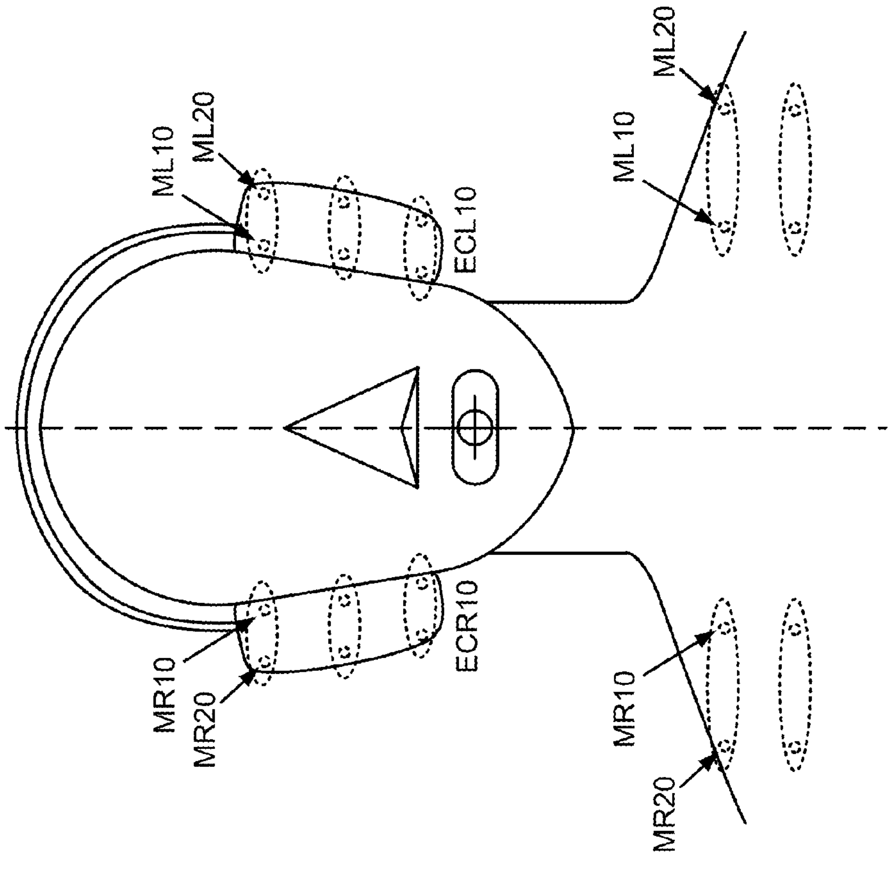
FIG. 7A shows examples of placements for microphone pairs ML10, ML20 and MR10, MR20.
Figure 7B:
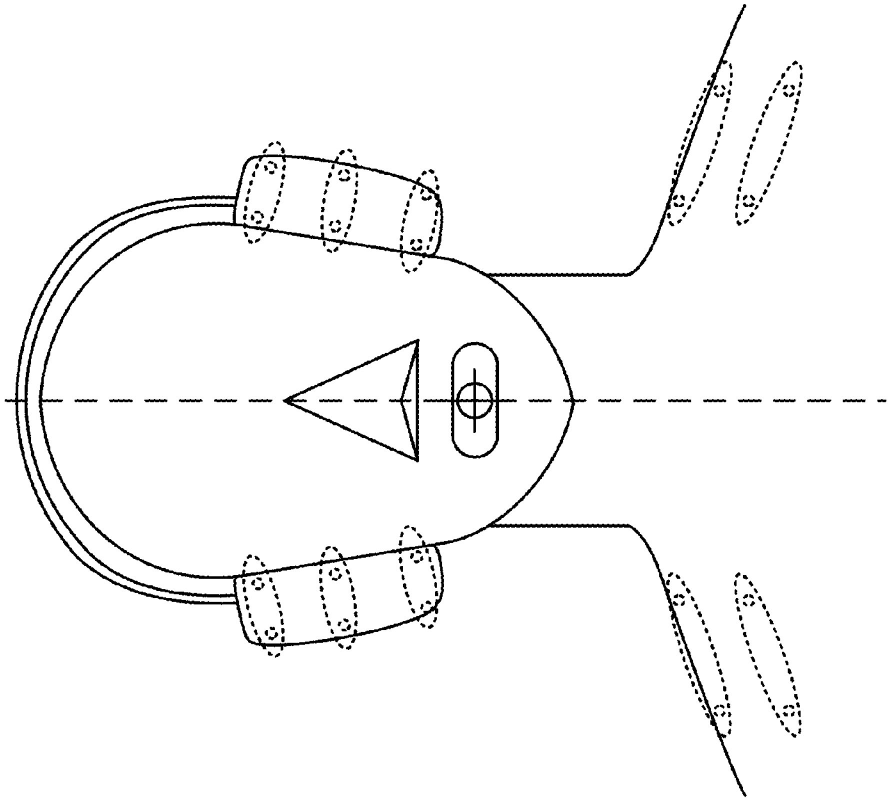
FIG. 7B shows examples of placements for microphone pairs ML10, ML20 and MR10, MR20.

FIG. 7A shows three examples of placements for microphone pair MR10, MR20 on earcup ECR10 (where each placement is indicated by a dotted ellipse) and corresponding examples of placements for microphone pair ML10, ML20 on earcup ECL10. Each of these microphone pairs may also be worn, according to any of the spacing and orthogonality constraints noted above, on another part of the user's body during use. FIG. 7A shows two examples of such alternative placements for microphone pair MR10, MR20 (i.e., at the user's shoulder and on the upper part of the user's chest) and corresponding examples of placements for microphone pair ML10, ML20. In such cases, each microphone pair may be affixed to a garment of the user (e.g., using Velcro® or a similar removable fastener). FIG. 7B shows examples of the placements shown in FIG. 7A in which the axis of each pair has a slight negative tilt, in a coronal plane of the user's head, from orthogonal to the midsagittal plane of the user's head.

Other implementations of system S100 in which microphones ML10, ML20, MR10, and MR20 may be mounted according to any of the spacing and orthogonality constraints noted above include a circular arrangement, such as on a helmet. For example, inner microphones ML10, MR10 may be mounted on a visor of such a helmet.

During the operation of a multi-microphone audio sensing device as described herein, each instance of microphone array R100 produces a multichannel signal in which each channel is based on the response of a corresponding one of the microphones to the acoustic environment. One microphone may receive a particular sound more directly than another microphone, such that the corresponding channels differ from one another to provide collectively a more complete representation of the acoustic environment than can be captured using a single microphone.

Figure 8A:
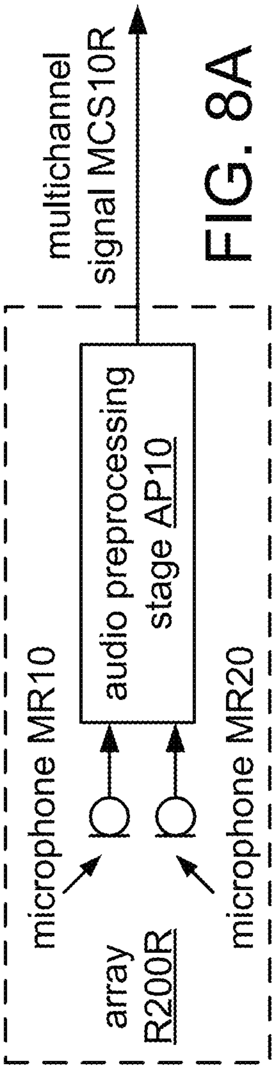
FIG. 8A shows a block diagram of an implementation R200R of array R100R.

It may be desirable for the array to perform one or more processing operations on the signals produced by the microphones to produce the corresponding multichannel signal. For example, FIG. 8A shows a block diagram of an implementation R200R of array R100R that includes an audio preprocessing stage AP10 configured to perform one or more such operations, which may include (without limitation) impedance matching, analog-to-digital conversion, gain control, and/or filtering in the analog and/or digital domains to produce a multichannel signal in which each channel is based on a response of the corresponding microphone to an acoustic signal. Array R100L may be similarly implemented.

Figure 8B:
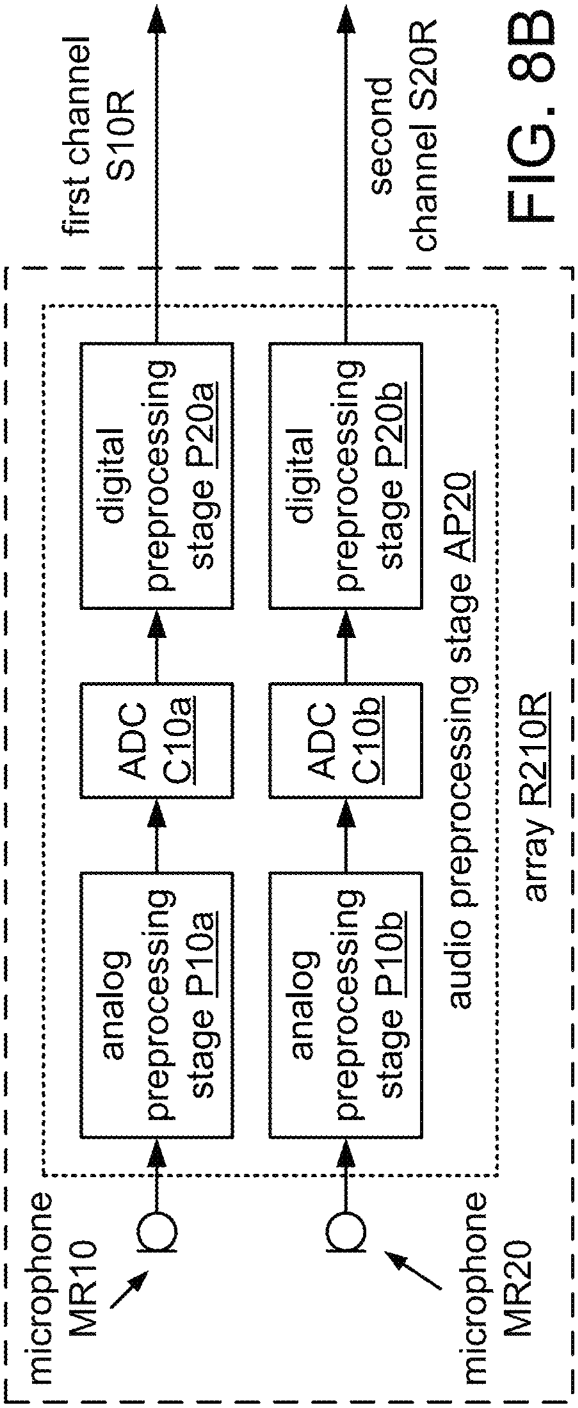
FIG. 8B shows a block diagram of an implementation R210R of array R200R.

FIG. 8B shows a block diagram of an implementation R210R of array R200R. Array R210R includes an implementation AP20 of audio preprocessing stage AP10 that includes analog preprocessing stages P10*a* and P10*b*. In one example, stages P10*a* and P10*b* are each configured to perform a highpass filtering operation (e.g., with a cutoff frequency of 50, 100, or 200 Hz) on the corresponding microphone signal. Array R100L may be similarly implemented.

It may be desirable for each of arrays R100L and R100R to produce the corresponding multichannel signal as a digital signal, that is to say, as a sequence of samples. Array R210R, for example, includes analog-to-digital converters (ADCs) C10*a* and C10*b* that are each arranged to sample the corresponding analog channel. Typical sampling rates for acoustic applications include 8 kHz, 12 kHz, 16 kHz, and other frequencies in the range of from about 8 to about 16 kHz, although sampling rates as high as about 44.1, 48, or 192 kHz may also be used. In this particular example, array R210R also includes digital preprocessing stages P20*a* and P20*b* that are each configured to perform one or more preprocessing operations (e.g., echo cancellation, noise reduction, and/or spectral shaping) on the corresponding digitized channel to produce corresponding channels SR10, SR20 of multichannel signal MCS10R. Array R100L may be similarly implemented.

Figure 9A:
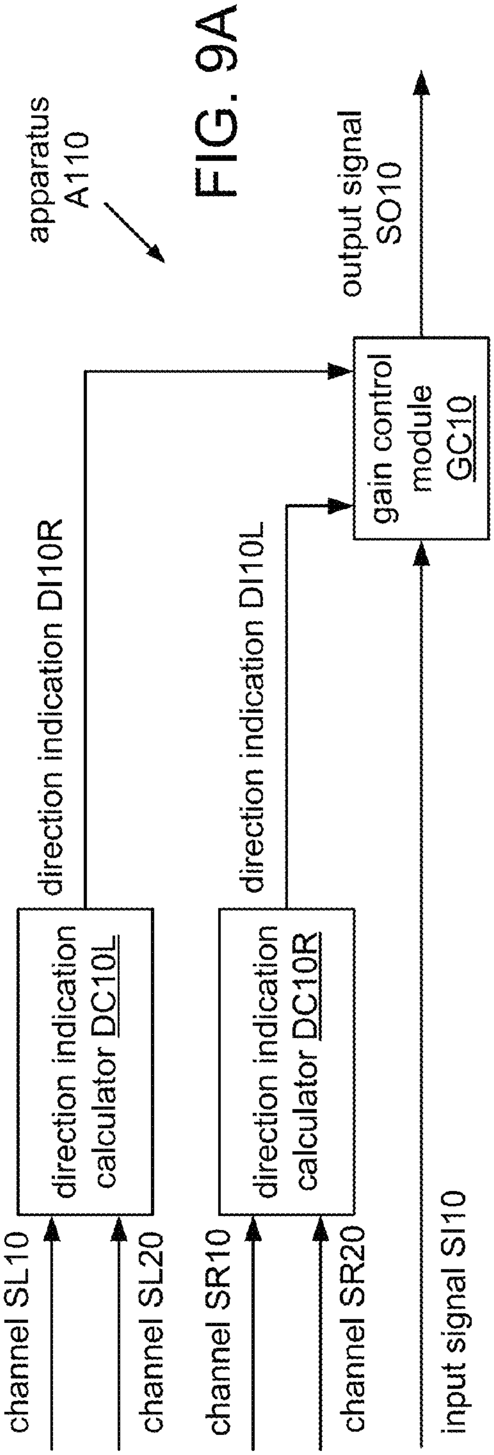
FIG. 9A shows a block diagram of an implementation A110 of apparatus A100.

FIG. 9A shows a block diagram of an implementation A110 of apparatus A100 that includes instances DC10L and DC10R of a direction indication calculator. Calculator DC10L calculates a direction indication DI10L for the multichannel signal (including left channels SL10 and SL20) produced by left microphone array R100L, and calculator DC10R calculates a direction indication DI10R for the multichannel signal (including right channels SR10 and SR20) produced by right microphone array R100R.

Each of the direction indications DI10L and DI10R indicates a direction of arrival (DOA) of a sound component of the corresponding multichannel signal relative to the corresponding array. Depending on the particular implementation of calculators DC10L and DC10R, the direction indicator may indicate the DOA relative to the location of the inner microphone, relative to the location of the outer microphone, or relative to another reference point on the corresponding array axis that is between those locations (e.g., a midpoint between the microphone locations). Examples of direction indications include a gain difference or ratio, a time difference of arrival, a phase difference, and a ratio between phase difference and frequency. Apparatus A110 also includes a gain control module GC10 that is configured to control a gain of input audio signal SI10 according to the values of the direction indications DI10L and DI10R.

Each of direction indication calculators DC10L and DC10R may be configured to process the corresponding multichannel signal as a series of segments. For example, each of direction indication calculators DC10L and DC10R may be configured to calculate a direction indicator for each of a series of segments of the corresponding multichannel signal. Typical segment lengths range from about five or ten milliseconds to about forty or fifty milliseconds, and the segments may be overlapping (e.g., with adjacent segments overlapping by 25% or 50%) or nonoverlapping. In one particular example, the multichannel signal is divided into a series of nonoverlapping segments or "frames", each having a length of ten milliseconds. In another particular example, each frame has a length of twenty milliseconds. A segment as processed by a DOA estimation operation may also be a segment (i.e., a "subframe") of a larger segment as processed by a different audio processing operation, or vice versa.

Calculators DC10L and DC10R may be configured to perform any one or more of several different DOA estimation techniques to produce the direction indications. Techniques for DOA estimation that may be expected to produce estimates of source DOA with similar spatial resolution include gain-difference-based methods and phase-difference-based methods. Cross-correlation-based methods (e.g., calculating a lag between channels of the multichannel signal, and using the lag as a time-difference-of-arrival to determine DOA) may also be useful in some cases.

Figure 9B:
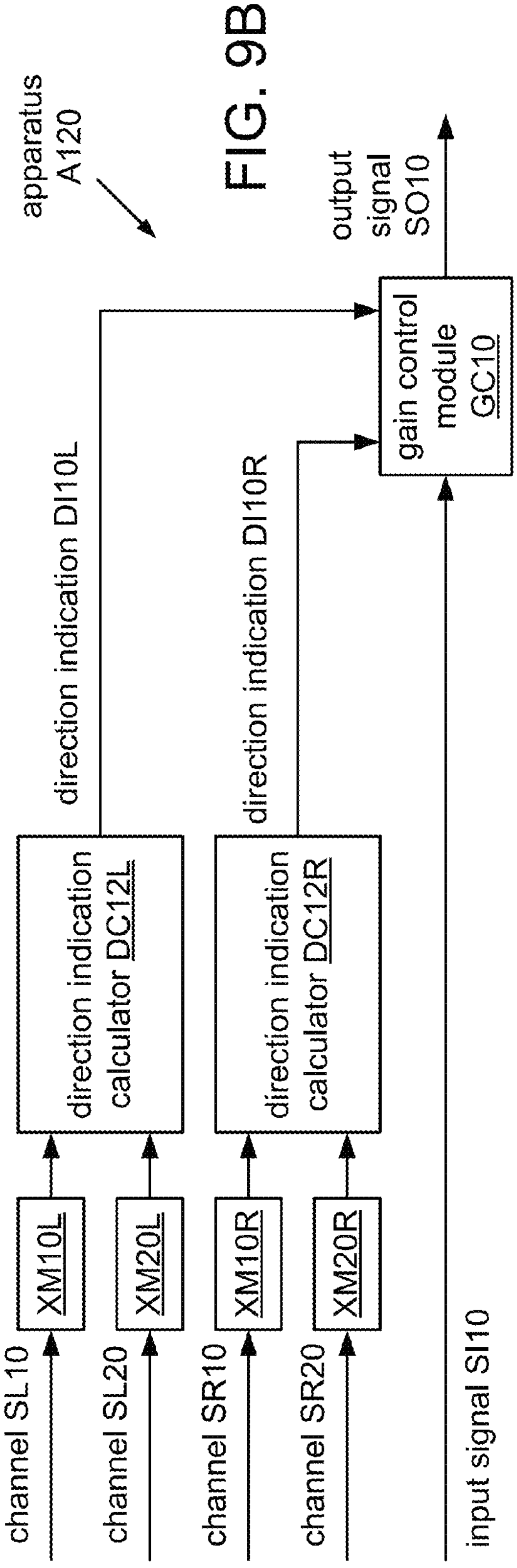
FIG. 9B shows a block diagram of an implementation A120 of apparatus A110.

As described herein, direction calculators DC10L and DC10R may be implemented to perform DOA estimation on the corresponding multichannel signal in the time domain or in a frequency domain (e.g., a transform domain, such as an FFT, DCT, or MDCT domain). FIG. 9B shows a block diagram of an implementation A120 of apparatus A110 that includes four instances XM10L, XM20L, XM10R, and XM20R of a transform module, each configured to calculate a frequency transform of the corresponding channel, such as a fast Fourier transform (FFT) or modified discrete cosine transform (MDCT). Apparatus A120 also includes implementations DC12L and DC12R of direction indication calculators DC10L and DC10R, respectively, that are configured to receive and operate on the corresponding channels in the transform domain.

A gain-difference-based method estimates the DOA based on a difference between the gains of signals that are based on channels of the multichannel signal. For example, such implementations of calculators DC10L and DC10R may be configured to estimate the DOA based on a difference between the gains of different channels of the multichannel signal (e.g., a difference in magnitude or energy). Measures of the gain of a segment of the multichannel signal may be calculated in the time domain or in a frequency domain (e.g., a transform domain, such as an FFT, DCT, or MDCT domain). Examples of such gain measures include, without limitation, the following: total magnitude (e.g., sum of absolute values of sample values), average magnitude (e.g., per sample), RMS amplitude, median magnitude, peak magnitude, peak energy, total energy (e.g., sum of squares of sample values), and average energy (e.g., per sample). In order to obtain accurate results with a gain-difference technique, it may be desirable for the responses of the two microphone channels to be calibrated relative to each other. It may be desirable to apply a lowpass filter to the multichannel signal such that calculation of the gain measure is limited to an audio-frequency component of the multichannel signal.

Direction calculators DC10L and DC10R may be implemented to calculate a difference between gains as a difference between corresponding gain measure values for each channel in a logarithmic domain (e.g., values in decibels) or, equivalently, as a ratio between the gain measure values in a linear domain. For a calibrated microphone pair, a gain difference of zero may be taken to indicate that the source is equidistant from each microphone (i.e., located in a broadside direction of the pair), a gain difference with a large positive value may be taken to indicate that the source is closer to one microphone (i.e., located in one endfire direction of the pair), and a gain difference with a large negative value may be taken to indicate that the source is closer to the other microphone (i.e., located in the other endfire direction of the pair).

Figure 10A:
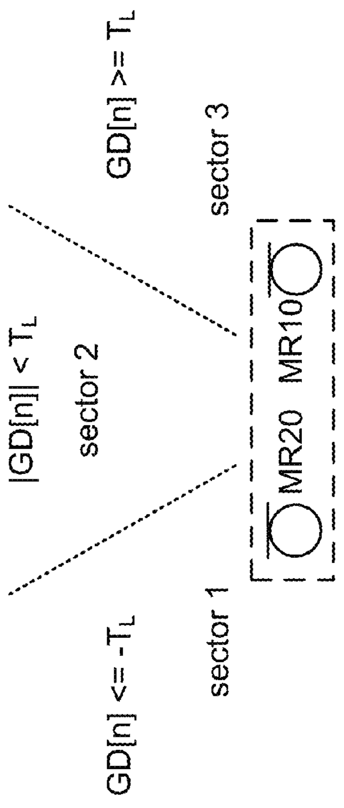
FIGS. 10A and 10B show examples in which direction calculator DC10R indicates the direction of arrival (DOA) of a source relative to the microphone pair MR10 and MR20.
Figure 10B:
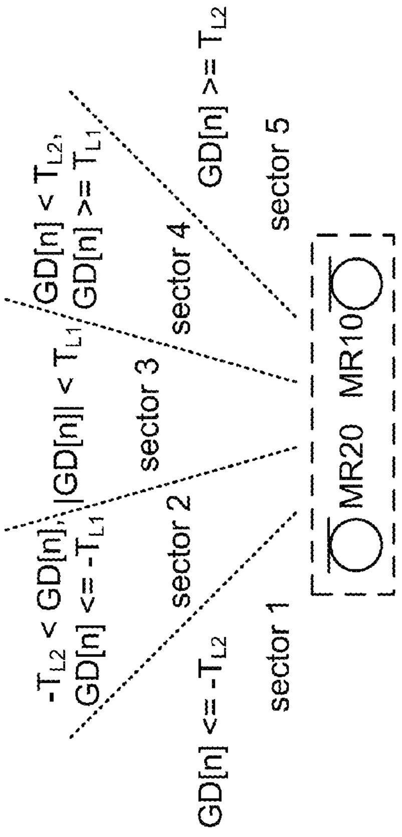

FIG. 10A shows an example in which direction calculator DC10R estimates the DOA of a source relative to the microphone pair MR10 and MR20 by selecting one among three spatial sectors (i.e., endfire sector 1, broadside sector 2, and endfire sector 3) according to the state of a relation between the gain difference GD[n] for segment n and a gain-difference threshold value $T_L$. FIG. 10B shows an example in which direction calculator DC10R estimates the DOA of a source relative to the microphone pair MR10 and MR20 by selecting one among five spatial sectors according to the state of a relation between gain difference GD[n] and a first gain-difference threshold value $T_{L1}$ and the state of a relation between gain difference GD[n] and a second gain-difference threshold value $T_{L2}$.

In another example, direction calculators DC10L and DC10R are implemented to estimate the DOA of a source using a gain-difference-based method which is based on a difference in gain among beams that are generated from the multichannel signal (e.g., from an audio-frequency component of the multichannel signal). Such implementations of calculators DC10L and DC10R may be configured to use a set of fixed filters to generate a corresponding set of beams that span a desired range of directions (e.g., 180 degrees in 10-degree increments, 30-degree increments, or 45-degree increments). In one example, such an approach applies each of the fixed filters to the multichannel signal and estimates the DOA (e.g., for each segment) as the look direction of the beam that exhibits the highest output energy.

Figure 11A:
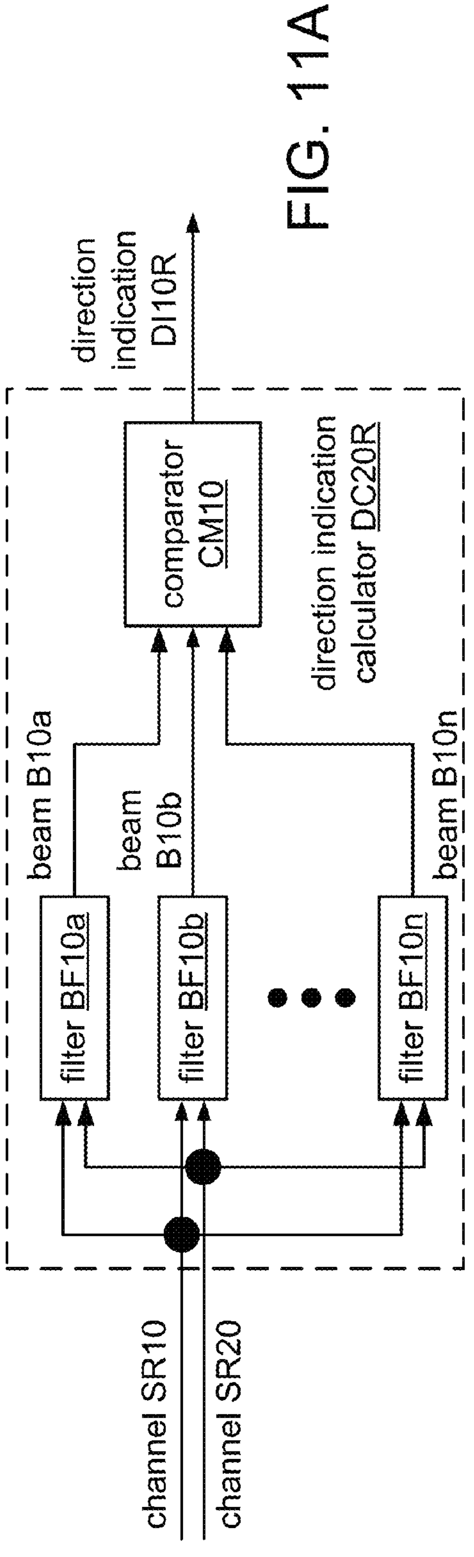
FIG. 11A shows a block diagram of an example of an implementation DC20R of direction indication calculator DC10R.

FIG. 11A shows a block diagram of an example of such an implementation DC20R of direction indication calculator DC10R that includes fixed filters BF10*a*, BF10*b*, and BF10*n* arranged to filter multichannel signal S10 to generate respective beams B10*a*, B10*b*, and B10*n*. Calculator DC20R also includes a comparator CM10 that is configured to generate direction indication DI10R according to the beam having the greatest energy. Examples of beamforming approaches that may be used to generate the fixed filters include generalized sidelobe cancellation (GSC), minimum variance distortionless response (MVDR), and linearly constrained minimum variance (LCMV) beamformers. Other examples of beam generation approaches that may be used to generate the fixed filters include blind source separation (BSS) methods, such as independent component analysis (ICA) and independent vector analysis (IVA), which operate by steering null beams toward interfering point sources.

Figure 10C:
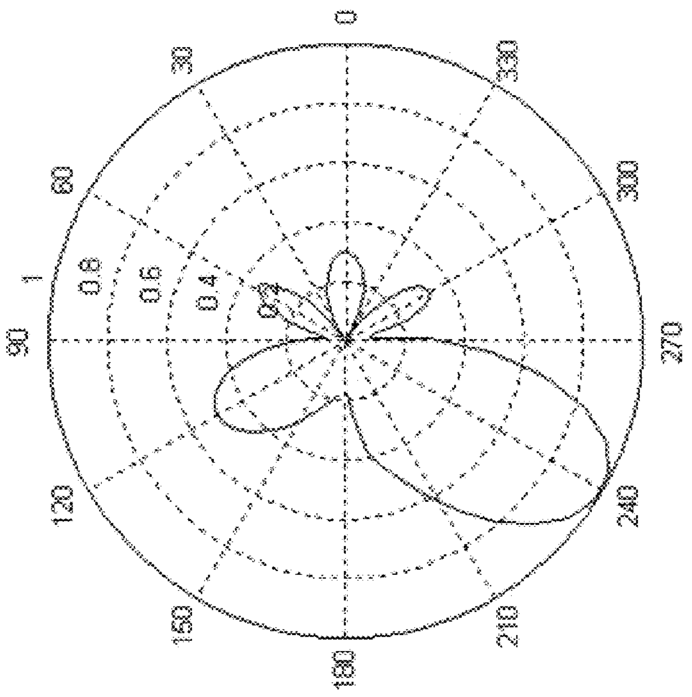
FIG. 10C shows an example of a beam pattern for an asymmetrical array.
Figure 12:
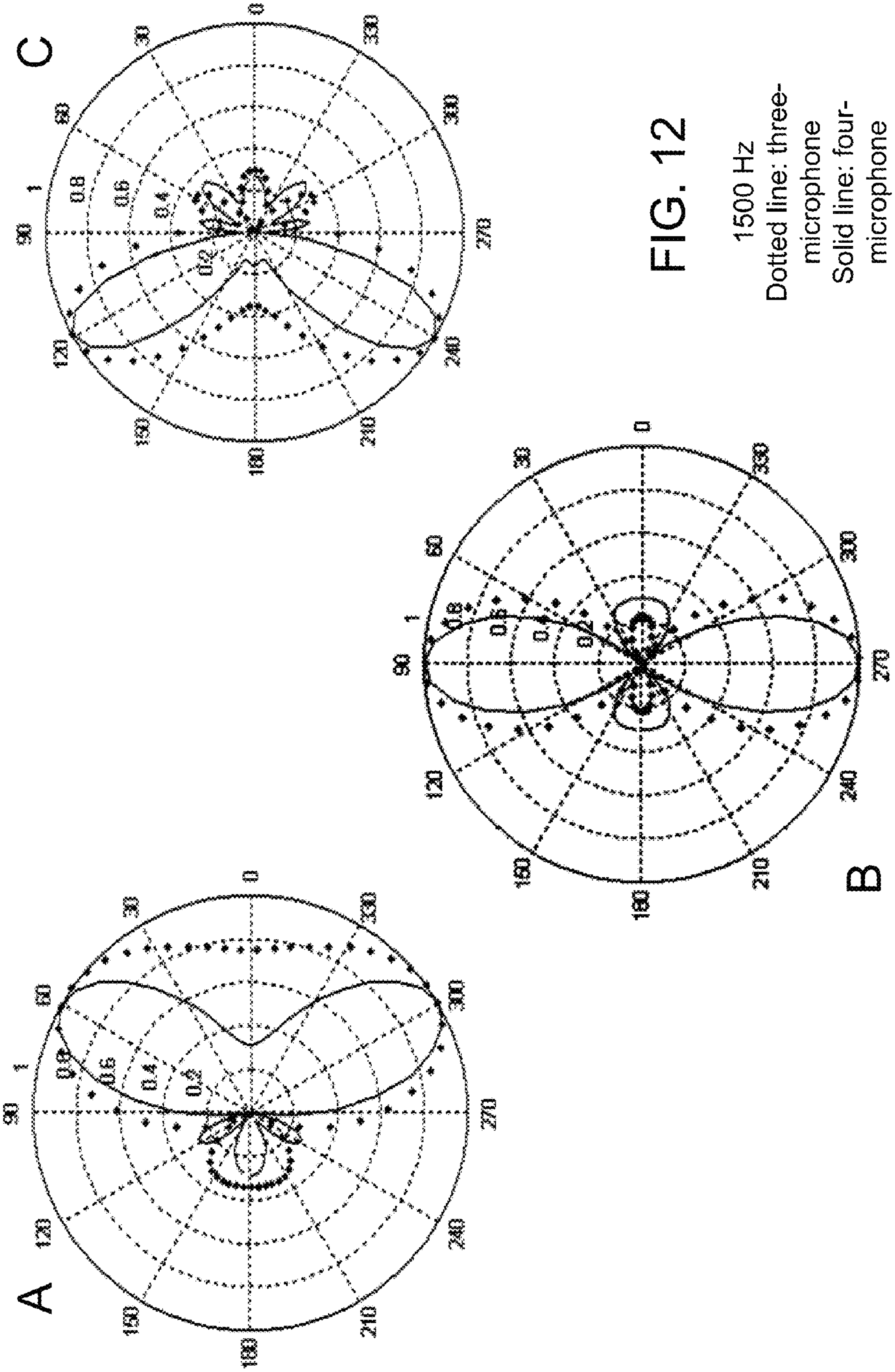
FIGS. 12 and 13 show examples of beamformer beam patterns.
Figure 13:
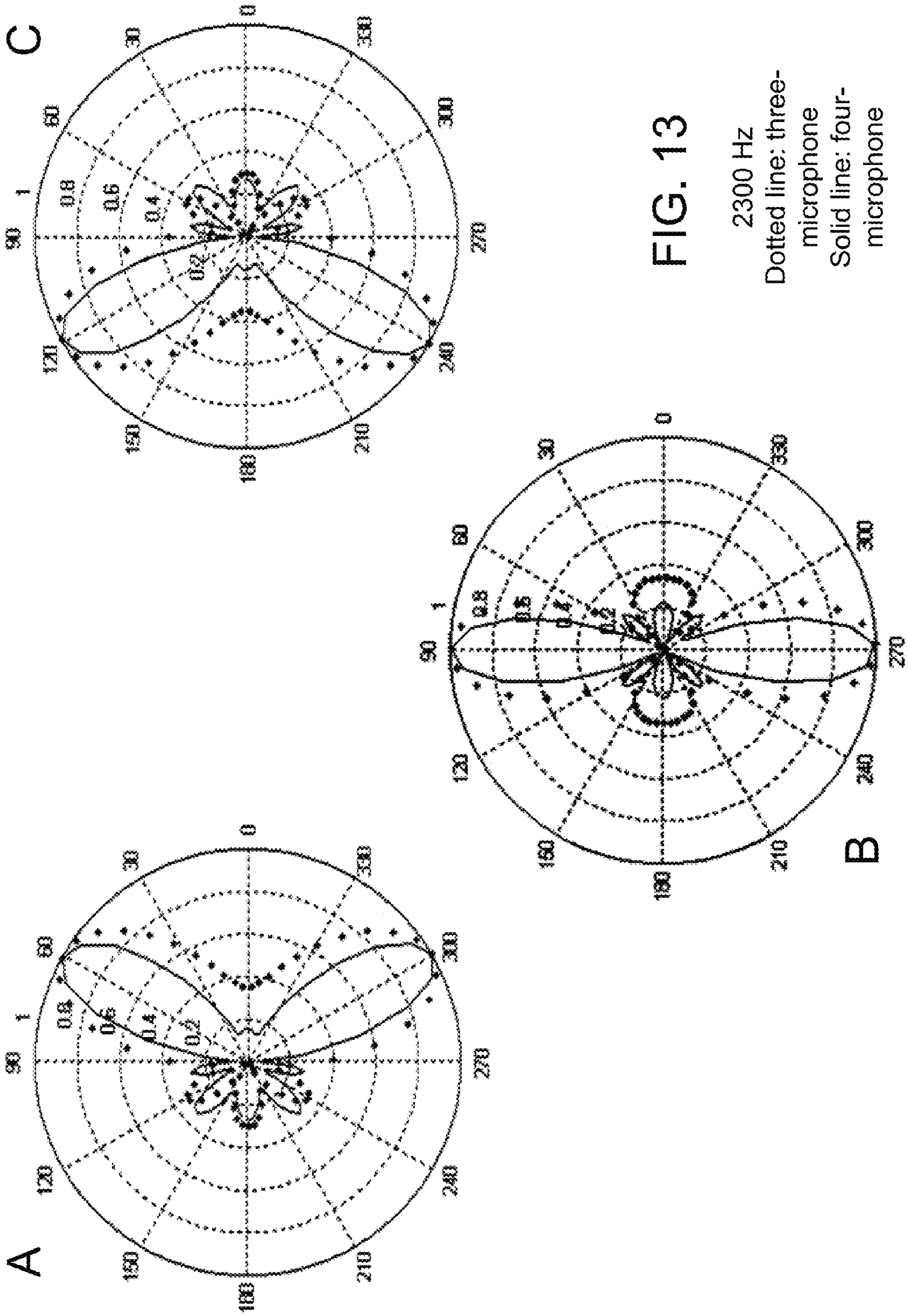

FIGS. 12 and 13 show examples of beamformer beam patterns for an array of three microphones (dotted lines) and for an array of four microphones (solid lines) at 1500 Hz and 2300 Hz, respectively. In these figures, the top left plot A shows a pattern for a beamformer with a look direction of about sixty degrees, the bottom center plot B shows a pattern for a beamformer with a look direction of about ninety degrees, and the top right plot C shows a pattern for a beamformer with a look direction of about 120 degrees. Beamforming with three or four microphones arranged in a linear array (for example, with a spacing between adjacent microphones of about 3.5 cm) may be used to obtain a spatial bandwidth discrimination of about 10-20 degrees. FIG. 10C shows an example of a beam pattern for an asymmetrical array.

In a further example, direction calculators DC10L and DC10R are implemented to estimate the DOA of a source using a gain-difference-based method which is based on a difference in gain between channels of beams that are generated from the multichannel signal (e.g., using a beamforming or BSS method as described above) to produce a multichannel output. For example, a fixed filter may be configured to generate such a beam by concentrating energy arriving from a particular direction or source (e.g., a look direction) into one output channel and/or concentrating energy arriving from another direction or source into a different output channel. In such case, the gain-difference-based method may be implemented to estimate the DOA as the look direction of the beam that has the greatest difference in energy between its output channels.

Figure 11B:
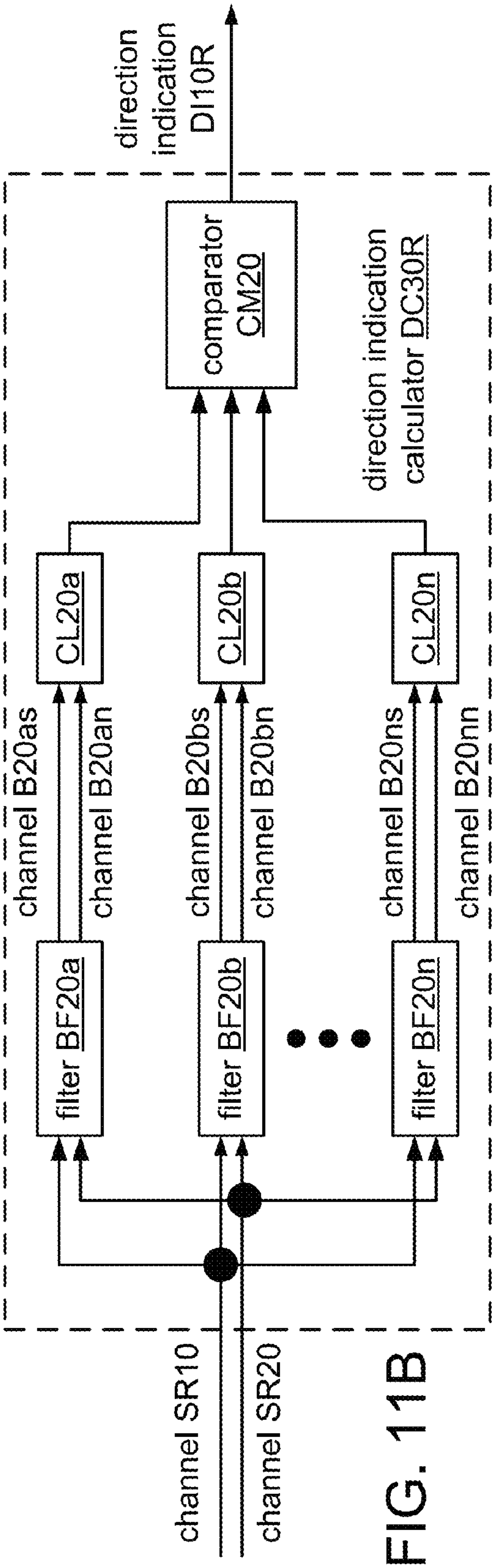
FIG. 11B shows a block diagram of an implementation DC30R of direction indication calculator DC10R.

FIG. 11B shows a block diagram of an implementation DC30R of direction indication calculator DC10R that includes fixed filters BF20*a*, BF20*b*, and BF20*n* arranged to filter multichannel signal S10 to generate respective beams having signal channels B20*as*, B20*bs*, and B20*ns* (e.g., corresponding to a respective look direction) and noise channels B20*an*, B20*bn*, and B20*nn*. Calculator DC30R also includes calculators CL20*a*, CL20*b*, and CL20*n* arranged to calculate a signal-to-noise ratio (SNR) for each beam and a comparator CM20 configured to generate direction indication DI10R according to the beam having the greatest SNR.

Figure 14:
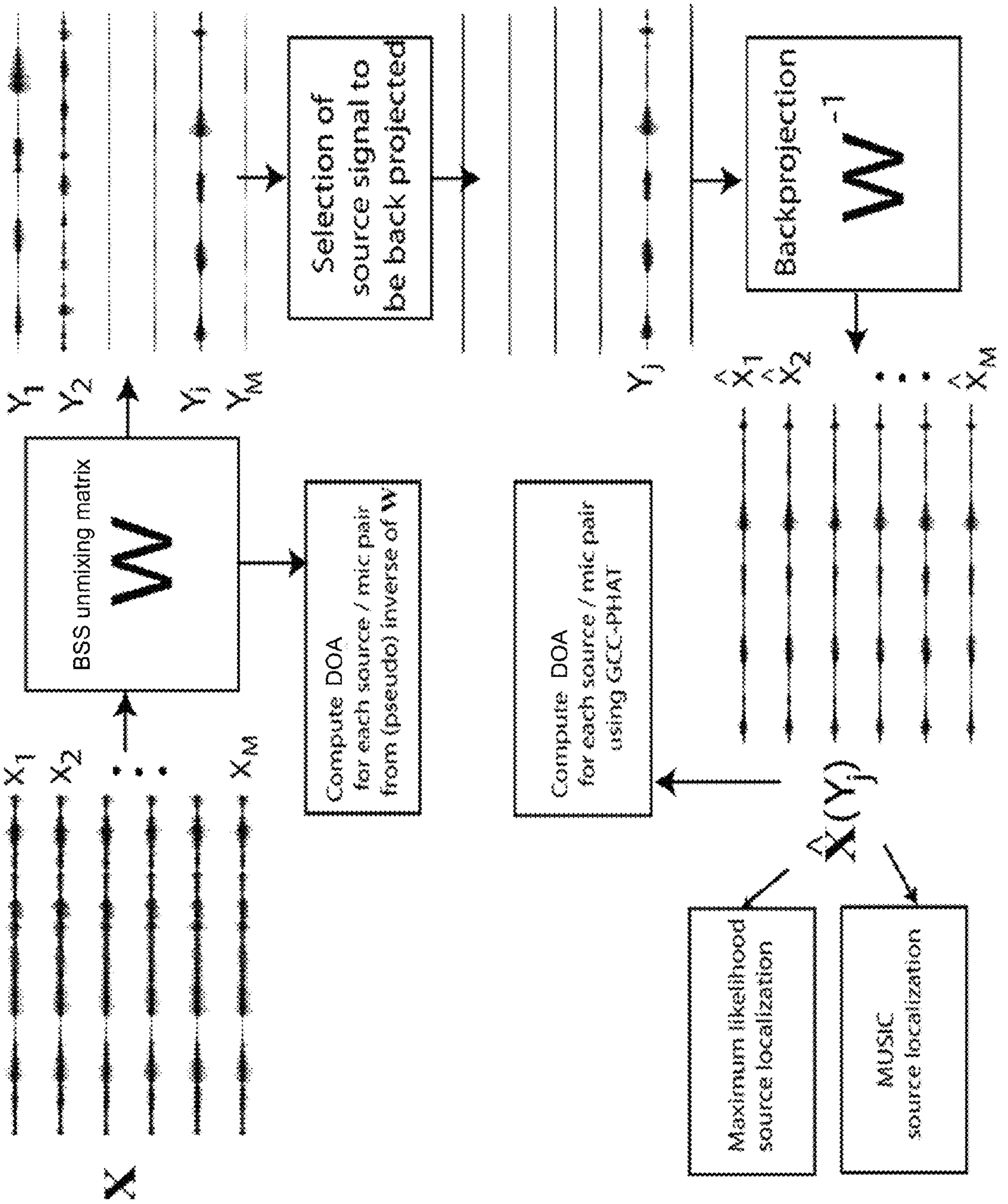
FIG. 14 illustrates back-projection methods of DOA estimation.

Direction indication calculators DC10L and DC10R may also be implemented to obtain a DOA estimate by directly using a BSS unmixing matrix W and the microphone spacing. Such a technique may include estimating the source DOA (e.g., for each source-microphone pair) by using back-projection of separated source signals, using an inverse (e.g., the Moore-Penrose pseudo-inverse) of the unmixing matrix W, followed by single-source DOA estimation on the back-projected data. Such a DOA estimation method is typically robust to errors in microphone gain response calibration. The BSS unmixing matrix W is applied to the m microphone signals $X_1$ to $X_M$, and the source signal to be back-projected $Y_j$ is selected from among the outputs of matrix W. A DOA for each source-microphone pair may be computed from the back-projected signals using a technique such as GCC-PHAT or SRP-PHAT. A maximum likelihood and/or multiple signal classification (MUSIC) algorithm may also be applied to the back-projected signals for source localization. The back-projection methods described above are illustrated in FIG. 14.

Alternatively, direction calculators DC10L and DC10R may be implemented to estimate the DOA of a source using a phase-difference-based method that is based on a difference between phases of different channels of the multichannel signal. Such methods include techniques that are based on a cross-power-spectrum phase (CPSP) of the multichannel signal (e.g., of an audio-frequency component of the multichannel signal), which may be calculated by normalizing each element of the cross-power-spectral-density vector by its magnitude. Examples of such techniques include generalized cross-correlation with phase transform (GCC-PHAT) and steered response power-phase transform (SRP-PHAT), which typically produce the estimated DOA in the form of a time difference of arrival. One potential advantage of phase-difference-based implementations of direction indication calculators DC10L and DC10R is that they are typically robust to mismatches between the gain responses of the microphones.

Other phase-difference-based methods include estimating the phase in each channel for each of a plurality of frequency components to be examined. In one example, direction indication calculators DC12L and DC12R are configured to estimate the phase of a frequency component as the inverse tangent (also called the arctangent) of the ratio of the imaginary term of the FFT coefficient of the frequency component to the real term of the FFT coefficient of the frequency component. It may be desirable to configure such a calculator to calculate the phase difference $\Delta\phi$ for each frequency component to be examined by subtracting the estimated phase for that frequency component in a primary channel from the estimated phase for that frequency component in another (e.g., secondary) channel. In such case, the primary channel may be the channel expected to have the highest signal-to-noise ratio, such as the channel corresponding to a microphone that is expected to receive the user's voice most directly during a typical use of the device.

It may be unnecessary for a DOA estimation method to consider phase differences across the entire bandwidth of the signal. For many bands in a wideband range (e.g., 0-8000 Hz), for example, phase estimation may be impractical or unnecessary. The practical valuation of phase relationships of a received waveform at very low frequencies typically requires correspondingly large spacings between the transducers. Consequently, the maximum available spacing between microphones may establish a low frequency bound. On the other end, the distance between microphones should not exceed half of the minimum wavelength in order to avoid spatial aliasing. An eight-kilohertz sampling rate, for example, gives a bandwidth from zero to four kilohertz. The wavelength of a four-kHz signal is about 8.5 centimeters, so in this case, the spacing between adjacent microphones should not exceed about four centimeters. The microphone channels may be lowpass filtered in order to remove frequencies that might give rise to spatial aliasing.

It may be desirable to perform DOA estimation over a limited audio-frequency range of the multichannel signal, such as the expected frequency range of a speech signal. In one such example, direction indication calculators DC12L and DC12R are configured to calculate phase differences for the frequency range of 700 Hz to 2000 Hz, which may be expected to include most of the energy of the user's voice. For a 128-point FFT of a four-kilohertz-bandwidth signal, the range of 700 to 2000 Hz corresponds roughly to the twenty-three frequency samples from the tenth sample through the thirty-second sample. In further examples, such a calculator is configured to calculate phase differences over a frequency range that extends from a lower bound of about fifty, 100, 200, 300, or 500 Hz to an upper bound of about 700, 1000, 1200, 1500, or 2000 Hz (each of the twenty-five combinations of these lower and upper bounds is expressly contemplated and disclosed).

The energy spectrum of voiced speech (e.g., vowel sounds) tends to have local peaks at harmonics of the pitch frequency. The energy spectrum of background noise, on the other hand, tends to be relatively unstructured. Consequently, components of the input channels at harmonics of the pitch frequency may be expected to have a higher signal-to-noise ratio (SNR) than other components. It may be desirable to configure direction indication calculators DC12L and DC12R to favor phase differences which correspond to multiples of an estimated pitch frequency. For example, it may be desirable for at least twenty-five, fifty, or seventy-five percent (possibly all) of the calculated phase differences to correspond to multiples of an estimated pitch frequency, or to weight direction indicators that correspond to such components more heavily than others. Typical pitch frequencies range from about 70 to 100 Hz for a male speaker to about 150 to 200 Hz for a female speaker, and a current estimate of the pitch frequency (e.g., in the form of an estimate of the pitch period or "pitch lag") will typically already be available in applications that include speech encoding and/or decoding (e.g., voice communications using codecs that include pitch estimation, such as code-excited linear prediction (CELP) and prototype waveform interpolation (PWI)). The same principle may be applied to other desired harmonic signals as well. Conversely, it may be desirable to configure direction indication calculators DC12L and DC12R to ignore frequency components which correspond to known interferers, such as tonal signals (e.g., alarms, telephone rings, and other electronic alerts).

Direction indication calculators DC12L and DC12R may be implemented to calculate, for each of a plurality of the calculated phase differences, a corresponding indication of the DOA. In one example, an indication of the DOA 0, of each frequency component is calculated as a ratio $r_i$ between estimated phase difference $\Delta\phi_i$ and frequency $f_i$ (e.g., $r_i=\phi_i/f_i$). Alternatively, an indication of the DOA $\theta_i$ may be calculated as the inverse cosine (also called the arccosine) of the quantity $$\frac{c\Delta\varphi_i}{d2\pi f_i},$$

where c denotes the speed of sound (approximately 340 m/sec), d denotes the distance between the microphones, $\Delta\phi_i$ denotes the difference in radians between the corresponding phase estimates for the two microphones, and $f_i$ is the frequency component to which the phase estimates correspond (e.g., the frequency of the corresponding FFT samples, or a center or edge frequency of the corresponding subbands). Alternatively, an indication of the direction of arrival $\theta_i$ may be calculated the inverse cosine of the quantity $$\frac{\lambda_i\Delta\varphi_i}{d2\pi},$$

where $\lambda_i$ denotes the wavelength of frequency component $f_i$.

In another example, direction indication calculators DC12L and DC12R are implemented to calculate an indication of the DOA, for each of a plurality of the calculated phase differences, as the time delay of arrival $\tau_i$ (e.g., in seconds) of the corresponding frequency component $f_i$ of the multichannel signal. For example, such a method may be configured to estimate the time delay of arrival $\tau_i$ at a secondary microphone with reference to a primary microphone, using an expression such as $$\tau_i = \frac{\lambda_i\Delta\varphi_i}{c2\pi} \text{ or } \tau_i = \frac{\Delta\varphi_i}{2\pi f_i}.$$

In these examples, a value of $\tau_i=0$ indicates a signal arriving from a broadside direction, a large positive value of $\tau_i$ indicates a signal arriving from the reference endfire direction, and a large negative value of $\tau_i$ indicates a signal arriving from the other endfire direction. In calculating the values $\tau_i$, it may be desirable to use a unit of time that is deemed appropriate for the particular application, such as sampling periods (e.g., units of 125 microseconds for a sampling rate of 8 kHz) or fractions of a second (e.g., $10^{-3}$, $10^{-4}$, $10^{-5}$, or $10^{-6}$ sec). It is noted that a time delay of arrival $\tau_i$ may also be calculated by cross-correlating the frequency components $f_i$ of each channel in the time domain.

Direction indication calculators DC12L and DC12R may be implemented to perform a phase-difference-based method by indicating the DOA of a frame (or subband) as an average (e.g., the mean, median, or mode) of the DOA indicators of the corresponding frequency components. Alternatively, such calculators may be implemented to indicate the DOA of a frame (or subband) by dividing the desired range of DOA coverage into a plurality of bins (e.g., a fixed scheme of 3, 4, 5, 6, 7, 8, 9, 10, 11, or 12 bins for a range of 0-180 degrees) and determining the number of DOA indicators of the corresponding frequency components whose values fall within each bin (i.e., the bin population). For a case in which the bins have unequal bandwidths, it may be desirable for such a calculator to calculate the bin population values by normalizing each bin population by the corresponding bandwidth. The DOA of the desired source may be indicated as the direction corresponding to the bin having the highest population value, or as the direction corresponding to the bin whose current population value has the greatest contrast (e.g., that differs by the greatest relative magnitude from a long-term time average of the population value for that bin).

Similar implementations of calculators DC12L and DC12R use a set of directional masking functions to divide the desired range of DOA coverage into a plurality of spatial sectors (e.g., 3, 4, 5, 6, 7, 8, 9, 10, 11, or 12 sectors for a range of 0-180 degrees). The directional masking functions for adjacent sectors may overlap or not, and the profile of a directional masking function may be linear or nonlinear. A directional masking function may be implemented such that the sharpness of the transition or transitions between stopband and passband are selectable and/or variable during operation according to the values of one or more factors (e.g., signal-to-noise ratio (SNR), noise floor, etc.). For example, it may be desirable for the calculator to use a more narrow passband when the SNR is low.

Figure 15A:
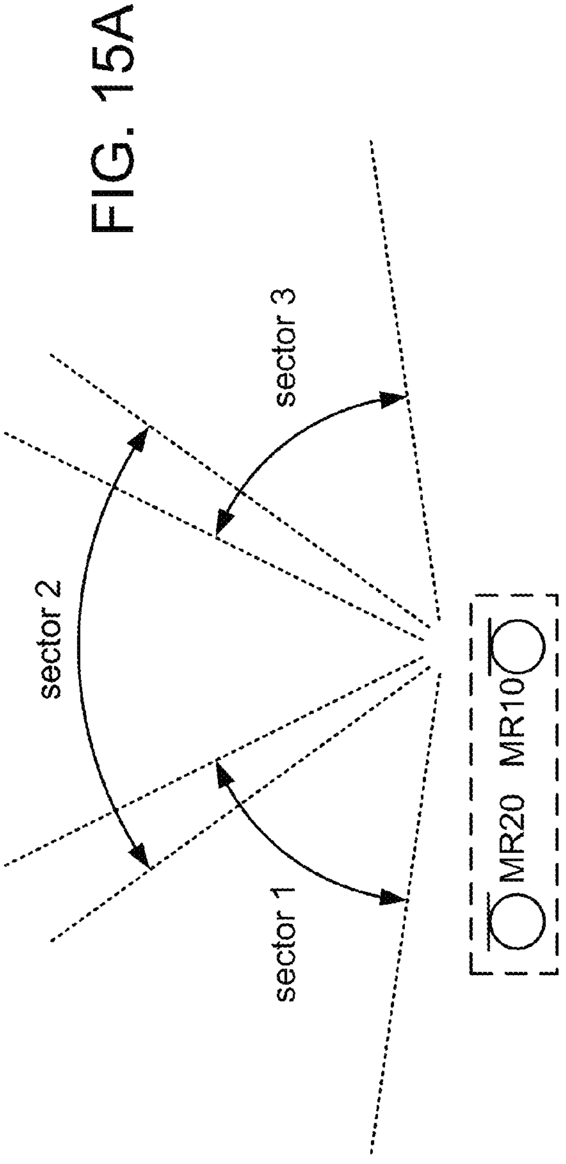
FIGS. 15A and 15B show top views of sector-based applications of implementations of calculator DC12R.
Figure 15B:
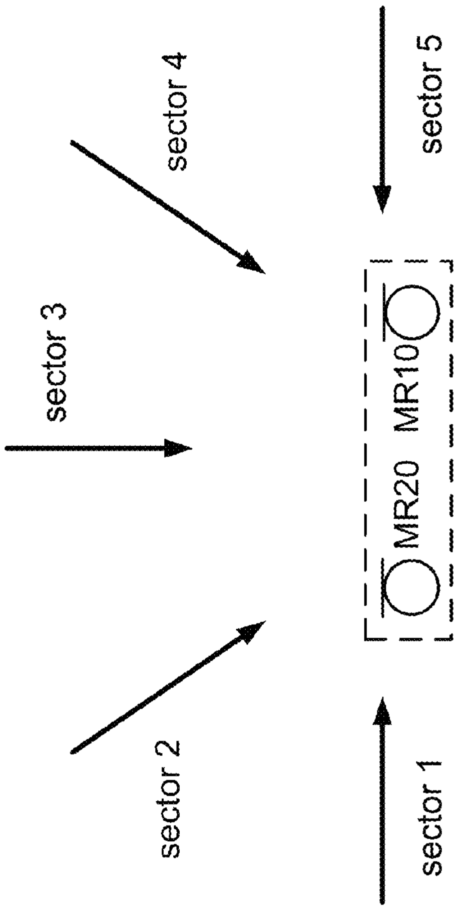
Figure 16A:
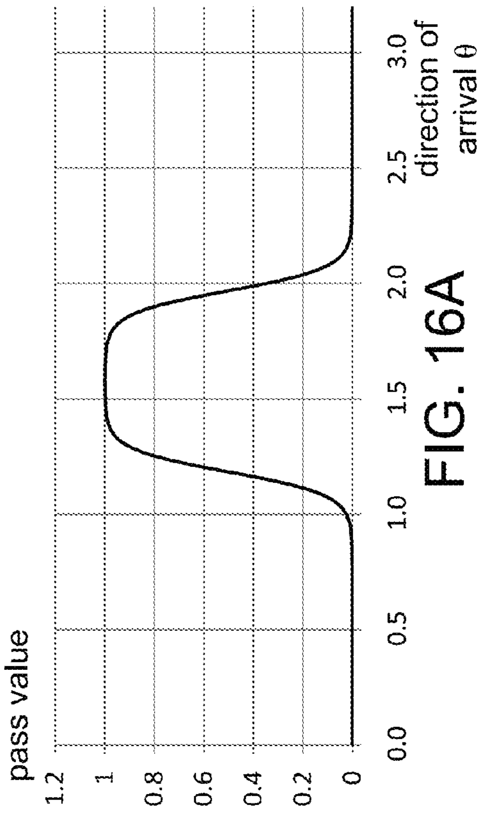
FIGS. 16A-16D show individual examples of directional masking functions.
Figure 16B:
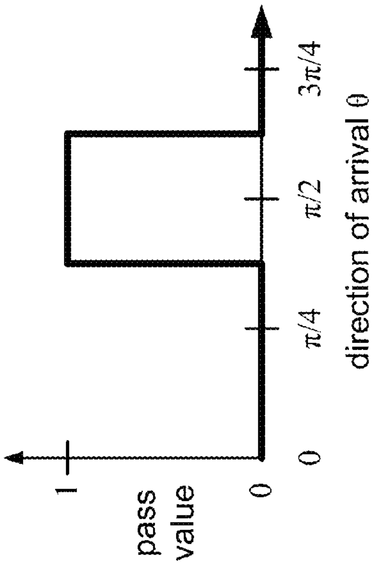
Figure 16C:
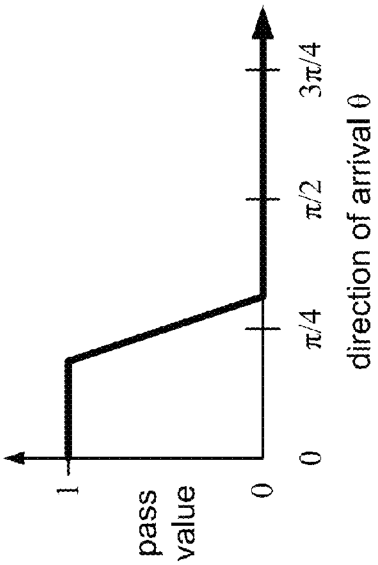
Figure 16D:
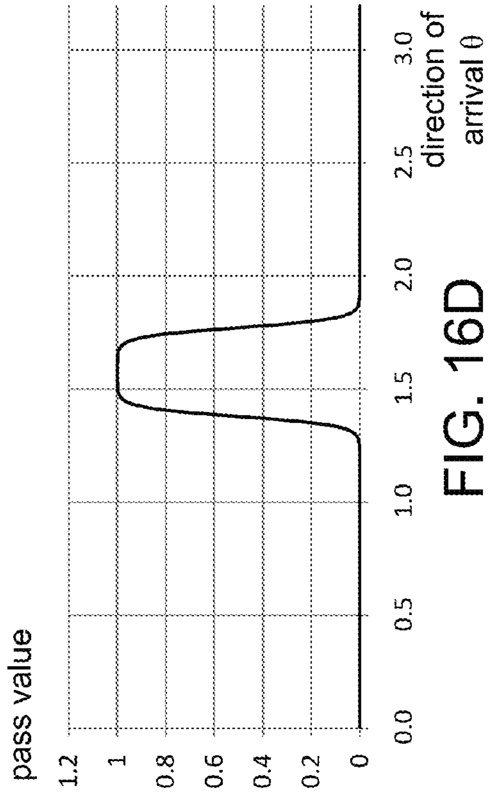

The sectors may have the same angular width (e.g., in degrees or radians) as one another, or two or more (possibly all) of the sectors may have different widths from one another. FIG. 15A shows a top view of an application of such an implementation of calculator DC12R in which a set of three overlapping sectors is applied to the channel pair corresponding to microphones MR10 and MR20 for phase-difference-based DOA indication relative to the location of microphone MR10. FIG. 15B shows a top view of an application of such an implementation of calculator DC12R in which a set of five sectors (where the arrow at each sector indicates the DOA at the center of the sector) is applied to the channel pair corresponding to microphones MR10 and MR20 for phase-difference-based DOA indication relative to the midpoint of the axis of microphone pair MR10, MR20.

Figure 17:
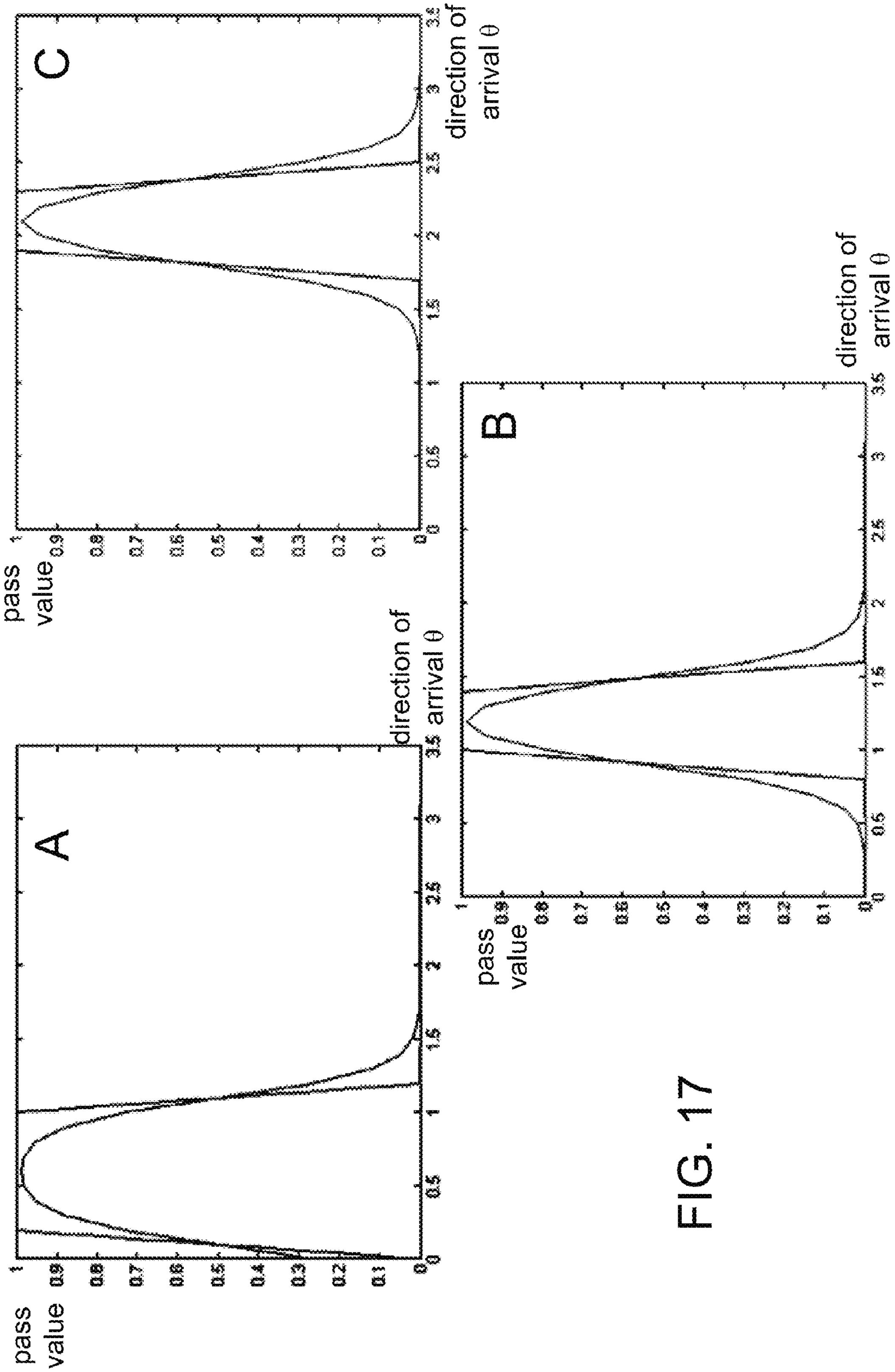
FIG. 17 shows examples of two different sets of three directional masking functions.

FIGS. 16A-16D show individual examples of directional masking functions, and FIG. 17 shows examples of two different sets (linear vs. curved profiles) of three directional masking functions. In these examples, the output of a masking function for each segment is based on the sum of the pass values for the corresponding phase differences of the frequency components being examined. For example, such implementations of calculators DC12L and DC12R may be configured to calculate the output by normalizing the sum with respect to a maximum possible value for the masking function. Of course, the response of a masking function may also be expressed in terms of time delay $\tau$ or ratio r rather than direction $\theta$.

Figure 18:
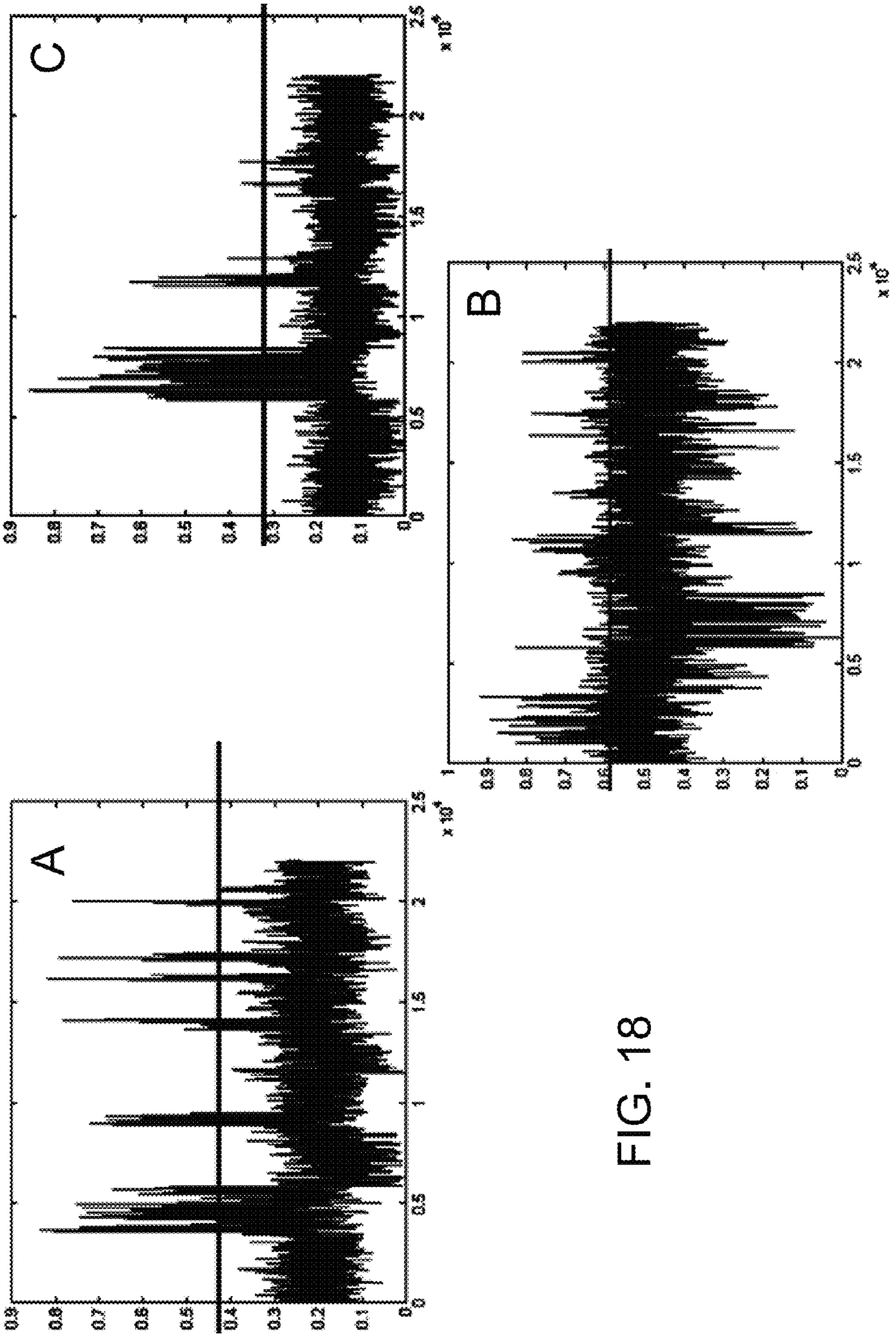
FIG. 18 shows plots of magnitude vs. time for results of applying a set of three directional masking functions as shown in FIG. 17 to the same multichannel audio signal.

It may be expected that a microphone array will receive different amounts of ambient noise from different directions. FIG. 18 shows plots of magnitude vs. time (in frames) for results of applying a set of three directional masking functions as shown in FIG. 17 to the same multichannel audio signal. It may be seen that the average responses of the various masking functions to this signal differ significantly. It may be desirable to configure implementations of calculators DC12L and DC12R that use such masking functions to apply a respective detection threshold value to the output of each masking function, such that a DOA corresponding to that sector is not selected as an indication of DOA for the segment unless the masking function output is above (alternatively, is not less than) the corresponding detection threshold value.

The "directional coherence" of a multichannel signal is defined as the degree to which the various frequency components of the signal arrive from the same direction. For an ideally directionally coherent channel pair, the value of $$\frac{\Delta\varphi}{f}$$

is equal to a constant k for all frequencies, where the value of k is related to the direction of arrival $\theta$ and the time delay of arrival $\tau$. Implementations of direction calculator DC12L and DC12R may be configured to quantify the directional coherence of a multichannel signal, for example, by rating the estimated direction of arrival for each frequency component according to how well it agrees with a particular direction (e.g., using a directional masking function), and then combining the rating results for the various frequency components to obtain a coherency measure for the signal. Consequently, the masking function output for a spatial sector, as calculated by a corresponding implementation of direction calculator DC12L or DC12R, is also a measure of the directional coherence of the multichannel signal within that sector. Calculation and application of a measure of directional coherence is also described in, e.g., Int'l Pat. Publ's WO2010/048620 A1 and WO2010/144577 A1 (Visser et al.).

It may be desirable to implement direction calculators DC12L and DC12R to produce a coherency measure for each sector as a temporally smoothed value. In one such example, the direction calculator is configured to produce the coherency measure as a mean value over the most recent m frames, where possible values of m include four, five, eight, ten, sixteen, and twenty. In another such example, the direction calculator is configured to calculate a smoothed coherency measure z(n) for frame n according to an expression such as $z(n)=\beta z(n-1)+(1-\beta)c(n)$ (also known as a first-order IIR or recursive filter), where $z(n-1)$ denotes the smoothed coherency measure for the previous frame, c(n) denotes the current unsmoothed value of the coherency measure, and $\beta$ is a smoothing factor whose value may be selected from the range of from zero (no smoothing) to one (no updating). Typical values for smoothing factor $\beta$ include 0.1, 0.2, 0.25, 0.3, 0.4, and 0.5. It is typical, but not necessary, for such implementations of direction calculators DC12L and DC12R to use the same value of $\beta$ to smooth coherency measures that correspond to different sectors.

The contrast of a coherency measure may be expressed as the value of a relation (e.g., the difference or the ratio) between the current value of the coherency measure and an average value of the coherency measure over time (e.g., the mean, mode, or median over the most recent ten, twenty, fifty, or one hundred frames). Implementations of direction calculators DC12L and DC12R may be configured to calculate the average value of a coherency measure for each sector using a temporal smoothing function, such as a leaky integrator or according to an expression such as $v(n)=\alpha v(n-1)+(1-\alpha)c(n)$, where $v(n)$ denotes the average value for the current frame, $v(n-1)$ denotes the average value for the previous frame, $c(n)$ denotes the current value of the coherency measure, and $\alpha$ is a smoothing factor whose value may be selected from the range of from zero (no smoothing) to one (no updating). Typical values for smoothing factor $\alpha$ include 0.01, 0.02, 0.05, and 0.1.

Implementations of direction calculators DC12L and DC12R may be configured to use a sector-based DOA estimation method to estimate the DOA of the signal as the DOA associated with the sector whose coherency measure is greatest. Alternatively, such a direction calculator may be configured to estimate the DOA of the signal as the DOA associated with the sector whose coherency measure currently has the greatest contrast (e.g., has a current value that differs by the greatest relative magnitude from a long-term time average of the coherency measure for that sector). Additional description of phase-difference-based DOA estimation may be found, for example, in U.S. Publ. Pat. Appl. 2011/0038489 (publ. Feb. 17, 2011) and U.S. patent application Ser. No. 13/029,582 (filed Feb. 17, 2011).

For both gain-difference-based approaches and phase-difference-based approaches, it may be desirable to implement direction calculators DC10L and DC10R to perform DOA indication over a limited audio-frequency range of the multichannel signal. For example, it may be desirable for such a direction calculator to perform DOA estimation over a mid-frequency range (e.g., from 100, 200, 300, or 500 to 800, 100, 1200, 1500, or 2000 Hz) to avoid problems due to reverberation in low frequencies and/or attenuation of the desired signal in high frequencies.

Figure 19:
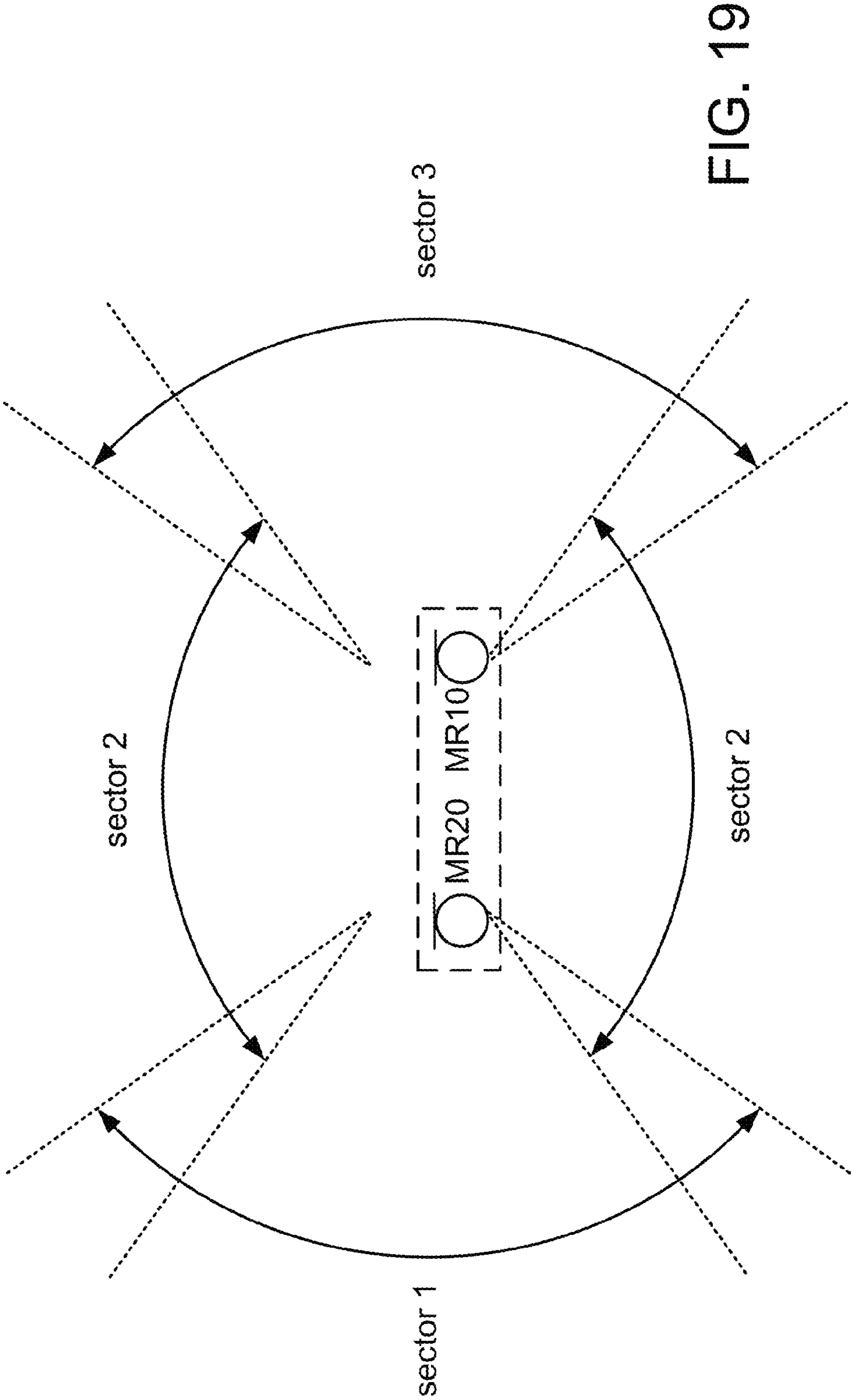
FIG. 19 shows an example of a typical use case of microphone pair MR10, MR20.

An indicator of DOA with respect to a microphone pair is typically ambiguous in sign. For example, the time delay of arrival or phase difference will be the same for a source that is located in front of the microphone pair as for a source that is located behind the microphone pair. FIG. 19 shows an example of a typical use case of microphone pair MR10, MR20 in which the cones of endfire sectors 1 and 3 are symmetric around the array axis, and in which sector 2 occupies the space between those cones. For a case in which the microphones are omnidirectional, therefore, the pickup cones that correspond to the specified ranges of direction may be ambiguous with respect to the front and back of the microphone pair.

Each of direction indication calculators DC10L and DC10R may also be configured to produce a direction indication as described herein for each of a plurality of frequency components (e.g., subbands or frequency bins) of each of a series of frames of the multichannel signal. In one example, apparatus A100 is configured to calculate a gain difference for each of several frequency components (e.g., subbands or FFT bins) of the frame. Such implementations of apparatus A100 may be configured to operate in a transform domain or to include subband filter banks to generate subbands of the input channels in the time domain.

It may be desirable to configure apparatus A100 to operate in a noise reduction mode. In this mode, input signal SI10 is based on at least one of the microphone channels SL10, SL20, SR10, and SR20 and/or on a signal produced by another microphone that is disposed to receive the user's voice. Such operation may be applied to discriminate against far-field noise and focus on a near-field signal from the user's mouth.

For operation in noise reduction mode, input signal SI10 may include a signal produced by another microphone MC10 that is positioned closer to the user's mouth and/or to receive more directly the user's voice (e.g., a boom-mounted or cord-mounted microphone). Microphone MC10 is arranged within apparatus A100 such that during a use of apparatus A100, the SNR of the user's voice in the signal from microphone signal MC30 is greater than the SNR of the user's voice in any of the microphone channels SL10, SL20, SR10, and SR20. Alternatively or additionally, voice microphone MC10 may be arranged during use to be oriented more directly toward the central exit point of the user's voice, to be closer to the central exit point, and/or to lie in a coronal plane that is closer to the central exit point, than either of noise reference microphones ML10 and MR10 is.

Figure 25B:
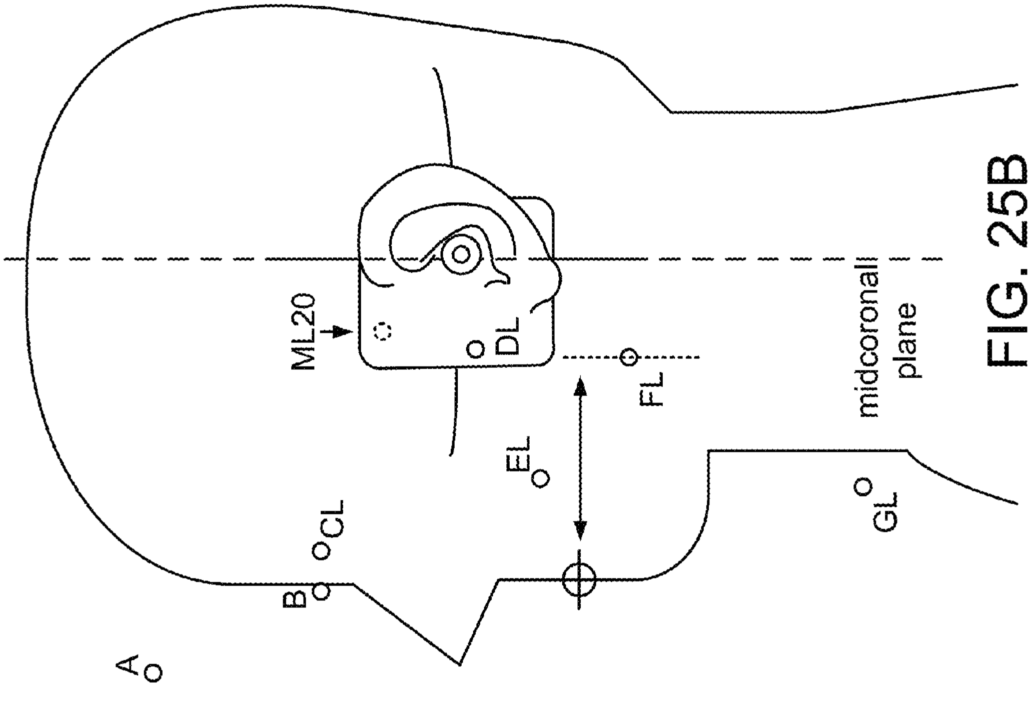
FIGS. 25B and 26A show examples of microphone placements and orientations, respectively, in a left side view of the simulator.
Figure 25A:
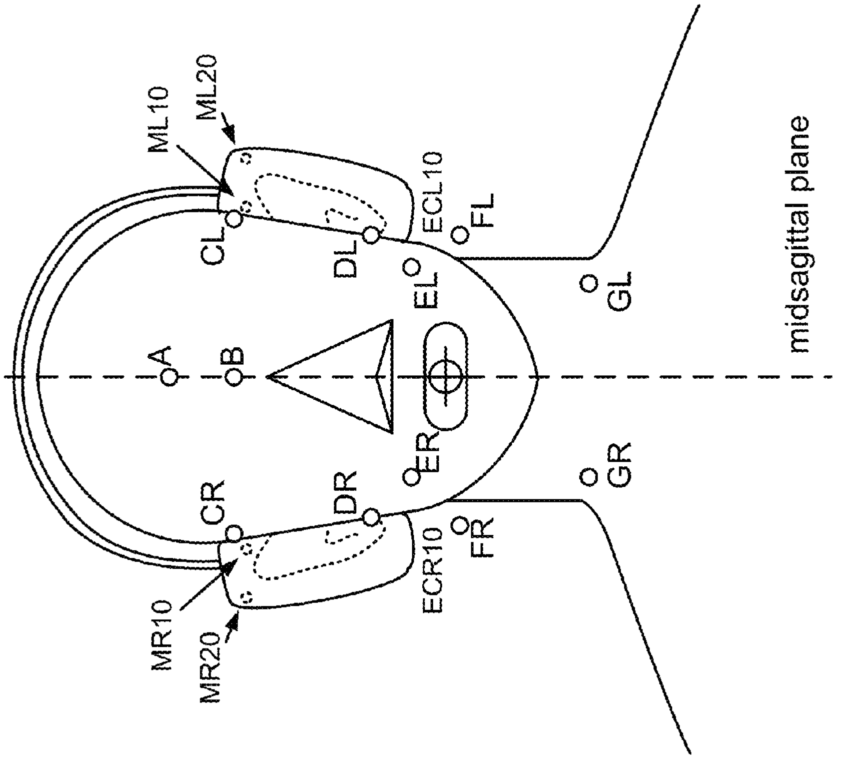
FIG. 25A shows a front view of an implementation of system S100 mounted on a simulator.

FIG. 25A shows a front view of an implementation of system S100 mounted on a Head and Torso Simulator or "HATS" (Bruel and Kjaer, DK). FIG. 25B shows a left side view of the HATS. The central exit point of the user's voice is indicated by the crosshair in FIGS. 25A and 25B and is defined as the location in the midsagittal plane of the user's head at which the external surfaces of the user's upper and lower lips meet during speech. The distance between the midcoronal plane and the central exit point is typically in a range of from seven, eight, or nine to 10, 11, 12, 13, or 14 centimeters (e.g., 80-130 mm). (It is assumed herein that distances between a point and a plane are measured along a line that is orthogonal to the plane.) During use of apparatus A100, voice microphone MC10 is typically located within thirty centimeters of the central exit point.

Several different examples of positions for voice microphone MC10 during a use of apparatus A100 are shown by labeled circles in FIG. 25A. In position A, voice microphone MC10 is mounted in a visor of a cap or helmet. In position B, voice microphone MC10 is mounted in the bridge of a pair of eyeglasses, goggles, safety glasses, or other eyewear. In position CL or CR, voice microphone MC10 is mounted in a left or right temple of a pair of eyeglasses, goggles, safety glasses, or other eyewear. In position DL or DR, voice microphone MC10 is mounted in the forward portion of a headset housing that includes a corresponding one of microphones ML10 and MR10. In position EL or ER, voice microphone MC10 is mounted on a boom that extends toward the user's mouth from a hook worn over the user's ear. In position FL, FR, GL, or GR, voice microphone MC10 is mounted on a cord that electrically connects voice microphone MC10, and a corresponding one of noise reference microphones ML10 and MR10, to the communications device.

The side view of FIG. 25B illustrates that all of the positions A, B, CL, DL, EL, FL, and GL are in coronal planes (i.e., planes parallel to the midcoronal plane as shown) that are closer to the central exit point than microphone ML20 is (e.g., as illustrated with respect to position FL). The side view of FIG. 26A shows an example of the orientation of an instance of microphone MC10 at each of these positions and illustrates that each of the instances at positions A, B, DL, EL, FL, and GL is oriented more directly toward the central exit point than microphone ML10 (which is oriented normal to the plane of the figure).

Figure 24A:
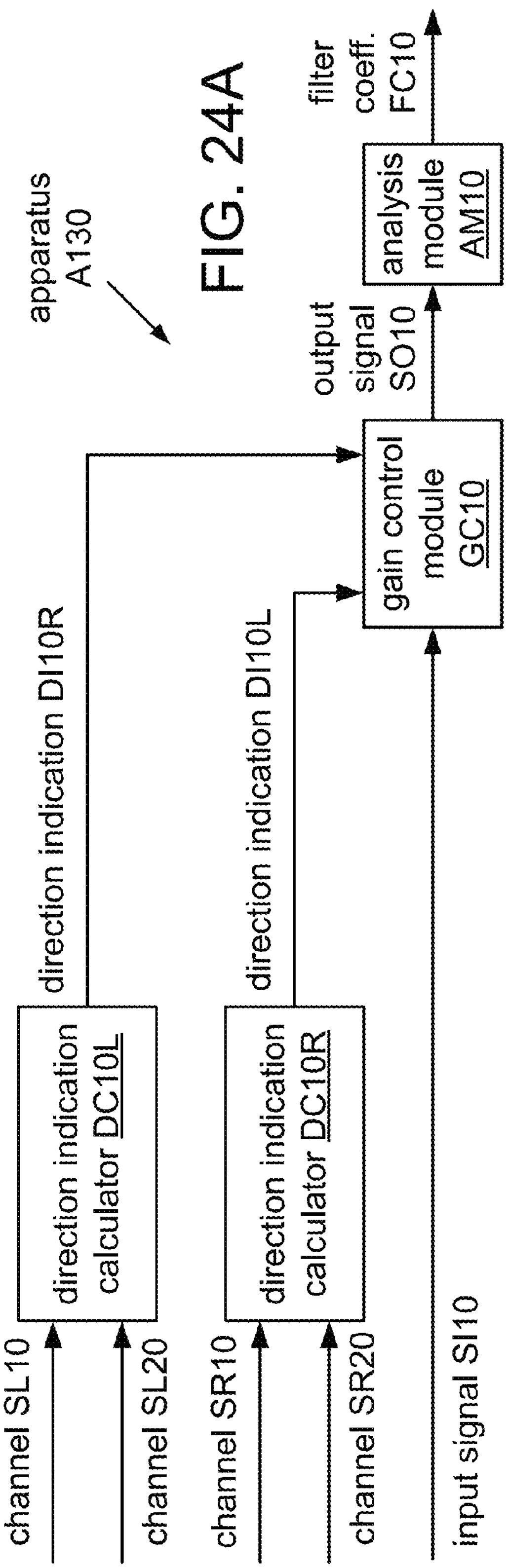
FIG. 24A shows a block diagram of an implementation A130 of apparatus A120.
Figure 24B:
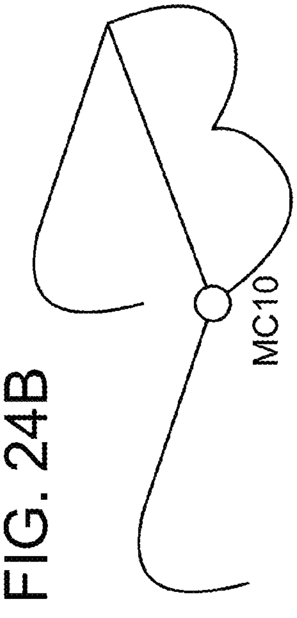
FIGS. 24B-C and 26B-D show additional examples of placements for microphone MC10.
Figure 24C:
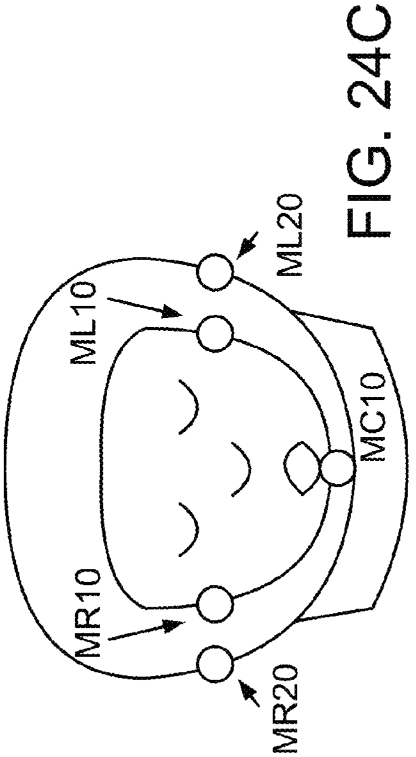
Figure 26B:
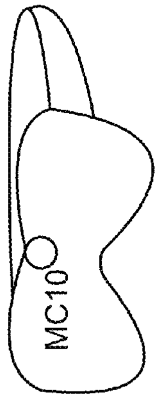
Figure 26C:
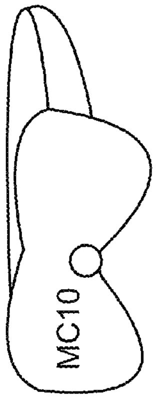
Figure 26D:
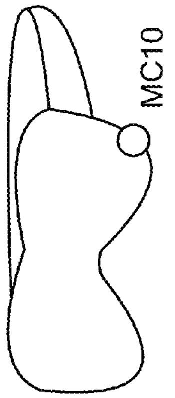
Figure 26A:
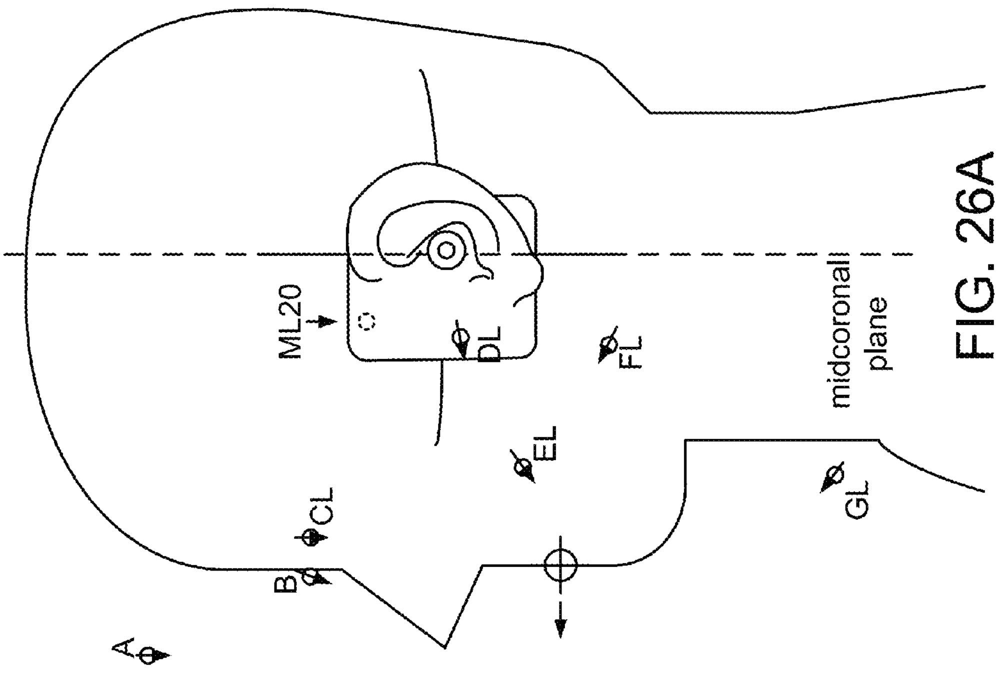

FIGS. 24B-C and 26B-D show additional examples of placements for microphone MC10 that may be used within an implementation of system S100 as described herein. FIG. 24B shows eyeglasses (e.g., prescription glasses, sunglasses, or safety glasses) having voice microphone MC10 mounted on a temple or the corresponding end piece. FIG. 24C shows a helmet in which voice microphone MC10 is mounted at the user's mouth and each microphone of noise reference pair ML10, MR10 is mounted at a corresponding side of the user's head. FIG. 26B-D show examples of goggles (e.g., ski goggles), with each of these examples showing a different corresponding location for voice microphone MC10. Additional examples of placements for voice microphone MC10 during use of an implementation of system S100 as described herein include but are not limited to the following: visor or brim of a cap or hat; lapel, breast pocket, or shoulder.

Figures 20A, 20B, 20C:
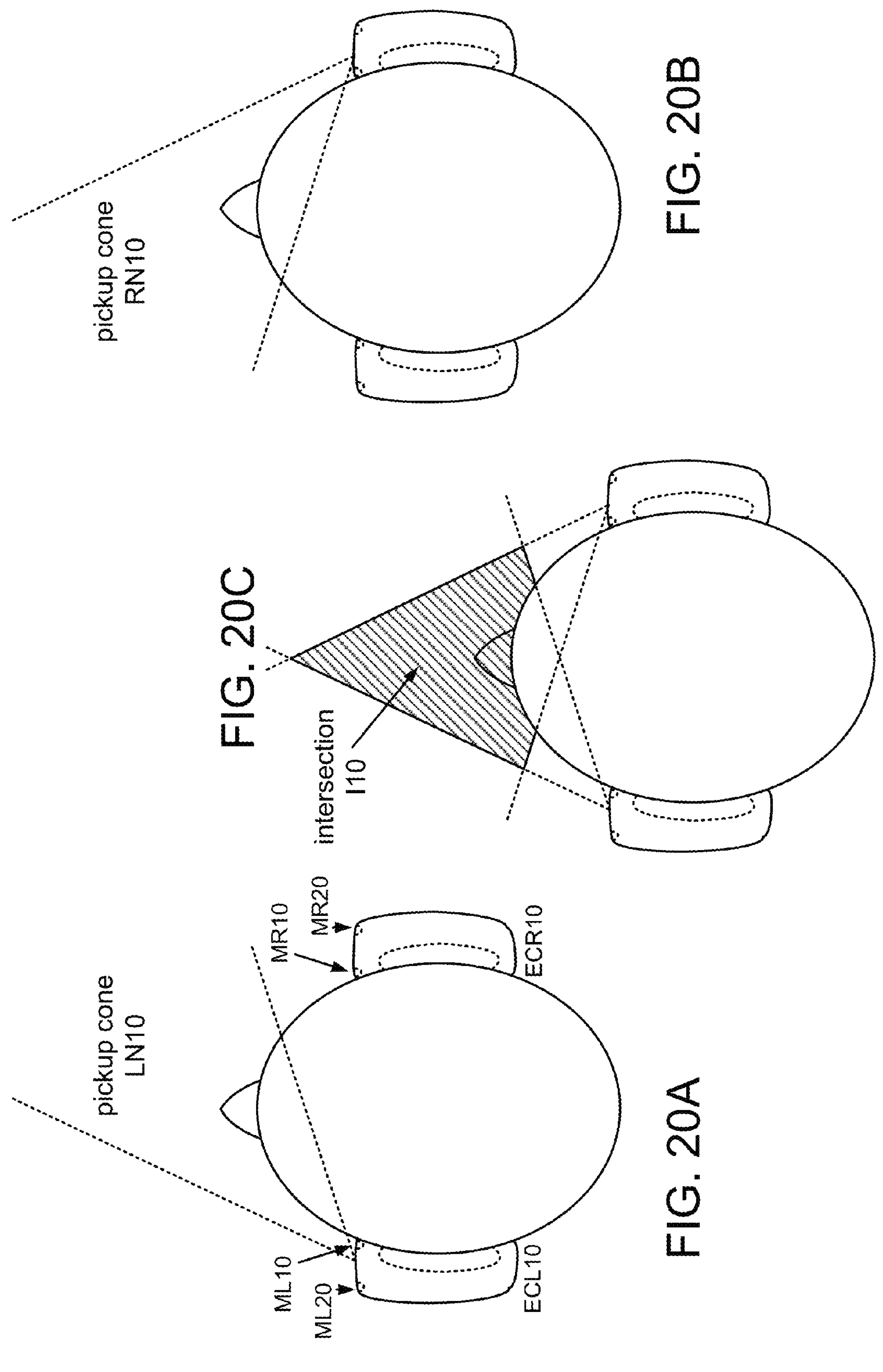
Figures 21A, 21B, 21C:
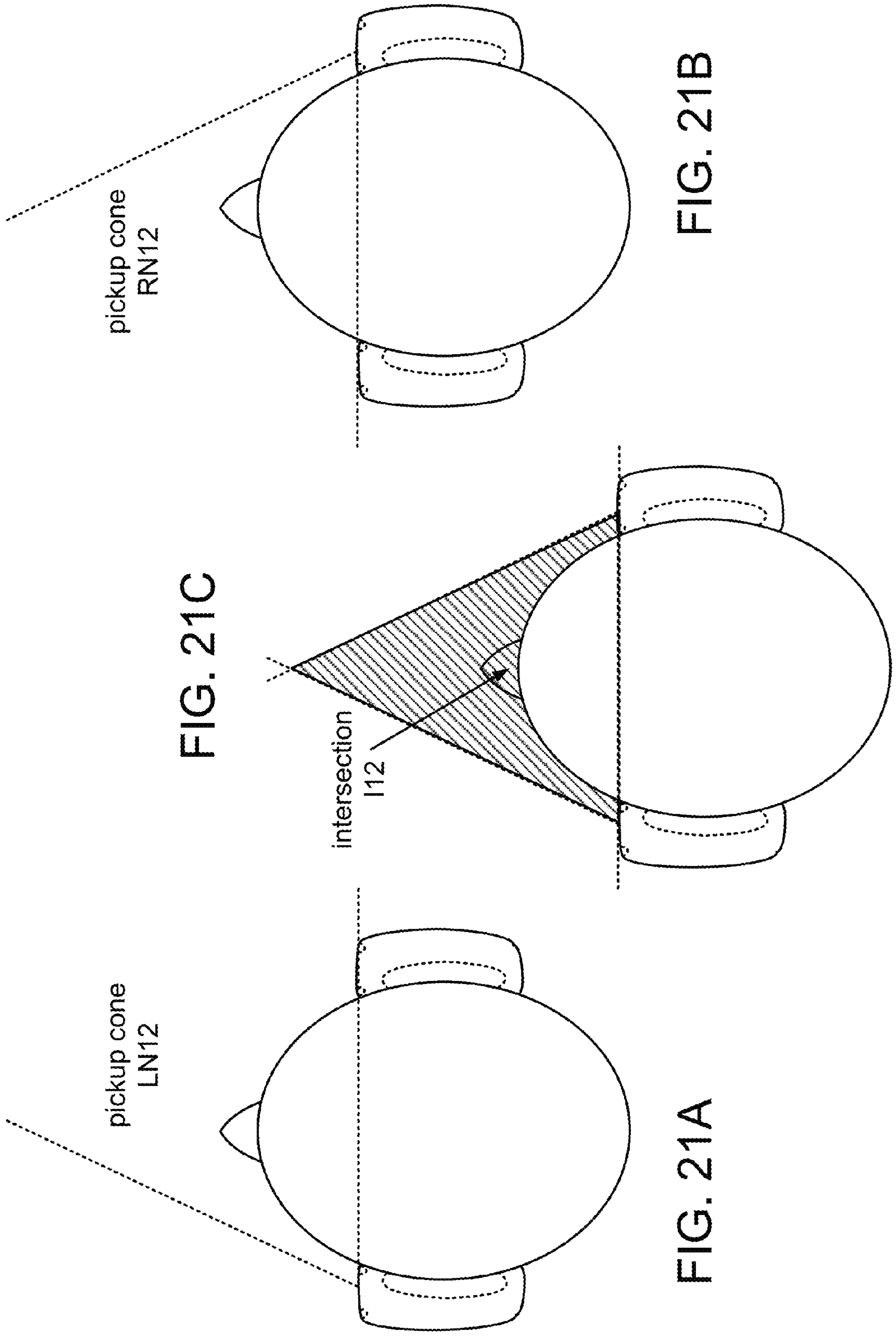

FIGS. 20A-C show top views that illustrate one example of an operation of apparatus A100 in a noise reduction mode. In these examples, each of microphones ML10, ML20, MR10, and MR20 has a response that is unidirectional (e.g., cardioid) and oriented toward a frontal direction of the user. In this mode, gain control module GC10 is configured to pass input signal SI10 if direction indication DI10L indicates that the DOA for the frame is within a forward pickup cone LN10 and direction indication DI10R indicates that the DOA for the frame is within a forward pickup cone RN10. In this case, the source is assumed to be located in the intersection 110 of these cones, such that voice activity is indicated. Otherwise, if direction indication DI10L indicates that the DOA for the frame is not within cone LN10, or direction indication DI10R indicates that the DOA for the frame is not within cone RN10, then the source is assumed to be outside of intersection 110 (e.g., indicating a lack of voice activity), and gain control module GC10 is configured to attenuate input signal SI10 in such case. FIGS. 21A-C show top views that illustrate a similar example in which direction indications DI10L and DI10R indicate whether the source is located in the intersection 112 of endfire pickup cones LN12 and RN12.

For operation in a noise reduction mode, it may be desirable to configure the pickup cones such that apparatus A100 may distinguish the user's voice from sound from a source that is located at least a threshold distance (e.g., at least 25, 30, 50, 75, or 100 centimeters) from the central exit point of the user's voice. For example, it may be desirable to select the pickup cones such that their intersection extends no farther along the midsagittal plane than the threshold distance from the central exit point of the user's voice.

Figures 22A, 22B, 22C:
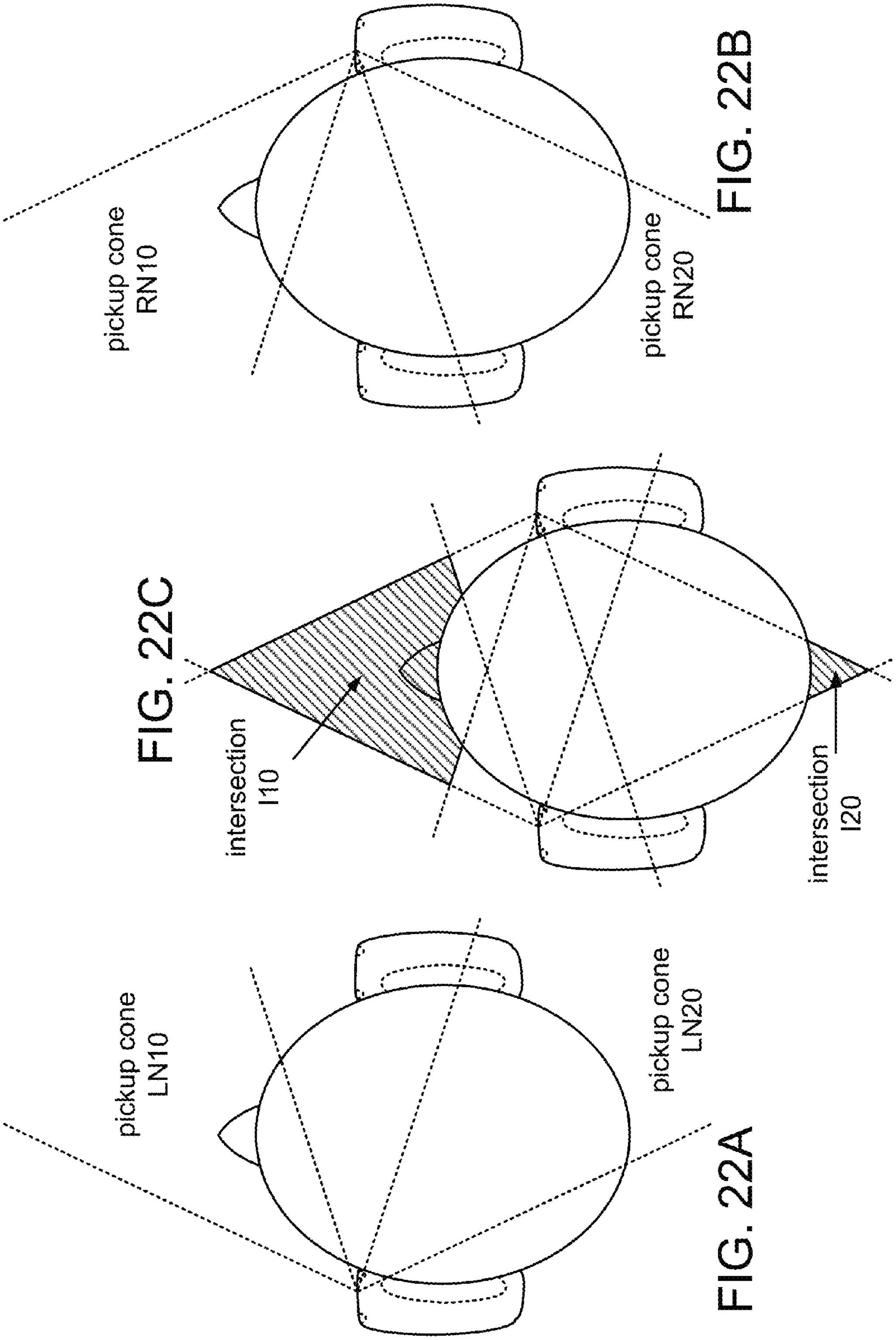
FIGS. 22A-22C show top views that illustrate principles of operation of the system in a noise reduction mode.
Figures 23A, 23B, 23C:
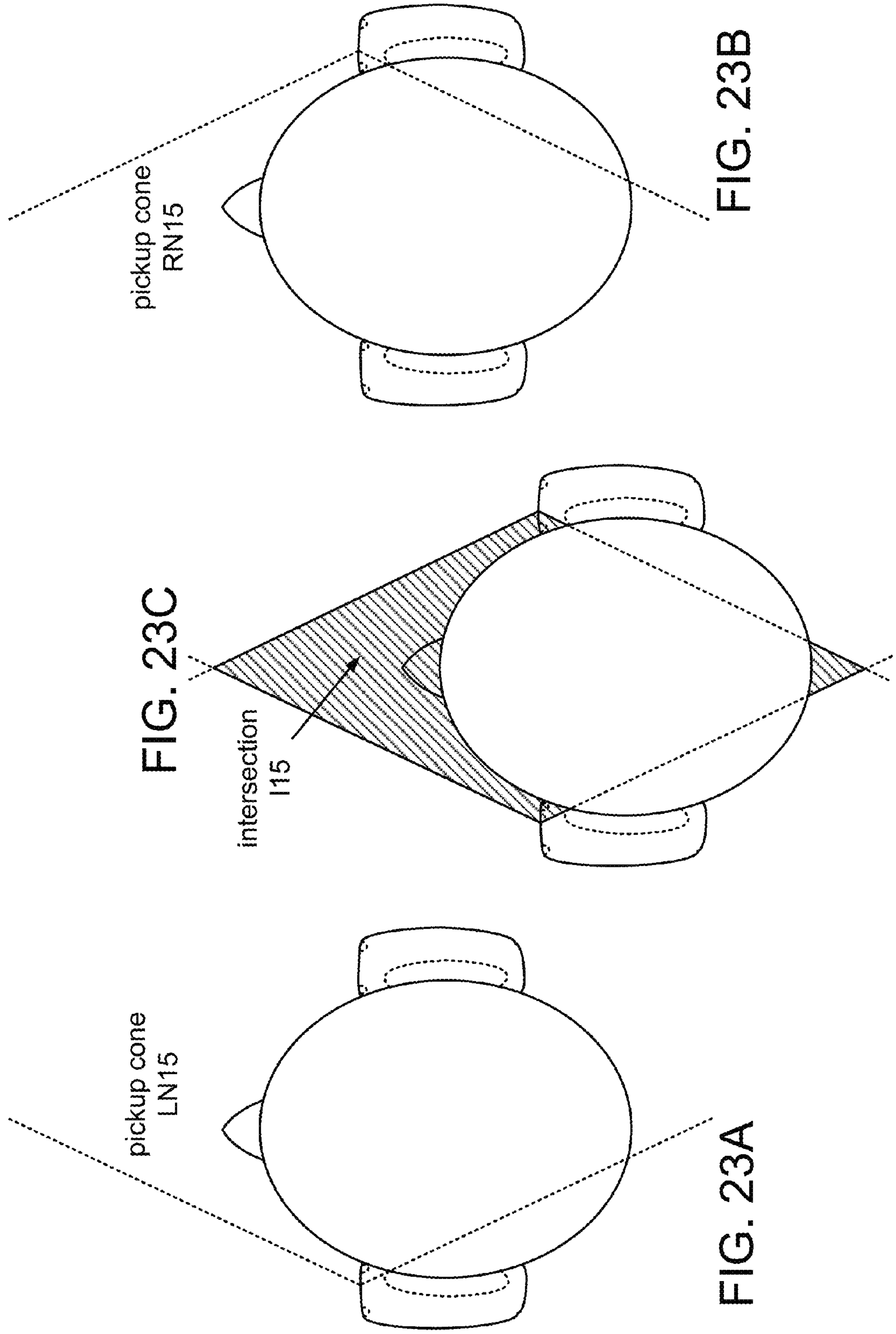
FIGS. 23A-23C show top views that illustrate principles of operation of the system in a noise reduction mode.

FIGS. 22A-C show top views that illustrate a similar example in which each of microphones ML10, ML20, MR10, and MR20 has a response that is omnidirectional. In this example, gain control module GC10 is configured to pass input signal SI10 if direction indication DI10L indicates that the DOA for the frame is within forward pickup cone LN10 or a rearward pickup cone LN20, and direction indication DI10R indicates that the DOA for the frame is within forward pickup cone RN10 or a rearward pickup cone RN20. In this case, the source is assumed to be located in the intersection 120 of these cones, such that voice activity is indicated. Otherwise, if direction indication DI10L indicates that the DOA for the frame is not within either of cones LN10 and LN20, or direction indication DI10R indicates that the DOA for the frame is not within either of cones RN10 and RN20, then the source is assumed to be outside of intersection 120 (e.g., indicating a lack of voice activity), and gain control module GC10 is configured to attenuate input signal SI10 in such case. FIGS. 23A-C show top views that illustrate a similar example in which direction indications DI10L and DI10R indicate whether the source is located in the intersection 115 of endfire pickup cones LN15 and RN15.

As discussed above, each of direction indication calculators DC10L and DC10R may be implemented to identify a spatial sector that includes the direction of arrival (e.g., as described herein with reference to FIGS. 10A, 10B, 15A, 15B, and 19). In such cases, each of calculators DC10L and DC10R may be implemented to produce the corresponding direction indication by mapping the sector indication to a value that indicates whether the sector is within the corresponding pickup cone (e.g., a value of zero or one). For a scheme as shown in FIG. 10B, for example, direction indication calculator DC10R may be implemented to produce direction indication DI10R by mapping an indication of sector 5 to a value of one for direction indication DI10R, and to map an indication of any other sector to a value of zero for direction indication DI10R.

Alternatively, as discussed above, each of direction indication calculators DC10L and DC10R may be implemented to calculate a value (e.g., an angle relative to the microphone axis, a time difference of arrival, or a ratio of phase difference and frequency) that indicates an estimated direction of arrival. In such cases, each of calculators DC10L and DC10R may be implemented to produce the corresponding direction indication by applying, to the calculated DOA value, a respective mapping to a value of the corresponding direction indication DI10L or DI10R (e.g., a value of zero or one) that indicates whether the corresponding DOA is within the corresponding pickup cone. Such a mapping may be implemented, for example, as one or more threshold values (e.g., mapping values that indicate DOAs less than a threshold value to a direction indication of one, and values that indicate DOAs greater than the threshold value to a direction indication of zero, or vice versa).

It may be desirable to implement a hangover or other temporal smoothing operation on the gain factor calculated by gain control element GC10 (e.g., to avoid jitter in output signal SO10 for a source that is close to the intersection boundary). For example, gain control element GC10 may be configured to refrain from changing the state of the gain factor until the new state has been indicated for a threshold number (e.g., five, ten, or twenty) of consecutive frames.

Gain control module GC10 may be implemented to perform binary control (i.e., gating) of input signal SI10, according to whether the direction indications indicate that the source is within an intersection defined by the pickup cones, to produce output signal SO10. In such case, the gain factor may be considered as a voice activity detection signal that causes gain control element GC10 to pass or attenuate input signal SI10 accordingly. Alternatively, gain control module GC10 may implemented to produce output signal SO10 by applying a gain factor to input signal SI10 that has more than two possible values. For example, calculators DC10L and DC10R may be configured to produce the direction indications DI10L and DI10R according to a mapping of sector number to pickup cone that indicates a first value (e.g., one) if the sector is within the pickup cone, a second value (e.g., zero) if the sector is outside of the pickup cone, and a third, intermediate value (e.g., one-half) if the sector is partially within the pickup cone (e.g., sector 4 in FIG. 10B). A mapping of estimated DOA value to pickup cone may be similarly implemented, and it will be understood that such mappings may be implemented to have an arbitrary number of intermediate values. In these cases, gain control module GC10 may be implemented to calculate the gain factor by combining (e.g., adding or multiplying) the direction indications. The allowable range of gain factor values may be expressed in linear terms (e.g., from 0 to 1) or in logarithmic terms (e.g., from −20 to 0 dB). For non-binary-valued cases, a temporal smoothing operation on the gain factor may be implemented, for example, as a finite- or infinite-impulse-response (FIR or IIR) filter.

As noted above, each of the direction indication calculators DC10L and DC10R may be implemented to produce a corresponding direction indication for each subband of a frame.

In such cases, gain control module GC10 may be implemented to combine the subband-level direction indications from each direction indication calculator to obtain a corresponding frame-level direction indication (e.g., as a sum, average, or weighted average of the subband direction indications from that direction calculator). Alternatively, gain control module GC10 may be implemented to perform multiple instances of a combination as described herein to produce a corresponding gain factor for each subband. In such case, gain control element GC10 may be similarly implemented to combine (e.g., to add or multiply) the subband-level source location decisions to obtain a corresponding frame-level gain factor value, or to map each subband-level source location decision to a corresponding subband-level gain factor value. Gain control element GC10 may be configured to apply gain factors to corresponding subbands of input signal SI10 in the time domain (e.g., using a subband filter bank) or in the frequency domain.

It may be desirable to encode audio-frequency information from output signal SO10 (for example, for transmission via a wireless communications link). FIG. 24A shows a block diagram of an implementation A130 of apparatus A110 that includes an analysis module AM10. Analysis module AM10 is configured to perform a linear prediction coding (LPC) analysis operation on output signal SO10 (or an audio signal based on SO10) to produce a set of LPC filter coefficients that describe a spectral envelope of the frame. Apparatus A130 may be configured in such case to encode the audio-frequency information into frames that are compliant with one or more of the various codecs mentioned herein (e.g., EVRC, SMV, AMR-WB). Apparatus A120 may be similarly implemented.

Figure 27:
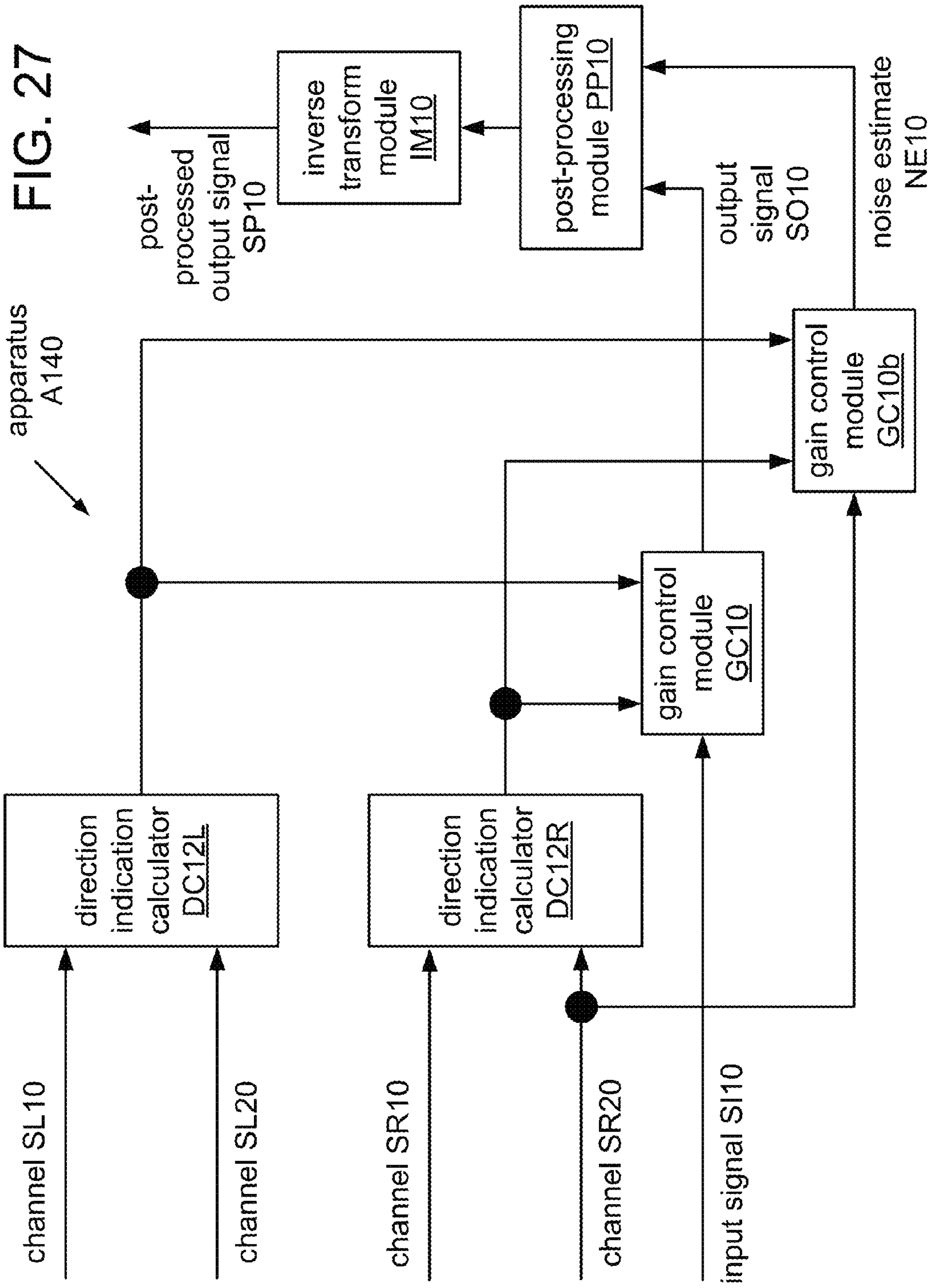
FIG. 27 shows a block diagram of an implementation A140 of apparatus A110.

It may be desirable to implement apparatus A100 to include post-processing of output signal SO10 (e.g., for noise reduction). FIG. 27 shows a block diagram of an implementation A140 of apparatus A120 that is configured to produce a post-processed output signal SP10 (not shown are transform modules XM10L, 20L, 10R, 20R, and a corresponding module to convert input signal SI10 into the transform domain). Apparatus A140 includes a second instance GC10*b* of gain control element GC10 that is configured to apply the direction indications to produce a noise estimate NE10 by blocking frames of channel SR20 (and/or channel SL20) that arrive from within the pickup-cone intersection and passing frames that arrive from directions outside of the pickup-cone intersection. Apparatus A140 also includes a post-processing module PP10 that is configured to perform post-processing of output signal SO10 (e.g., an estimate of the desired speech signal), based on information from noise estimate NE10, to produce a post-processed output signal SP10. Such post-processing may include Wiener filtering of output signal SO10 or spectral subtraction of noise estimate NE10 from output signal SO10. As shown in FIG. 27, apparatus A140 may be configured to perform the post-processing operation in the frequency domain and to convert the resulting signal to the time domain via an inverse transform module IM10 to obtain post-processed output signal SP10.

In addition to, or in the alternative to, a noise reduction mode as described above, apparatus A100 may be implemented to operate in a hearing-aid mode. In a hearing-aid mode, system S100 may be used to perform feedback control and far-field beamforming by suppressing the near-field region, which may include the signal from the user's mouth and interfering sound signals, while simultaneously focusing on far-field directions. A hearing-aid mode may be implemented using unidirectional and/or omnidirectional microphones.

For operation in a hearing-aid mode, system S100 may be implemented to include one or more loudspeakers LS10 configured to reproduce output signal SO10 at one or both of the user's ears. System S100 may be implemented such that apparatus A100 is coupled to one or more such loudspeakers LS10 via wires or other conductive paths. Alternatively or additionally, system S100 may be implemented such that apparatus A100 is coupled wirelessly to one or more such loudspeakers LS10.

Figure 28:
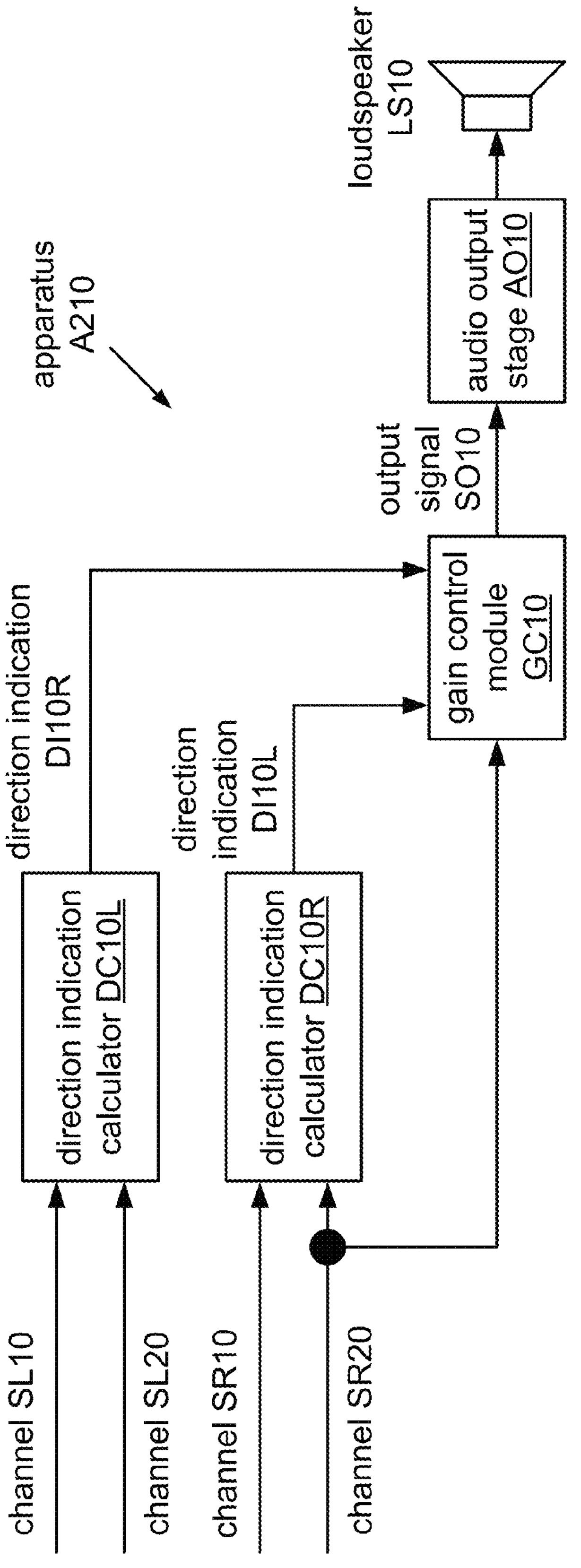
FIG. 28 shows a block diagram of an implementation A210 of apparatus A110.

FIG. 28 shows a block diagram of an implementation A210 of apparatus A110 for hearing-aid mode operation. In this mode, gain control module GC10 is configured to attenuate frames of channel SR20 (and/or channel SL20) that arrive from the pickup-cone intersection. Apparatus A210 also includes an audio output stage AO10 that is configured to drive a loudspeaker LS10, which may be worn at an ear of the user and is directed at a corresponding eardrum of the user, to produce an acoustic signal that is based on output signal SO10.

Figure 29C:
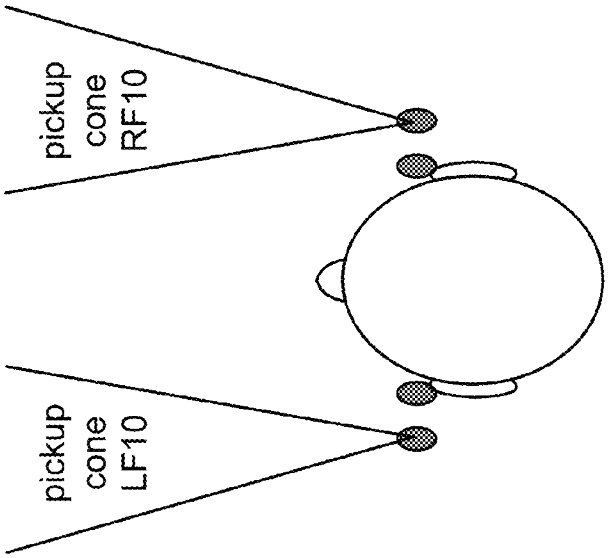
FIGS. 29A-C show top views that illustrate principles of operation of the system in a hearing-aid mode.
Figure 29B:
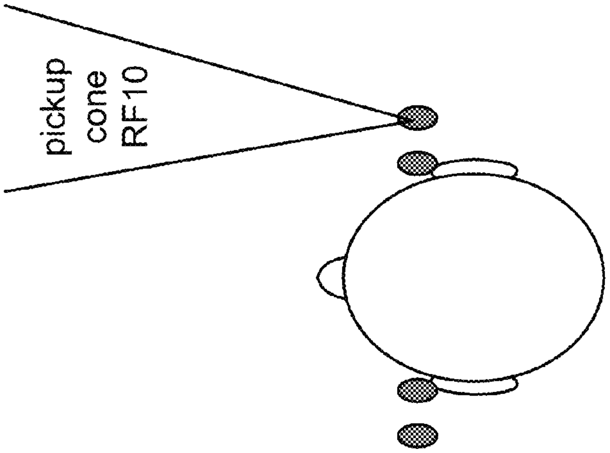
Figure 29A:
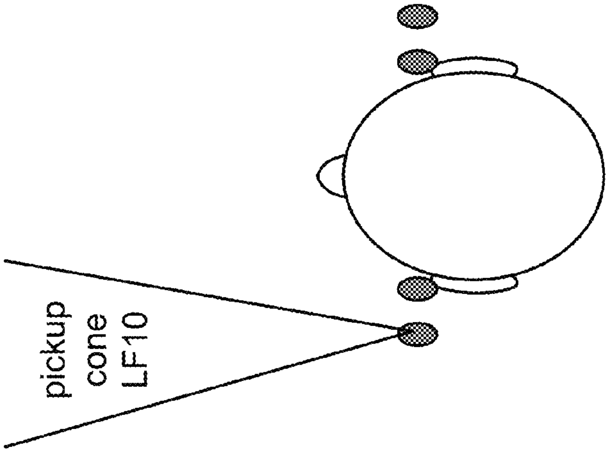

FIGS. 29A-C show top views that illustrate principles of operation of an implementation of apparatus A210 in a hearing-aid mode. In these examples, each of microphones ML10, ML20, MR10, and MR20 is unidirectional and oriented toward a frontal direction of the user. In such an implementation, direction calculator DC10L is configured to indicate whether the DOA of a sound component of the signal received by array R100L falls within a first specified range (the spatial area indicated in FIG. 29A as pickup cone LF10), and direction calculator DC10R is configured to indicate whether the DOA of a sound component of the signal received by array R100R falls within a second specified range (the spatial area indicated in FIG. 29B as pickup cone RF10).

In one example, gain control element GC10 is configured to pass acoustic information received from a direction within either of pickup cones LF10 and RF10 as output signal OS10 (e.g., an "OR" case). In another example, gain control element GC10 is configured to pass acoustic information received by at least one of the microphones as output signal OS10 only if direction indicator DI10L indicates a direction of arrival within pickup cone LF10 and direction indicator DI10R indicates a direction of arrival within pickup cone RF10 (e.g., an "AND" case).

Figure 30A:
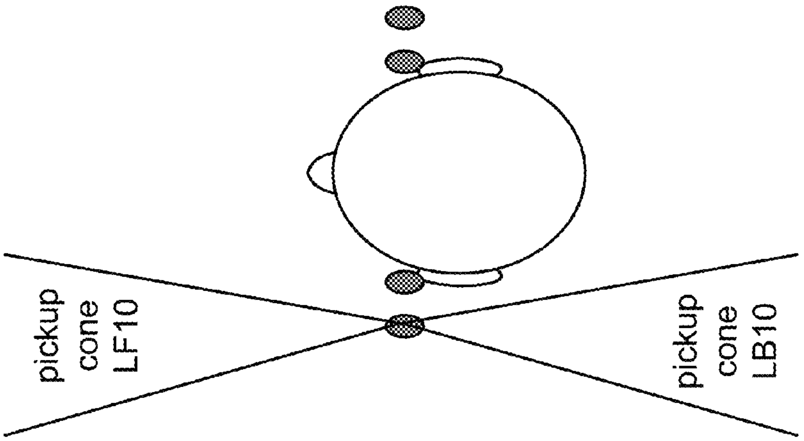
FIGS. 30A-C show top views that illustrate principles of operation of the system in a hearing-aid mode.
Figure 30B:
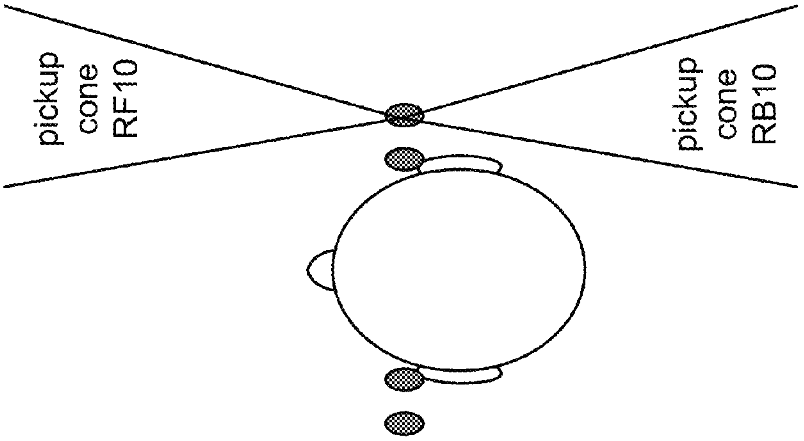
Figure 30C:
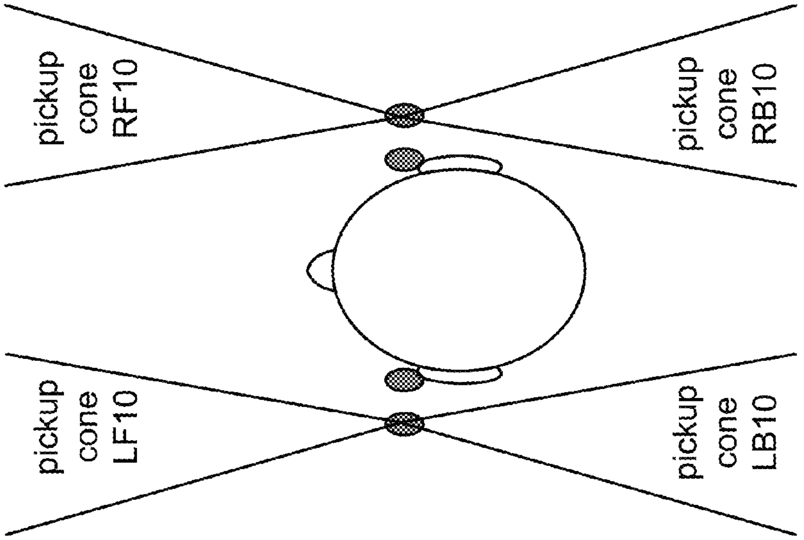
Figures 31A, 31B, 31C:
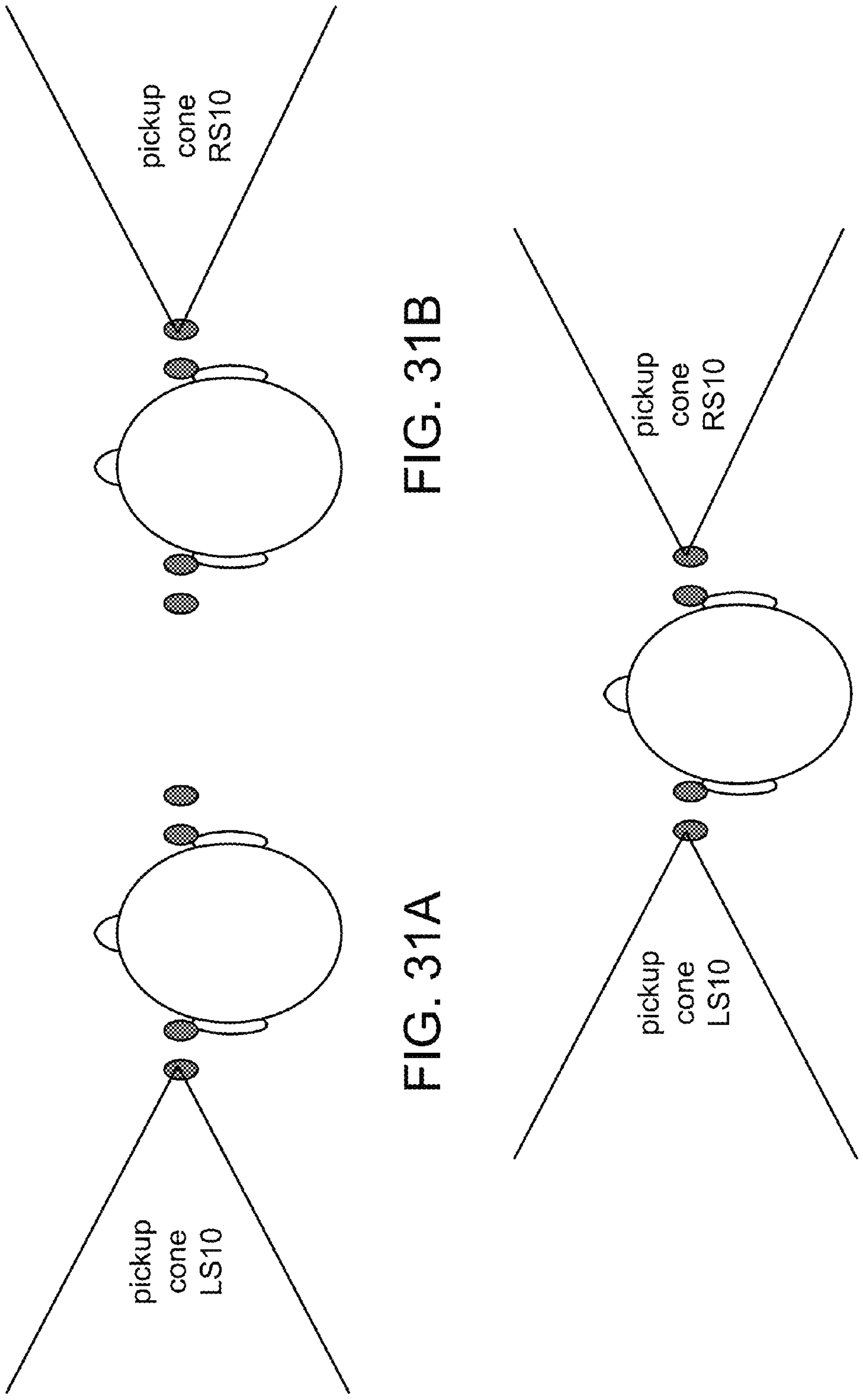
FIGS. 31A-C show top views that illustrate principles of operation of the system in a hearing-aid mode.

FIGS. 30A-C show top views that illustrate principles of operation of the system in a hearing-aid mode for an analogous case in which the microphones are omnidirectional. The system may also be configured to allow the user to manually select among different look directions in the hearing-aid mode while maintaining suppression of the near-field signal from the user's mouth. For example, FIGS. 31A-C show top views that illustrate principles of operation of the system in a hearing-aid mode, with omnidirectional microphones, in which sideways look directions are used instead of the front-back directions shown in FIGS. 30A-C.

For a hearing-aid mode, apparatus A100 may be configured for independent operation on each microphone array. For example, operation of apparatus A100 in a hearing-aid mode may be configured such that selection of signals from an outward endfire direction is independent on each side. Alternatively, operation of apparatus A100 in a hearing-aid mode may be configured to attenuate distributed noise (for example, by blocking sound components that are found in both multichannel signals and/or passing directional sound components that are present within a selected directional range of only one of the multichannel signals).

Figure 32:
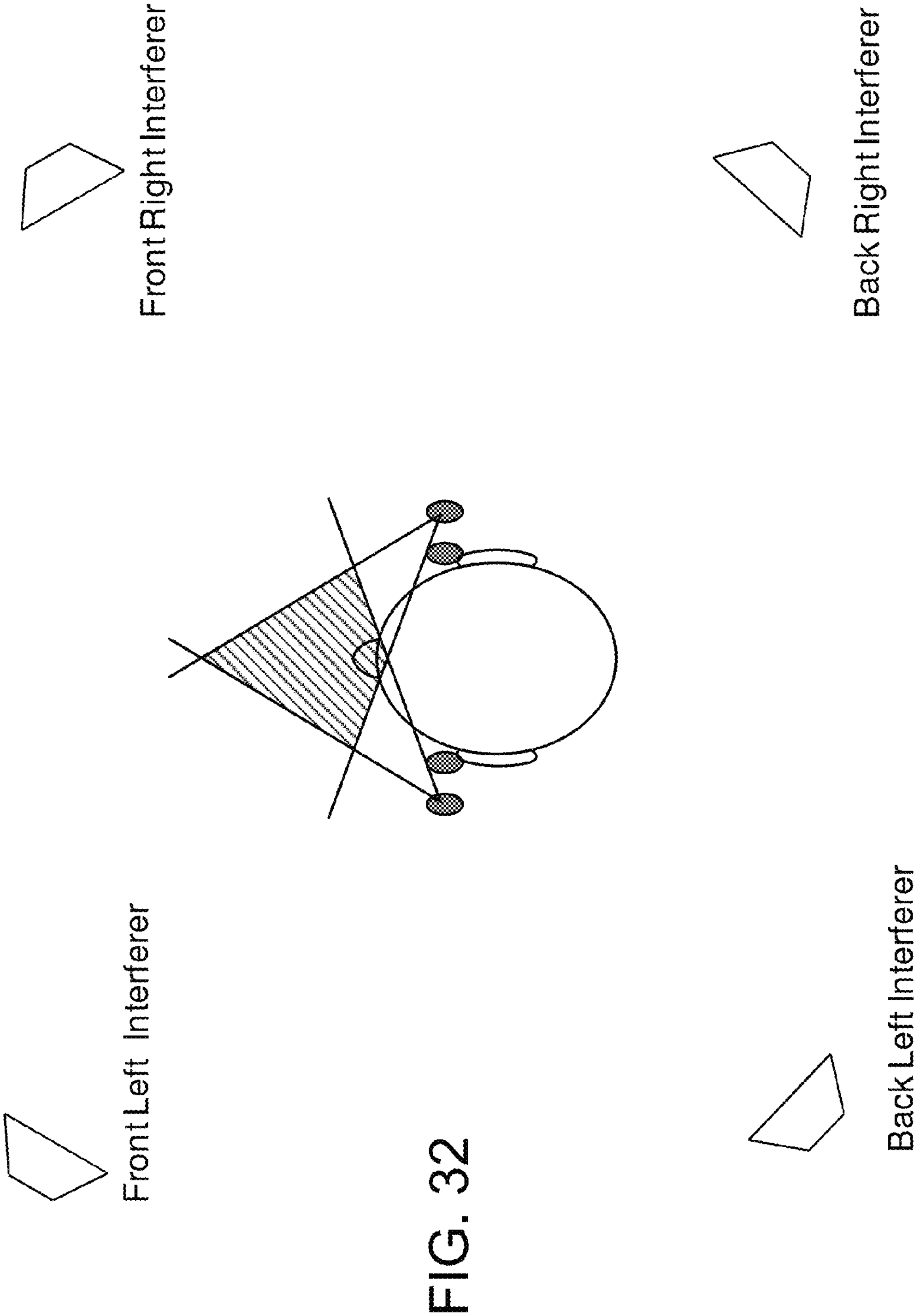
FIG. 32 shows an example of a testing arrangement.
Figure 33:
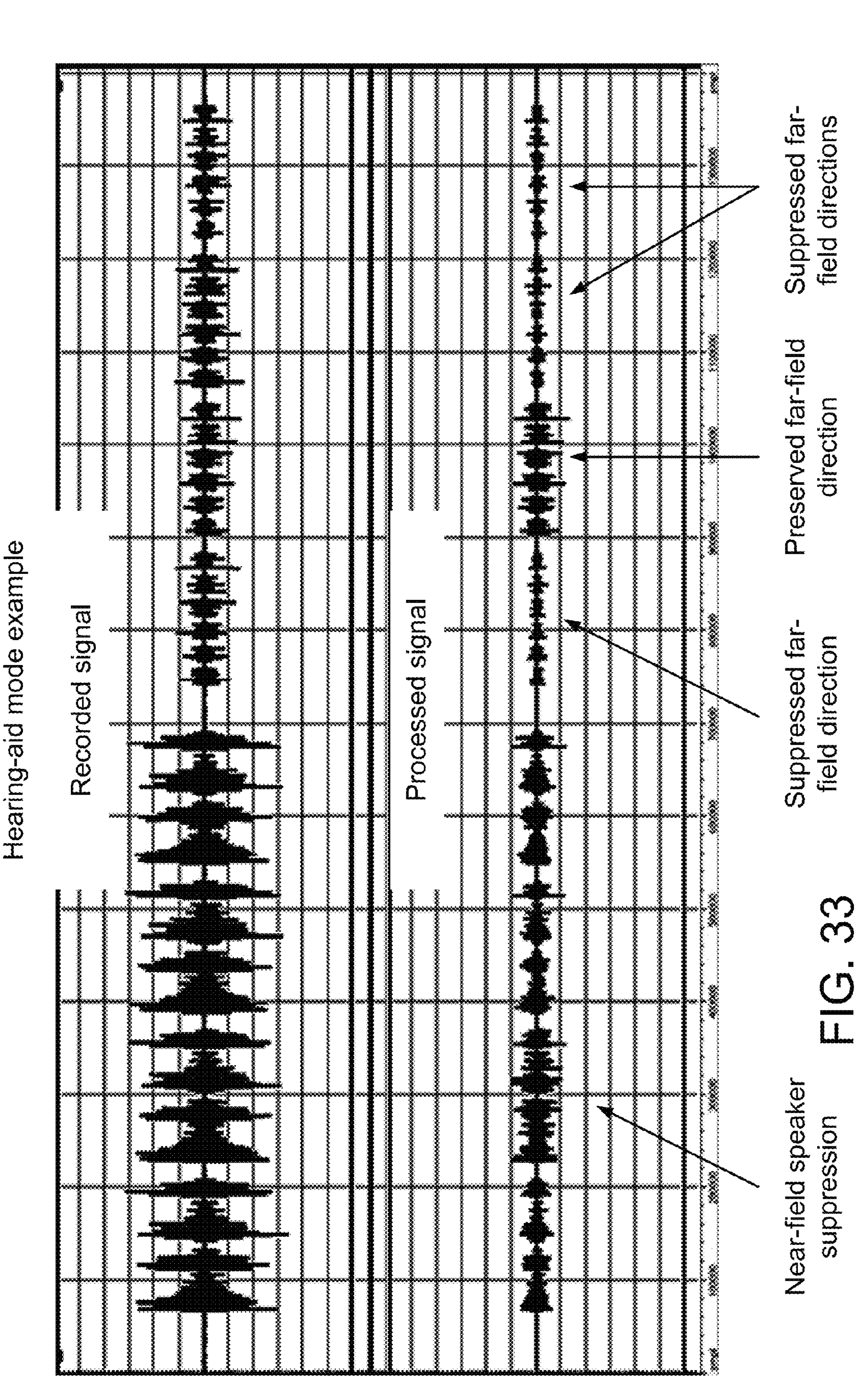
FIG. 33 shows a result of such a test in a hearing-aid mode.

FIG. 32 shows an example of a testing arrangement in which an implementation of apparatus A100 is placed on a Head and Torso Simulator (HATS), which outputs a near-field simulated speech signal from a mouth loudspeaker while surrounding loudspeakers output interfering far-field signals. FIG. 33 shows a result of such a test in a hearing-aid mode. Comparison of the signal as recorded by at least one of the microphones with the processed signal (i.e., output signal OS10) shows that the far-field signal arriving from a desired direction has been preserved, while the near-field signal and far-field signals from other directions have been suppressed.

Figure 34:
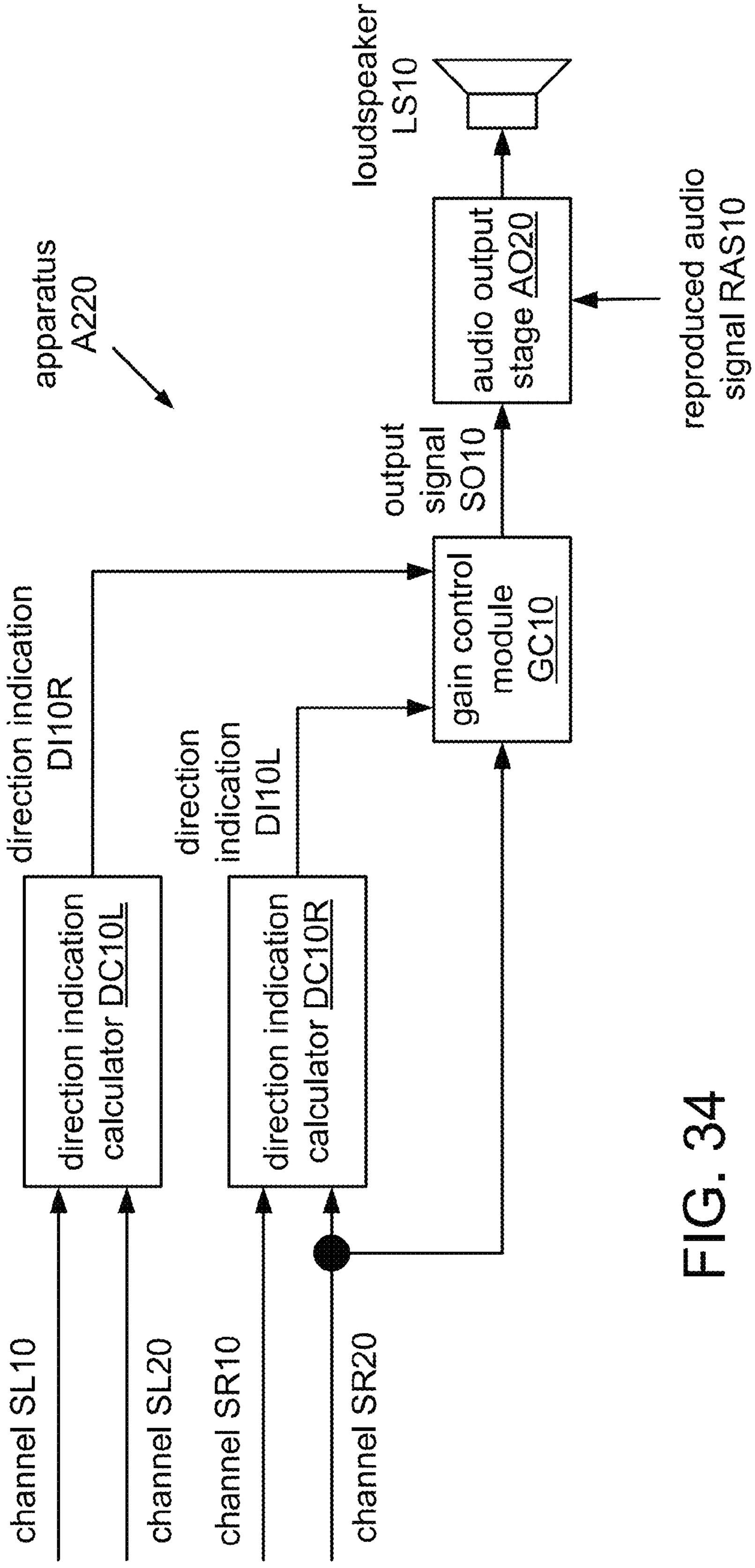
FIG. 34 shows a block diagram of an implementation A220 of apparatus A210.

It may be desirable to implement system S100 to combine a hearing-aid mode implementation of apparatus A100 with playback of a reproduced audio signal, such as a far-end communications signal or other compressed audio or audio-visual information, such as a file or stream encoded according to a standard compression format (e.g., Moving Pictures Experts Group (MPEG)-1 Audio Layer 3 (MP3), MPEG-4 Part 14 (MP4), a version of Windows Media Audio/Video (WMA/WMV) (Microsoft Corp., Redmond, Wash.), Advanced Audio Coding (AAC), International Telecommunication Union (ITU)-T H.264, or the like). FIG. 34 shows a block diagram of an implementation A220 of apparatus A210 that includes an implementation A020 of audio output stage AO10, which is configured to mix output signal SO10 with such a reproduced audio signal RAS10 and to drive loudspeaker LS10 with the mixed signal.

Figure 35:
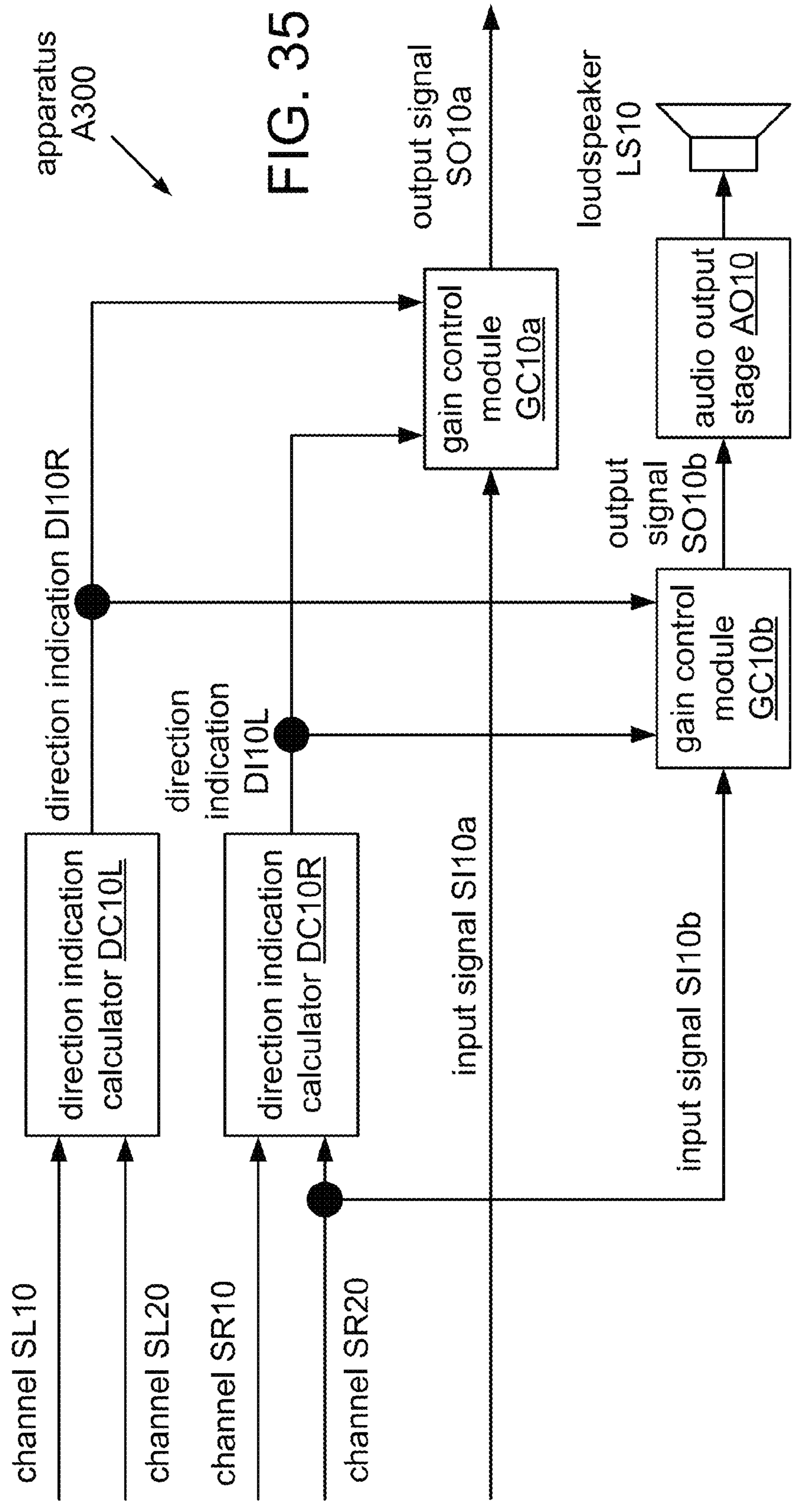
FIG. 35 shows a block diagram of an implementation A300 of apparatus A110 and A210.

It may be desirable to implement system S100 to support operation of apparatus A100 in either or both of a noise-reduction mode and a hearing-aid mode as described herein. FIG. 35 shows a block diagram of such an implementation A300 of apparatus A110 and A210. Apparatus A300 includes a first instance GC10*a* of gain control module GC10 that is configured to operate on a first input signal SI10*a* in a noise-reduction mode to produce a first output signal SO10*a*, and a second instance GC10*b* of gain control module GC10 that is configured to operate on a second input signal SI10*b* in a hearing-aid mode to produce a second output signal SO10*b*. Apparatus A300 may also be implemented to include the features of apparatus A120, A130, and/or A140, and/or the features of apparatus A220 as described herein.

Figure 36A:
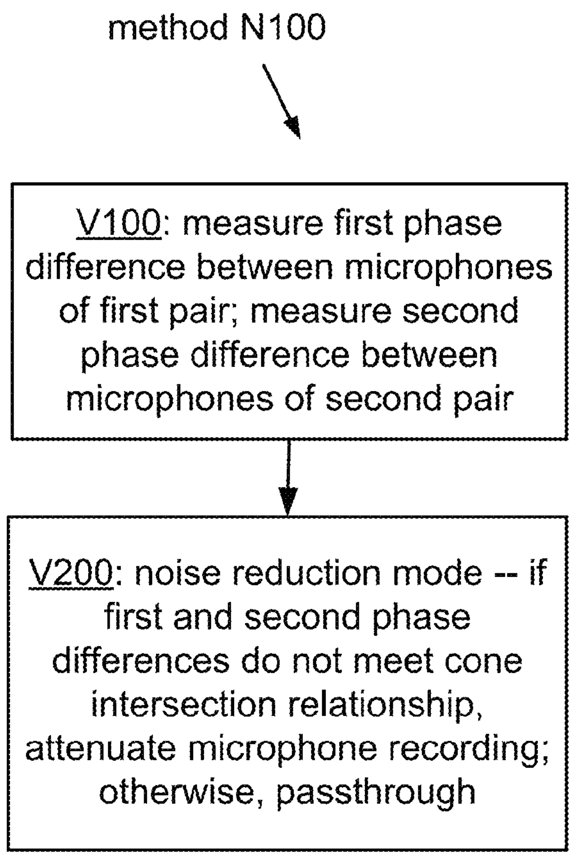
FIG. 36A shows a flowchart of a method N100 according to a general configuration.

FIG. 36A shows a flowchart of a method N100 according to a general configuration that includes tasks V100 and V200. Task V100 measures at least one phase difference between the channels of a signal received by a first microphone pair and at least one phase difference between the channels of a signal received by a second microphone pair. Task V200 performs a noise reduction mode by attenuating a received signal if the phase differences do not satisfy a desired cone intersection relationship, and passing the received signal otherwise.

Figure 36B:
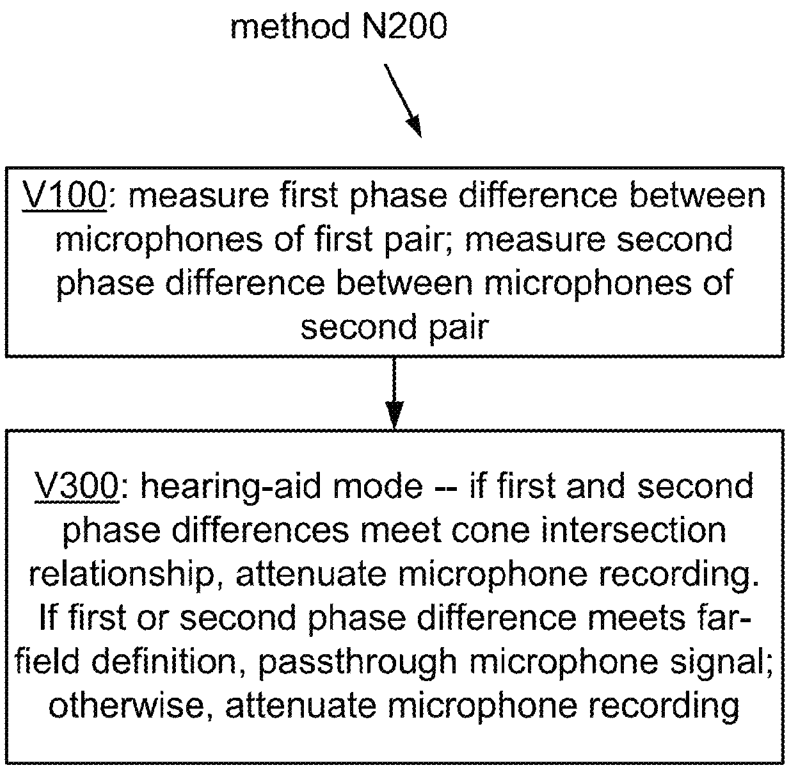
FIG. 36B shows a flowchart of a method N200 according to a general configuration.

FIG. 36B shows a flowchart of a method N200 according to a general configuration that includes tasks V100 and V300. Task V300 performs a hearing-aid mode by attenuating a received signal if the phase differences satisfy a desired cone intersection relationship, passing the received signal if either phase difference satisfies a far-field definition, and attenuating the received signal otherwise.

Figure 37:
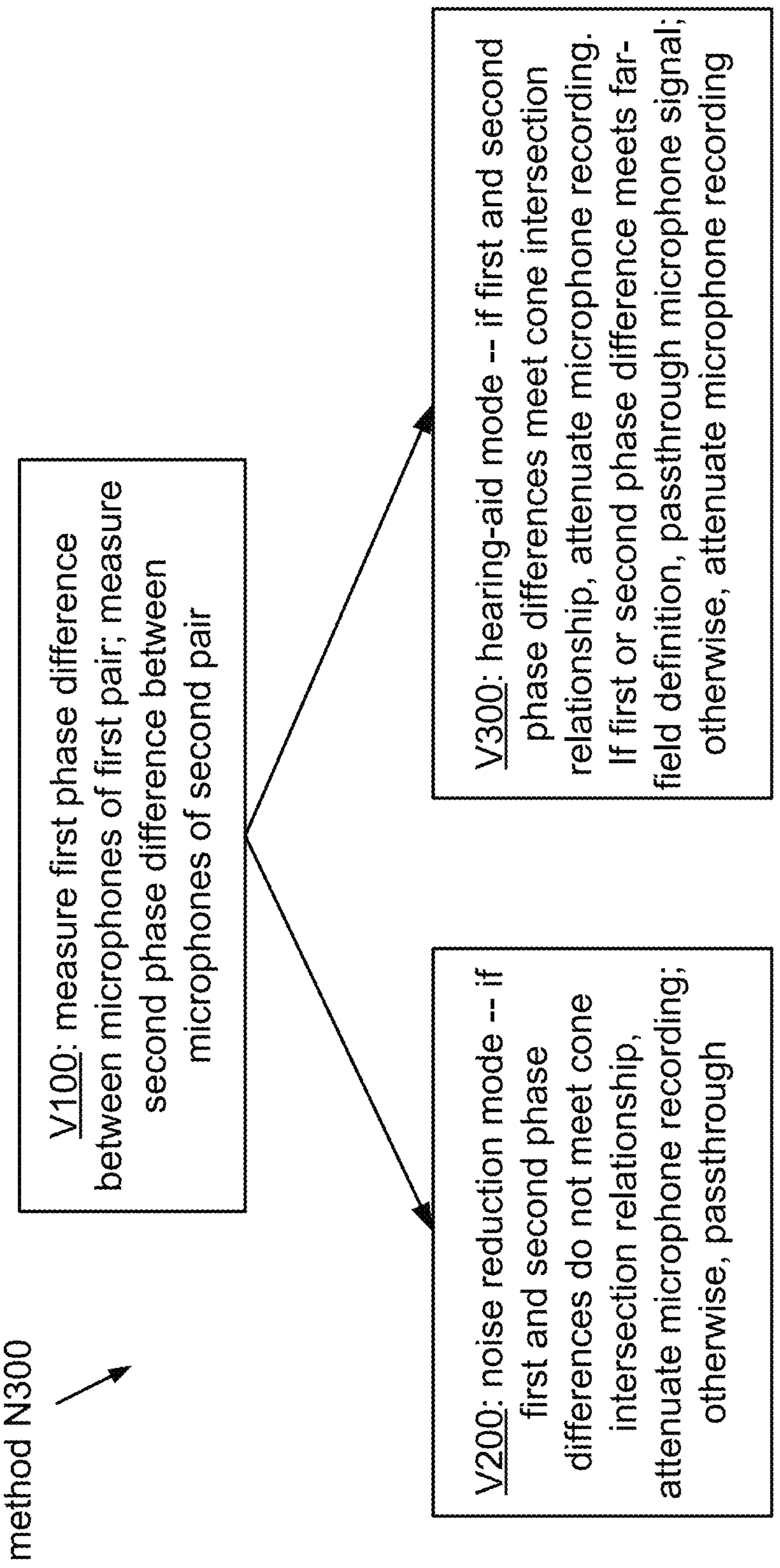
FIG. 37 shows a flowchart of a method N300 according to a general configuration.

FIG. 37 shows a flowchart of a method N300 according to a general configuration that includes tasks V100, V200, and V300. In this case, one among tasks V200 and V300 is performed according to, for example, a user selection or an operating mode of the device (e.g., whether the user is currently engaged in a telephone call).

Figure 38A:
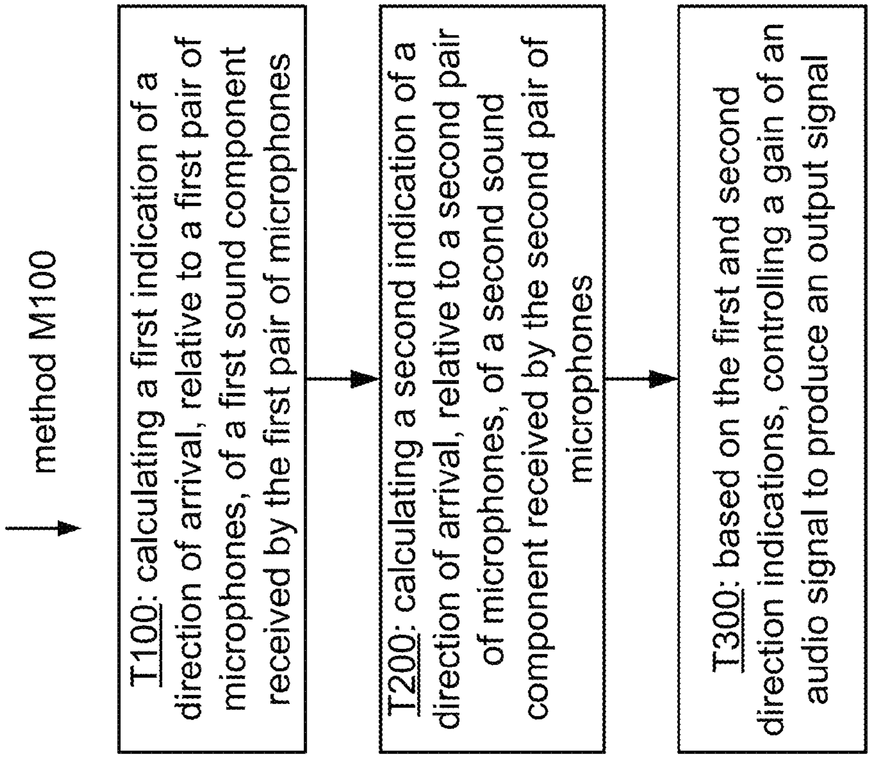
FIG. 38A shows a flowchart of a method M100 according to a general configuration.

FIG. 38A shows a flowchart of a method M100 according to a general configuration that includes tasks T100, T200, and T300. Task T100 calculates a first indication of a direction of arrival, relative to a first pair of microphones, of a first sound component received by the first pair of microphones (e.g., as described herein with reference to direction indication calculator DC10L). Task T200 calculates a second indication of a direction of arrival, relative to a second pair of microphones, of a second sound component received by the second pair of microphones (e.g., as described herein with reference to direction indication calculator DC10R). Task T300 controls a gain of an audio signal, based on the first and second direction indications, to produce an output signal (e.g., as described herein with reference to gain control element GC10).

Figure 38B:
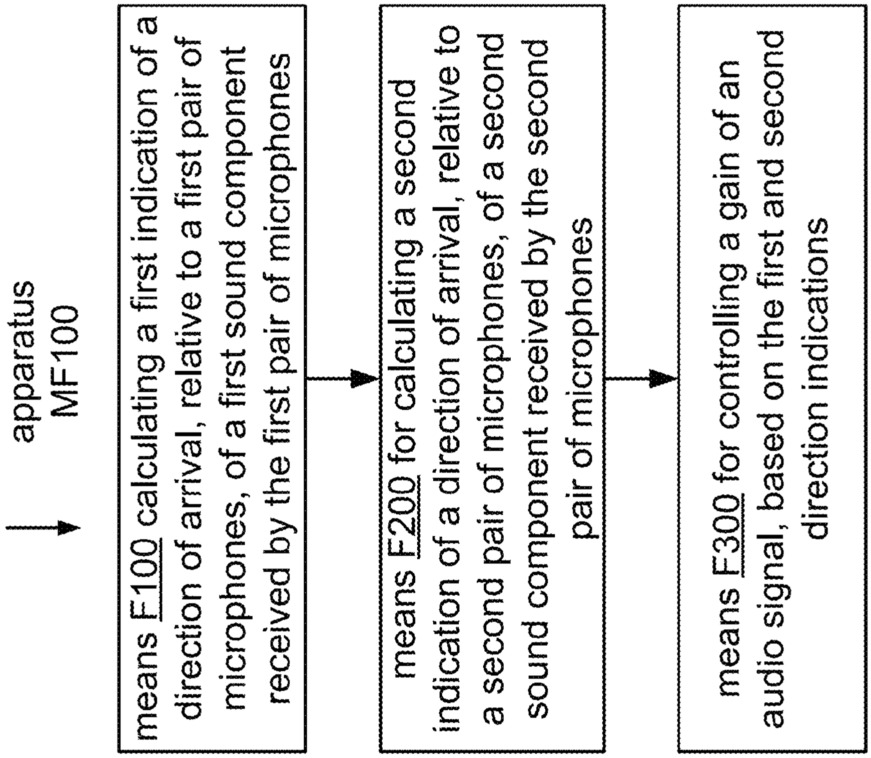
FIG. 38B shows a block diagram of an apparatus MF100 according to a general configuration.

FIG. 38B shows a block diagram of an apparatus MF100 according to a general configuration. Apparatus MF100 includes means F100 for calculating a first indication of a direction of arrival, relative to a first pair of microphones, of a first sound component received by the first pair of microphones (e.g., as described herein with reference to direction indication calculator DC10L). Apparatus MF100 also includes means F200 for calculating a second indication of a direction of arrival, relative to a second pair of microphones, of a second sound component received by the second pair of microphones (e.g., as described herein with reference to direction indication calculator DC10R). Apparatus MF100 also includes means F300 for controlling a gain of an audio signal, based on the first and second direction indications, to produce an output signal (e.g., as described herein with reference to gain control element GC10).

Figure 39:
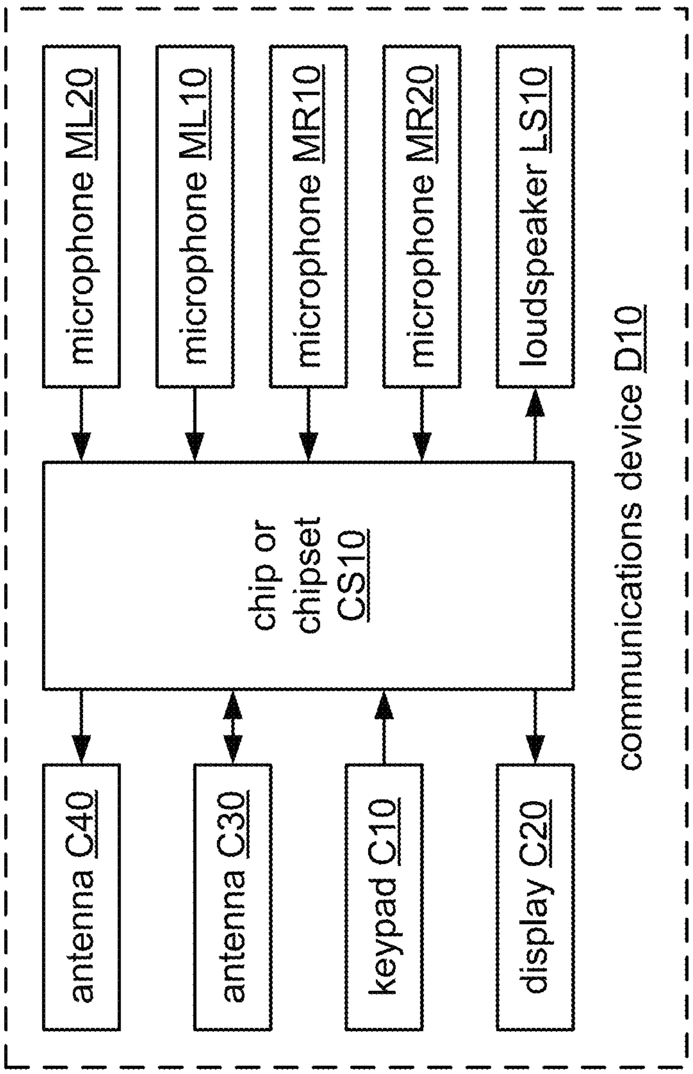
FIG. 39 shows a block diagram of a communications device D10 that includes an implementation of system S100.

FIG. 39 shows a block diagram of a communications device D10 that may be implemented as system S100. Alternatively, device D10 (e.g., a cellular telephone handset, smartphone, or laptop or tablet computer) may be implemented as part of system S100, with the microphones and loudspeaker being located in a different device, such as a pair of headphones. Device D10 includes a chip or chipset CS10 (e.g., a mobile station modem (MSM) chipset) that includes apparatus A100. Chip/chipset CS10 may include one or more processors, which may be configured to a software and/or firmware part of apparatus A100 (e.g., as instructions). Chip/chipset CS10 may also include processing elements of arrays R100L and R100R (e.g., elements of audio preprocessing stage AP10). Chip/chipset CS10 includes a receiver, which is configured to receive a radio-frequency (RF) communications signal and to decode and reproduce an audio signal encoded within the RF signal, and a transmitter, which is configured to encode an audio signal that is based on a processed signal produced by apparatus A100 (e.g., output signal SO10) and to transmit an RF communications signal that describes the encoded audio signal.

Such a device may be configured to transmit and receive voice communications data wirelessly via one or more encoding and decoding schemes (also called "codecs"). Examples of such codecs include the Enhanced Variable Rate Codec, as described in the Third Generation Partnership Project 2 (3GPP2) document C.S0014-C, v1.0, entitled "Enhanced Variable Rate Codec, Speech Service Options 3, 68, and 70 for Wideband Spread Spectrum Digital Systems," February 2007 (available online at www-dot-3gpp-dot-org); the Selectable Mode Vocoder speech codec, as described in the 3GPP2 document C.S0030-0, v3.0, entitled "Selectable Mode Vocoder (SMV) Service Option for Wideband Spread Spectrum Communication Systems," January 2004 (available online at www-dot-3gpp-dot-org); the Adaptive Multi Rate (AMR) speech codec, as described in the document ETSI TS 126 092 V6.0.0 (European Telecommunications Standards Institute (ETSI), Sophia Antipolis Cedex, FR, December 2004); and the AMR Wideband speech codec, as described in the document ETSI TS 126 192 V6.0.0 (ETSI, December 2004). For example, chip or chipset CS10 may be configured to produce the encoded audio signal to be compliant with one or more such codecs.

Device D10 is configured to receive and transmit the RF communications signals via an antenna C30. Device D10 may also include a diplexer and one or more power amplifiers in the path to antenna C30. Chip/chipset CS10 is also configured to receive user input via keypad C10 and to display information via display C20. In this example, device D10 also includes one or more antennas C40 to support Global Positioning System (GPS) location services and/or short-range communications with an external device such as a wireless (e.g., Bluetooth™) headset. In another example, such a communications device is itself a Bluetooth headset and lacks keypad C10, display C20, and antenna C30.

The methods and apparatus disclosed herein may be applied generally in any transceiving and/or audio sensing application, especially mobile or otherwise portable instances of such applications. For example, the range of configurations disclosed herein includes communications devices that reside in a wireless telephony communication system configured to employ a code-division multiple-access (CDMA) over-the-air interface. Nevertheless, it would be understood by those skilled in the art that a method and apparatus having features as described herein may reside in any of the various communication systems employing a wide range of technologies known to those of skill in the art, such as systems employing Voice over IP (VoIP) over wired and/or wireless (e.g., CDMA, TDMA, FDMA, and/or TD-SCDMA) transmission channels.

It is expressly contemplated and hereby disclosed that communications devices disclosed herein may be adapted for use in networks that are packet-switched (for example, wired and/or wireless networks arranged to carry audio transmissions according to protocols such as VoIP) and/or circuit-switched. It is also expressly contemplated and hereby disclosed that communications devices disclosed herein may be adapted for use in narrowband coding systems (e.g., systems that encode an audio frequency range of about four or five kilohertz) and/or for use in wideband coding systems (e.g., systems that encode audio frequencies greater than five kilohertz), including whole-band wideband coding systems and split-band wideband coding systems.

The presentation of the described configurations is provided to enable any person skilled in the art to make or use the methods and other structures disclosed herein. The flowcharts, block diagrams, and other structures shown and described herein are examples only, and other variants of these structures are also within the scope of the disclosure. Various modifications to these configurations are possible, and the generic principles presented herein may be applied to other configurations as well. Thus, the present disclosure is not intended to be limited to the configurations shown above but rather is to be accorded the widest scope consistent with the principles and novel features disclosed in any fashion herein, including in the attached claims as filed, which form a part of the original disclosure.

Those of skill in the art will understand that information and signals may be represented using any of a variety of different technologies and techniques. For example, data, instructions, commands, information, signals, bits, and symbols that may be referenced throughout the above description may be represented by voltages, currents, electromagnetic waves, magnetic fields or particles, optical fields or particles, or any combination thereof.

Important design requirements for implementation of a configuration as disclosed herein may include minimizing processing delay and/or computational complexity (typically measured in millions of instructions per second or MIPS), especially for computation-intensive applications, such as playback of compressed audio or audiovisual information (e.g., a file or stream encoded according to a compression format, such as one of the examples identified herein) or applications for wideband communications (e.g., voice communications at sampling rates higher than eight kilohertz, such as 12, 16, 44.1, 48, or 192 kHz).

Goals of a multi-microphone processing system may include achieving ten to twelve dB in overall noise reduction, preserving voice level and color during movement of a desired speaker, obtaining a perception that the noise has been moved into the background instead of an aggressive noise removal, dereverberation of speech, and/or enabling the option of post-processing for more aggressive noise reduction.

An apparatus as disclosed herein (e.g., apparatus A100, A110, A120, A130, A140, A210, A220, A300, and MF100) may be implemented in any combination of hardware with software, and/or with firmware, that is deemed suitable for the intended application. For example, the elements of such an apparatus may be fabricated as electronic and/or optical devices residing, for example, on the same chip or among two or more chips in a chipset. One example of such a device is a fixed or programmable array of logic elements, such as transistors or logic gates, and any of these elements may be implemented as one or more such arrays. Any two or more, or even all, of these elements may be implemented within the same array or arrays. Such an array or arrays may be implemented within one or more chips (for example, within a chipset including two or more chips).

One or more elements of the various implementations of the apparatus disclosed herein (e.g., apparatus A100, A110, A120, A130, A140, A210, A220, A300, and MF100) may be implemented in whole or in part as one or more sets of instructions arranged to execute on one or more fixed or programmable arrays of logic elements, such as microprocessors, embedded processors, IP cores, digital signal processors, FPGAs (field-programmable gate arrays), ASSPs (application-specific standard products), and ASICs (application-specific integrated circuits). Any of the various elements of an implementation of an apparatus as disclosed herein may also be embodied as one or more computers (e.g., machines including one or more arrays programmed to execute one or more sets or sequences of instructions, also called "processors"), and any two or more, or even all, of these elements may be implemented within the same such computer or computers.

A processor or other means for processing as disclosed herein may be fabricated as one or more electronic and/or optical devices residing, for example, on the same chip or among two or more chips in a chipset. One example of such a device is a fixed or programmable array of logic elements, such as transistors or logic gates, and any of these elements may be implemented as one or more such arrays. Such an array or arrays may be implemented within one or more chips (for example, within a chipset including two or more chips). Examples of such arrays include fixed or programmable arrays of logic elements, such as microprocessors, embedded processors, IP cores, DSPs, FPGAs, ASSPs, and ASICs. A processor or other means for processing as disclosed herein may also be embodied as one or more computers (e.g., machines including one or more arrays programmed to execute one or more sets or sequences of instructions) or other processors. It is possible for a processor as described herein to be used to perform tasks or execute other sets of instructions that are not directly related to a procedure of an implementation of method M100, such as a task relating to another operation of a device or system in which the processor is embedded (e.g., an audio sensing device). It is also possible for part of a method as disclosed herein to be performed by a processor of the audio sensing device and for another part of the method to be performed under the control of one or more other processors.

Those of skill will appreciate that the various illustrative modules, logical blocks, circuits, and tests and other operations described in connection with the configurations disclosed herein may be implemented as electronic hardware, computer software, or combinations of both. Such modules, logical blocks, circuits, and operations may be implemented or performed with a general purpose processor, a digital signal processor (DSP), an ASIC or ASSP, an FPGA or other programmable logic device, discrete gate or transistor logic, discrete hardware components, or any combination thereof designed to produce the configuration as disclosed herein. For example, such a configuration may be implemented at least in part as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a general purpose processor or other digital signal processing unit. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. A software module may reside in a non-transitory storage medium such as RAM (random-access memory), ROM (read-only memory), nonvolatile RAM (NVRAM) such as flash RAM, erasable programmable ROM (EPROM), electrically erasable programmable ROM (EEPROM), registers, hard disk, a removable disk, or a CD-ROM; or in any other form of storage medium known in the art. An illustrative storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

It is noted that the various methods disclosed herein (e.g., methods N100, N200, N300, and M100, and other methods disclosed with reference to the operation of the various apparatus described herein) may be performed by an array of logic elements such as a processor, and that the various elements of an apparatus as described herein may be implemented as modules designed to execute on such an array. As used herein, the term “module” or “sub-module” can refer to any method, apparatus, device, unit or computer-readable data storage medium that includes computer instructions (e.g., logical expressions) in software, hardware or firmware form. It is to be understood that multiple modules or systems can be combined into one module or system and one module or system can be separated into multiple modules or systems to perform the same functions. When implemented in software or other computer-executable instructions, the elements of a process are essentially the code segments to perform the related tasks, such as with routines, programs, objects, components, data structures, and the like. The term “software” should be understood to include source code, assembly language code, machine code, binary code, firmware, macrocode, microcode, any one or more sets or sequences of instructions executable by an array of logic elements, and any combination of such examples. The program or code segments can be stored in a processor readable medium or transmitted by a computer data signal embodied in a carrier wave over a transmission medium or communication link.

The implementations of methods, schemes, and techniques disclosed herein may also be tangibly embodied (for example, in tangible, computer-readable features of one or more computer-readable storage media as listed herein) as one or more sets of instructions executable by a machine including an array of logic elements (e.g., a processor, microprocessor, microcontroller, or other finite state machine). The term “computer-readable medium” may include any medium that can store or transfer information, including volatile, nonvolatile, removable, and non-removable storage media. Examples of a computer-readable medium include an electronic circuit, a semiconductor memory device, a ROM, a flash memory, an erasable ROM (EROM), a floppy diskette or other magnetic storage, a CD-ROM/DVD or other optical storage, a hard disk or any other medium which can be used to store the desired information, a fiber optic medium, a radio frequency (RF) link, or any other medium which can be used to carry the desired information and can be accessed. The computer data signal may include any signal that can propagate over a transmission medium such as electronic network channels, optical fibers, air, electromagnetic, RF links, etc. The code segments may be downloaded via computer networks such as the Internet or an intranet. In any case, the scope of the present disclosure should not be construed as limited by such embodiments.

Each of the tasks of the methods described herein may be embodied directly in hardware, in a software module executed by a processor, or in a combination of the two. In a typical application of an implementation of a method as disclosed herein, an array of logic elements (e.g., logic gates) is configured to perform one, more than one, or even all of the various tasks of the method. One or more (possibly all) of the tasks may also be implemented as code (e.g., one or more sets of instructions), embodied in a computer program product (e.g., one or more data storage media such as disks, flash or other nonvolatile memory cards, semiconductor memory chips, etc.), that is readable and/or executable by a machine (e.g., a computer) including an array of logic elements (e.g., a processor, microprocessor, microcontroller, or other finite state machine). The tasks of an implementation of a method as disclosed herein may also be performed by more than one such array or machine. In these or other implementations, the tasks may be performed within a device for wireless communications such as a cellular telephone or other device having such communications capability. Such a device may be configured to communicate with circuit-switched and/or packet-switched networks (e.g., using one or more protocols such as VoIP). For example, such a device may include RF circuitry configured to receive and/or transmit encoded frames.

It is expressly disclosed that the various methods disclosed herein may be performed by a portable communications device such as a handset, headset, smartphone, or tablet computer, and that the various apparatus described herein may be included within such a device. A typical real-time (e.g., online) application is a telephone conversation conducted using such a mobile device.

In one or more exemplary embodiments, the operations described herein may be implemented in hardware, software, firmware, or any combination thereof. If implemented in software, such operations may be stored on or transmitted over a computer-readable medium as one or more instructions or code. The term “computer-readable media” includes both computer-readable storage media and communication (e.g., transmission) media. By way of example, and not limitation, computer-readable storage media can comprise an array of storage elements, such as semiconductor memory (which may include without limitation dynamic or static RAM, ROM, EEPROM, and/or flash RAM), or ferroelectric, magnetoresistive, ovonic, polymeric, or phase-change memory; CD-ROM or other optical disk storage; and/or magnetic disk storage or other magnetic storage devices. Such storage media may store information in the form of instructions or data structures that can be accessed by a computer. Communication media can comprise any medium that can be used to carry desired program code in the form of instructions or data structures and that can be accessed by a computer, including any medium that facilitates transfer of a computer program from one place to another. Also, any connection is properly termed a computer-readable medium. For example, if the software is transmitted from a website, server, or other remote source using a coaxial cable, fiber optic cable, twisted pair, digital subscriber line (DSL), or wireless technology such as infrared, radio, and/or microwave, then the coaxial cable, fiber optic cable, twisted pair, DSL, or wireless technology such as infrared, radio, and/or microwave are included in the definition of medium. Disk and disc, as used herein, includes compact disc (CD), laser disc, optical disc, digital versatile disc (DVD), floppy disk and Blu-ray Disc™ (Blu-Ray Disc Association, Universal City, Calif.), where disks usually reproduce data magnetically, while discs reproduce data optically with lasers. Combinations of the above should also be included within the scope of computer-readable media.

An acoustic signal processing apparatus as described herein may be incorporated into an electronic device that accepts speech input in order to control certain operations, or may otherwise benefit from separation of desired noises from background noises, such as communications devices. Many applications may benefit from enhancing or separating clear desired sound from background sounds originating from multiple directions. Such applications may include human-machine interfaces in electronic or computing devices which incorporate capabilities such as voice recognition and detection, speech enhancement and separation, voice-activated control, and the like. It may be desirable to implement such an acoustic signal processing apparatus to be suitable in devices that only provide limited processing capabilities.

The elements of the various implementations of the modules, elements, and devices described herein may be fabricated as electronic and/or optical devices residing, for example, on the same chip or among two or more chips in a chipset. One example of such a device is a fixed or programmable array of logic elements, such as transistors or gates. One or more elements of the various implementations of the apparatus described herein may also be implemented in whole or in part as one or more sets of instructions arranged to execute on one or more fixed or programmable arrays of logic elements such as microprocessors, embedded processors, IP cores, digital signal processors, FPGAs, ASSPs, and ASICs.

It is possible for one or more elements of an implementation of an apparatus as described herein to be used to perform tasks or execute other sets of instructions that are not directly related to an operation of the apparatus, such as a task relating to another operation of a device or system in which the apparatus is embedded. It is also possible for one or more elements of an implementation of such an apparatus to have structure in common (e.g., a processor used to execute portions of code corresponding to different elements at different times, a set of instructions executed to perform tasks corresponding to different elements at different times, or an arrangement of electronic and/or optical devices performing operations for different elements at different times).

What is claimed is:

1. A method of audio signal processing, said method comprising:

calculating a first direction indication of a direction of arrival, relative to a first pair of microphones, of a first sound component received by the first pair of microphones;

calculating a second direction indication of a direction of arrival, relative to a second pair of microphones that is separate from the first pair, of a second sound component received by the second pair of microphones, wherein the first and second pair of microphones are worn by a user; and using the first and second direction indications to control a gain of an audio signal to produce an output signal, wherein the microphones of the first pair are located at a first side of the midsagittal plane of a head of the user, wherein the microphones of the second pair are located at a second side of the midsagittal plane that is opposite to the first side, and wherein controlling the gain comprises determining whether both of the first direction indication and the second direction indication indicate directions of arrival that intersect the midsagittal plane.

2. The method of claim 1, wherein the audio signal includes audio-frequency energy from a signal produced by at least one microphone among the first and second pairs.

3. The method of claim 1, wherein the audio signal includes audio-frequency energy from a signal produced by a voice microphone, and wherein the voice microphone is located in a coronal plane of the head of the user that is closer to a central exit point of a voice of the user than at least one microphone of each of the first and second microphone pairs.

4. The method of claim 1, wherein said method comprises, based on audio-frequency energy of the output signal, calculating a plurality of linear prediction coding filter coefficients.

5. The method of claim 1, wherein said calculating the first direction indication includes calculating, for each among a plurality of different frequency components of a multichannel signal that is based on signals produced by the first pair of microphones, a difference between a phase of the frequency component in a first channel of the multichannel signal and a phase of the frequency component in a second channel of the multichannel signal.

6. The method of claim 1, wherein the locations of the microphones of the first pair are along a first axis, and wherein the locations of the microphones of the second pair are along a second axis, and wherein each among the first and second axes is not more than forty-five degrees from parallel to a line that is orthogonal to the midsagittal plane.

7. The method of claim 6, wherein each among the first and second axes is not more than thirty degrees from parallel to a line that is orthogonal to the midsagittal plane.

8. The method of claim 6, wherein each among the first and second axes is not more than twenty degrees from parallel to a line that is orthogonal to the midsagittal plane.

9. The method of claim 1, wherein said controlling the gain comprises attenuating the audio signal unless both of the first direction indication and the second direction indication indicate directions of arrival that intersect the midsagittal plane.

10. The method of claim 1, wherein said controlling the gain comprises attenuating the audio signal in response to at least one among the first and second direction indications indicating a corresponding direction of arrival that is away from the midsagittal plane.

11. The method of claim 10, wherein said method comprises attenuating a second audio signal in response to both of the first direction indication and the second direction indication indicating a corresponding direction of arrival that intersects the midsagittal plane, and wherein the second audio signal includes audio-frequency energy from a signal produced by at least one microphone among the first and second pairs.

12. The method of claim 1, wherein said controlling the gain comprises attenuating the audio signal in response to both of the first direction indication and the second direction indication indicating a corresponding direction of arrival that intersects the midsagittal plane.

13. The method of claim 12, wherein said method comprises:

mixing a signal that is based on the output signal with a reproduced audio signal to produce a mixed signal, and driving a loudspeaker that is worn at an ear of the user and is directed at a corresponding eardrum of the user to produce an acoustic signal that is based on the mixed signal.

14. The method of claim 1, wherein said method includes driving a loudspeaker that is worn at an ear of the user and is directed at a corresponding eardrum of the user to produce an acoustic signal that is based on the output signal.

15. The method of claim 1, wherein the first pair is separated from the second pair by at least ten centimeters.

16. An apparatus for audio signal processing, said apparatus comprising:

means for calculating a first direction indication of a direction of arrival, relative to a first pair of microphones, of a first sound component received by the first pair of microphones;

means for calculating a second direction indication of a direction of arrival, relative to a second pair of microphones that is separate from the first pair, of a second sound component received by the second pair of microphones, wherein the first and second pair of microphones are worn by a user; and means for controlling a gain of an audio signal using the first and second direction indications to produce an output signal, wherein the microphones of the first pair are located at a first side of the midsagittal plane of a head of the user, wherein the microphones of the second pair are located at a second side of the midsagittal plane that is opposite to the first side, and wherein the means for controlling the gain comprise means for determining whether both of the first direction indication and the second direction indication indicated directions of arrival that intersect the midsagittal plane.

17. The apparatus of claim 16, wherein the audio signal includes audio-frequency energy from a signal produced by at least one microphone among the first and second pairs.

18. The apparatus of claim 16, wherein the audio signal includes audio-frequency energy from a signal produced by a voice microphone, and wherein the voice microphone is located in a coronal plane of the head of the user that is closer to a central exit point of a voice of the user than at least one microphone of each of the first and second microphone pairs.

19. The apparatus of claim 16, wherein said apparatus comprises means for calculating a plurality of linear prediction coding filter coefficients, based on audio-frequency energy of the output signal.

20. The apparatus of claim 16, wherein said means for calculating the first direction indication includes means for calculating, for each among a plurality of different frequency components of a multichannel signal that is based on signals produced by the first pair of microphones, a difference between a phase of the frequency component in a first channel of the multichannel signal and a phase of the frequency component in a second channel of the multichannel signal.

21. The apparatus of claim 16, wherein the locations of the microphones of the first pair are along a first axis, and wherein the locations of the microphones of the second pair are along a second axis, and wherein each among the first and second axes is not more than forty-five degrees from parallel to a line that is orthogonal to the midsagittal plane.

22. The apparatus of claim 21, wherein each among the first and second axes is not more than thirty degrees from parallel to a line that is orthogonal to the midsagittal plane.

23. The apparatus of claim 21, wherein each among the first and second axes is not more than twenty degrees from parallel to a line that is orthogonal to the midsagittal plane.

24. The apparatus of claim 16, wherein said means for controlling the gain comprises means for attenuating the audio signal unless both of the first direction indication and the second direction indication indicate directions of arrival that intersect the midsagittal plane.

25. The apparatus of claim 16, wherein said means for controlling the gain comprises means for attenuating the audio signal in response to at least one among the first and second direction indications indicating a corresponding direction of arrival that is away from the midsagittal plane.

26. The apparatus of claim 25, wherein said apparatus comprises means for attenuating a second audio signal in response to both of the first direction indication and the second direction indication indicating a corresponding direction of arrival that intersects the midsagittal plane, and wherein the second audio signal includes audio-frequency energy from a signal produced by at least one microphone among the first and second pairs.

27. The apparatus of claim 16, wherein said means for controlling the gain comprises means for attenuating the audio signal in response to both of the first direction indication and the second direction indication indicating a corresponding direction of arrival that intersects the midsagittal plane.

28. The apparatus of claim 27, wherein said apparatus comprises:

means for mixing a signal that is based on the output signal with a reproduced audio signal to produce a mixed signal, and means for driving a loudspeaker that is worn at an ear of the user and is directed at a corresponding eardrum of the user to produce an acoustic signal that is based on the mixed signal.

29. The apparatus of claim 16, wherein said apparatus includes means for driving a loudspeaker that is worn at an ear of the user and is directed at a corresponding eardrum of the user to produce an acoustic signal that is based on the output signal.

30. The apparatus of claim 16, wherein the first pair is separated from the second pair by at least ten centimeters.

31. An apparatus for audio signal processing, said apparatus comprising:

a first pair of microphones configured to be located, during a use of the apparatus, at a first side of a midsagittal plane of a head of a user;

a second pair of microphones that is separate from the first pair and is configured to be located, during the use of the apparatus, at a second side of the midsagittal plane that is opposite to the first side;

a first direction indication calculator configured to calculate a first indication of a direction of arrival, relative to the first pair of microphones, of a first sound component received by the first pair of microphones;

a second direction indication calculator configured to calculate a second indication of a direction of arrival, relative to the second pair of microphones, of a second sound component received by the second pair of microphones, wherein the first and second pair of microphones are worn by the user; and a gain control module configured to control a gain of an audio signal using the first and second direction indications to produce an output signal, wherein the gain control module is further configured to determine whether both of the first direction indication and the second direction indication indicate directions of arrival that intersect the midsagittal plane.

32. The apparatus of claim 31, wherein the audio signal includes audio-frequency energy from a signal produced by at least one microphone among the first and second pairs.

33. The apparatus of claim 31, wherein the audio signal includes audio-frequency energy from a signal produced by a voice microphone, and wherein the voice microphone is located in a coronal plane of the head of the user that is closer to a central exit point of a voice of the user than at least one microphone of each of the first and second microphone pairs.

34. The apparatus of claim 31, wherein said apparatus comprises an analysis module configured to calculate a plurality of linear prediction coding filter coefficients, based on audio-frequency energy of the output signal.

35. The apparatus of claim 31, wherein said first direction indication calculator is configured to calculate, for each among a plurality of different frequency components of a multichannel signal that is based on signals produced by the first pair of microphones, a difference between a phase of the frequency component in a first channel of the multichannel signal and a phase of the frequency component in a second channel of the multichannel signal.

36. The apparatus of claim 31, wherein the locations of the microphones of the first pair are along a first axis, and wherein the locations of the microphones of the second pair are along a second axis, and wherein each among the first and second axes is not more than forty-five degrees from parallel to a line that is orthogonal to the midsagittal plane.

37. The apparatus of claim 36, wherein each among the first and second axes is not more than thirty degrees from parallel to a line that is orthogonal to the midsagittal plane.

38. The apparatus of claim 36, wherein each among the first and second axes is not more than twenty degrees from parallel to a line that is orthogonal to the midsagittal plane.

39. The apparatus of claim 31, wherein said gain control module is configured to attenuate the audio signal unless both of the first direction indication and the second direction indication indicate directions of arrival that intersect the midsagittal plane.

40. The apparatus of claim 31, wherein said gain control module is configured to attenuate the audio signal in response to at least one among the first and second direction indications indicating a corresponding direction of arrival that is away from the midsagittal plane.

41. The apparatus of claim 40, wherein said apparatus comprises a second gain control module configured to attenuate a second audio signal in response to both of the first direction indication and the second direction indication indicating a corresponding direction of arrival that intersects the midsagittal plane, and wherein the second audio signal includes audio-frequency energy from a signal produced by at least one microphone among the first and second pairs.

42. The apparatus of claim 31, wherein said gain control module is configured to attenuate the audio signal in response to both of the first direction indication and the second direction indication indicating a corresponding direction of arrival that intersects the midsagittal plane.

43. The apparatus of claim 42, wherein said apparatus comprises:

a mixer configured to mix a signal that is based on the output signal with a reproduced audio signal to produce a mixed signal, and an audio output stage configured to drive a loudspeaker that is worn at an ear of the user and is directed at a corresponding eardrum of the user to produce an acoustic signal that is based on the mixed signal.

44. The apparatus of claim 31, wherein said apparatus includes an audio output stage configured to drive a loudspeaker that is worn at an ear of the user and is directed at a corresponding eardrum of the user to produce an acoustic signal that is based on the output signal.

45. The apparatus of claim 31, wherein the first pair is separated from the second pair by at least ten centimeters.

46. A non-transitory computer-readable storage medium having tangible features that when read by a machine cause the machine to:

calculate a first direction indication of a direction of arrival, relative to a first pair of microphones, of a first sound component received by the first pair of microphones;

calculate a second direction indication of a direction of arrival, relative to a second pair of microphones that is separate from the first pair, of a second sound component received by the second pair of microphones, wherein the first and second pair of microphones are worn by a user; and control a gain of an audio signal, using the first and second direction indications, to produce an output signal, wherein the microphones of the first pair are located at a first side of the midsagittal plane of a head of the user, wherein the microphones of the second pair are located at a second side of the midsagittal plane that is opposite to the first side, and wherein controlling the gain comprises determining whether both of the first direction indication and the second direction indication indicate directions of arrival that intersect the midsagittal plain.

* * * * *